(12) United States Patent
Yang et al.

(10) Patent No.: US 11,895,840 B2
(45) Date of Patent: Feb. 6, 2024

(54) MEMORY DEVICE

(71) Applicant: SAMSUNG ELECTRONICS CO., LTD., Suwon-si (KR)

(72) Inventors: Woosung Yang, Gwangmyeong-si (KR); Byungjin Lee, Hwaseong-si (KR); Bumkyu Kang, Suwon-si (KR); Joonsung Lim, Seongnam-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/895,182

(22) Filed: Aug. 25, 2022

(65) Prior Publication Data

US 2022/0406814 A1 Dec. 22, 2022

Related U.S. Application Data

(62) Division of application No. 17/007,141, filed on Aug. 31, 2020, now Pat. No. 11,450,684.

(30) Foreign Application Priority Data

Jan. 17, 2020 (KR) .................. 10-2020-0006744

(51) Int. Cl.
*H10B 43/27* (2023.01)
*H01L 23/00* (2006.01)
*G11C 7/18* (2006.01)
*H01L 23/522* (2006.01)
*H10B 41/10* (2023.01)
(Continued)

(52) U.S. Cl.
CPC ............... *H10B 43/27* (2023.02); *G11C 7/18* (2013.01); *H01L 23/5226* (2013.01); *H01L 24/09* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC . H01L 2224/05009; H01L 2224/05025; H01L 2224/05087; H01L 2224/0509; H01L 2224/0557; H01L 2224/0846; H01L 23/5226; H01L 2224/08145–08148; H01L 2225/06503–06596; G11C 7/18
See application file for complete search history.

(56) References Cited

U.S. PATENT DOCUMENTS 9,558,945 B2   1/2017 Fukuzumi et al.
10,074,667 B1  9/2018 Higashi et al.
(Continued)

FOREIGN PATENT DOCUMENTS

JP     2011-204829 A     10/2011

*Primary Examiner* — Amar Movva
(74) *Attorney, Agent, or Firm* — Fish & Richardson P.C.

(57) ABSTRACT

A memory device includes a lower structure and a plurality of upper structures stacked on the lower structure. The lower structure includes a peripheral circuit, and an upper bonding pad disposed on a top surface of the lower structure. Each of the plurality of upper structures includes a bit line, a through via, and a lower bonding pad disposed on a bottom surface of the upper structures and connected to the through via. Each of the upper structures, other than an uppermost upper structure, further includes an upper bonding pad disposed on a top surface thereof and connected to the through via. The bit line includes a gap separating a first portion of the bit line from a second portion thereof in the horizontal direction, and the through via overlaps the gap of the bit line in a plan view.

20 Claims, 67 Drawing Sheets

(51) Int. Cl.
  *H10B 41/27* (2023.01)
  *H10B 41/35* (2023.01)
  *H10B 41/40* (2023.01)
  *H10B 43/10* (2023.01)
  *H10B 43/35* (2023.01)
  *H10B 43/40* (2023.01)

(56) References Cited

U.S. PATENT DOCUMENTS

| | | |
|---|---|---|
| 10,147,732 B1 | 12/2018 | Hu et al. |
| 10,283,452 B2 | 5/2019 | Zhu et al. |
| 10,283,493 B1 | 5/2019 | Nishida |
| 10,319,730 B2 | 6/2019 | Matsuo |
| 10,354,987 B1 | 7/2019 | Mushiga et al. |
| 2019/0043868 A1 | 2/2019 | Hasnat et al. |
| 2019/0081069 A1 | 3/2019 | Lu et al. |

MEMORY DEVICE

CROSS-REFERENCE TO RELATED APPLICATION

This is a Divisional of U.S. Application Ser. No. 17/007,141, filed Aug. 31, 2020, and a claim of priority under 35 U.S.C. § 119 is made to Korean Patent Application No. 10-2020-0006744, filed on Jan. 17, 2020, in the Korean Intellectual Property Office, the entirety of which is hereby incorporated by reference.

BACKGROUND

The inventive concepts herein relate to memory devices. In more detail, the inventive concepts relate to memory devices including a plurality of memory cell arrays which are stacked.

Due to increasing demand for multifunctional, high-performance, and miniaturized information communication devices, large-capacity and highly integrated memory devices are needed. Accordingly, memory devices including a plurality of stacked memory cell arrays have been developed. In such memory devices, a planar area occupied by the memory cell arrays may be reduced by stacking the memory cell arrays.

SUMMARY

Embodiments of the inventive concepts provide a memory device having planar area and performance that may be easily adjusted.

Embodiments of the inventive concepts provide a memory device including a lower structure and a plurality of upper structures stacked on the lower structure. The lower structure includes a peripheral circuit and an upper bonding pad connected to the peripheral circuit and disposed on a top surface of the lower structure. Each of the plurality of upper structures has a bottom surface, and each of the plurality of upper surfaces includes a stacked structure including a plurality of gate layers stacked in a vertical direction, a plurality of channel structures each passing through the stacked structure in the vertical direction, a bit line disposed under the stacked structure and connected to the plurality of channel structures, a through via passing through the stacked structure in the vertical direction, and a lower bonding pad disposed on the bottom surface and connected to the through via. Each of upper structures, other than an uppermost upper structure, of the plurality of upper structures further includes a top surface and an upper bonding pad disposed on the top surface and connected to the through via. The bit line of each of the plurality of upper structures includes a first portion extending in a horizontal direction orthogonal to the vertical direction, a second portion extending in the horizontal direction, and a gap separating the first portion of the bit line from the second portion in the horizontal direction. The through via of each of the plurality of upper structures overlaps the gap of the bit line. A lowermost upper structure of the plurality of upper structures is stacked on the lower structure in the vertical direction so that the lower bonding pad of the lowermost upper structure contacts the upper bonding pad of the lower structure. The plurality of upper structures include a first upper structure and a second upper structure stacked in the vertical direction. The lower bonding pad of the second upper structure contacts the upper bonding pad of the first upper structure.

Embodiments of the inventive concepts further provide a memory device including a first structure and a second structure stacked on the first structure. The first structure includes a peripheral circuit, a first upper bonding pad connected to the peripheral circuit, and a second upper bonding pad connected to the peripheral circuit. The second structure includes a first lower bonding pad connected to the first upper bonding pad of the first structure, a first through via connected to the first lower bonding pad of the second structure, a third upper bonding pad connected to the first through via of the second structure, a second lower bonding pad connected to the second upper bonding pad of the first structure, a first bit line connected to the second lower bonding pad of the second structure, and a memory cell array connected to the first bit line of the second structure. The first bit line of the second structure includes a first portion, a second portion, and a first gap between the first portion of the first bit line of the second structure and the second portion of the first bit line of the second structure. The first lower bonding pad of the second structure is not connected to the first portion and the second portion of the first bit line of the second structure.

Embodiments of the inventive concepts still further provide a memory device including a first structure and a second structure on the first structure. The first structure includes a peripheral circuit, a first upper bonding pad connected to the peripheral circuit, and a second upper bonding pad connected to the peripheral circuit. The second structure includes a first lower bonding pad connected to the first upper bonding pad of the first structure, a first through via connected to the first lower bonding pad of the second structure, a first lower line connecting the first lower bonding pad of the second structure to the first through via of the second structure, a third upper bonding pad connected to the first through via of the second structure, a second lower bonding pad connected to the second upper bonding pad of the first structure, a first bit line connected to the second lower bonding pad of the second structure, and a memory cell array connected to the first bit line of the second structure. The first bit line of the second structure includes a first portion, a second portion, and a first gap between the first portion of the first bit line of the second structure and the second portion thereof. The first lower line of the second structure is not connected to the first portion and the second portion of the first bit line of the second structure.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
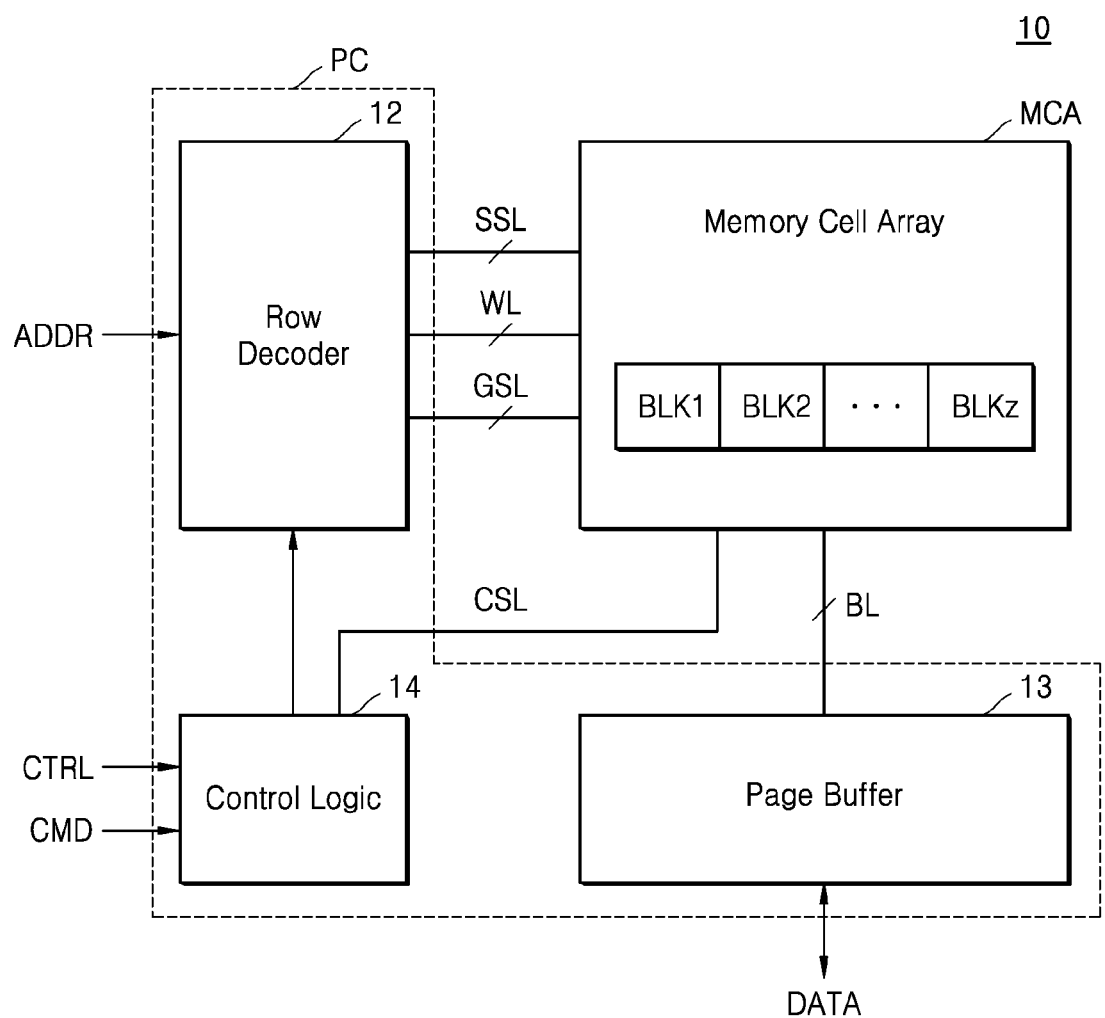
FIG. 1 illustrates a block diagram of a memory device according to embodiments of the inventive concepts.

FIG. 1 illustrates a block diagram of a memory device 10 according to embodiments of the inventive concepts.

Referring to FIG. 1, the memory device 10 may include a plurality of memory cell arrays MCA (although only a single memory cell array is shown in FIG. 1) and a peripheral circuit PC. The peripheral circuit PC may include a row decoder 12, a page buffer 13, and a control logic (e.g., a control circuit) 14.

Each of the plurality of memory cell arrays MCA may include a plurality of memory blocks BLK1, BLK2 to BLKz (hereinafter referred to as memory blocks BLK1 to BLKz). Each of the memory blocks BLK1 to BLKz may include a plurality of memory cells for storing data. Each of the plurality of memory cell arrays MCA may include a plurality of non-volatile memory cells which maintain data stored therein even when power supplied thereto is interrupted. For example, each of the plurality of memory cell arrays MCA may include an electrically erasable programmable read-only memory (EEPROM) cell, a flash memory cell, a phase change random access memory (PRAM) cell, a resistance random access memory (RRAM) cell, a magnetic random access memory (MRAM) cell, a ferroelectric random access memory (FRAM) cell, or a combination thereof. Hereinafter, embodiments will be described in detail based on the assumption that a memory cell array MCA includes a plurality of NAND flash memory cells. Memory cell arrays MCA can be connected to a common source line CSL. The common source line CSL can be controlled by the control logic 14.

The row decoder 12 may be connected to a memory cell array MCA by a plurality of string selection lines SSL, a plurality of word lines WL, and a plurality of ground selection lines GSL. The row decoder 12 may select at least one memory block from among the plurality of memory blocks BLK1 to BLKz in response to an address ADDR provided from a memory controller (not shown). The row decoder 12 may select at least one of word lines WL, string selection lines SSL, and ground selection lines GSL of the selected memory block in response to the address ADDR provided from the memory controller (not shown).

The page buffer 13 may be connected to the memory cell array MCA through a plurality of bit lines BL. The page buffer 13 may select at least one bit line BL from among the plurality of bit lines BL. The page buffer 13 may store data DATA, input from the memory controller (not shown), in the memory cell array MCA. Also, the page buffer 13 may output data DATA, read from the memory cell array MCA, to the memory controller (not shown).

The control logic 14 may control an overall operation of the memory device 10. In detail, the control logic 14 may control operations of the row decoder 12 and the page buffer 13. For example, the control logic 14 may control the memory device 10 to perform a memory operation corresponding to a command CMD provided from the memory controller (not shown). Also, the control logic 14 may generate various internal control signals used for the memory device 10 in response to a control signal CTRL provided from the memory controller (not shown).

Figure 2:
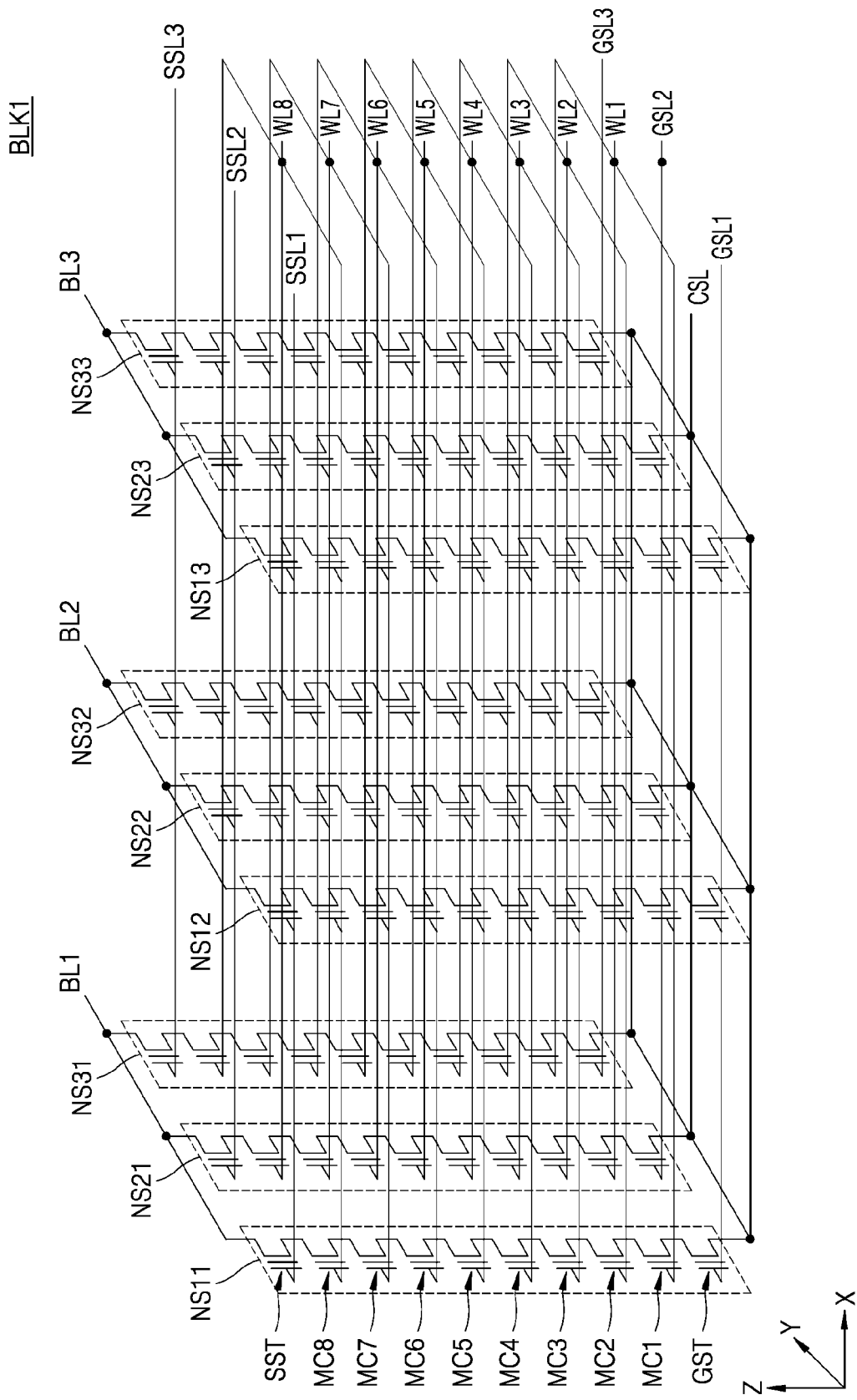
FIG. 2 illustrates a circuit diagram of one of memory blocks included in a memory cell array included in a memory device according to embodiments of the inventive concepts.

FIG. 2 illustrates a circuit diagram of one BLK1 of the memory blocks included in a memory cell array MCA (see FIG. 1) included in a memory device 10 (see FIG. 1) according to embodiments of the inventive concepts.

Referring to FIG. 2, a memory block BLK1 may include a plurality of NAND strings NS11 to NS33 (e.g., NS11, NS12, NS13, NS21, NS22, NS23, NS31, NS32 and NS33). In FIG. 2, one memory block BLK1 is illustrated as including nine NAND strings NS11 to NS33, but the number of NAND strings included in the one memory block BLK1 is not limited thereto. The NAND strings NS11 to NS33 may each include at least one string selection transistor SST, a plurality of memory cells MC1 to MC8 (e.g., MC1, MC2, MC3, MC4, MC5, MC6, MC7 and MC8), and at least one ground selection transistor GST, which are serially connected to one another. In FIG. 2, each of the NAND strings NS11 to NS33 is illustrated as including one string selection transistor SST, eight memory cells MC1 to MC8, and one ground selection transistor GST, but the number of string selection transistors, memory cells, and ground selection transistors included in each of the NAND strings NS11 to NS33 is not limited thereto.

The NAND strings NS11 to NS33 may be connected between a plurality of bit lines BL1 to BL3 (e.g., BL1, BL2 and BL3) and a common source line CSL. Gates of string selection transistors SST may be connected to string selection lines SS1 to SS3 (e.g., SS1, SS2 and SS3), gates of memory cells MC1 to MC8 may be connected to word lines WL1 to WL8 (e.g., WL1, WL2, WL3, WL4, WL5, WL6, WL7 and WL8), and gates of ground selection transistors GST may be connected to ground selection lines GSL1 to GSL3 (e.g., GSL1, GSL2 and GSL3). The common source line CSL may be connected to the plurality of NAND strings NS11 to NS33 in common. Also, the word lines WL1 to WL8 may be connected to the plurality of NAND strings NS11 to NS33 in common.

Figure 3:
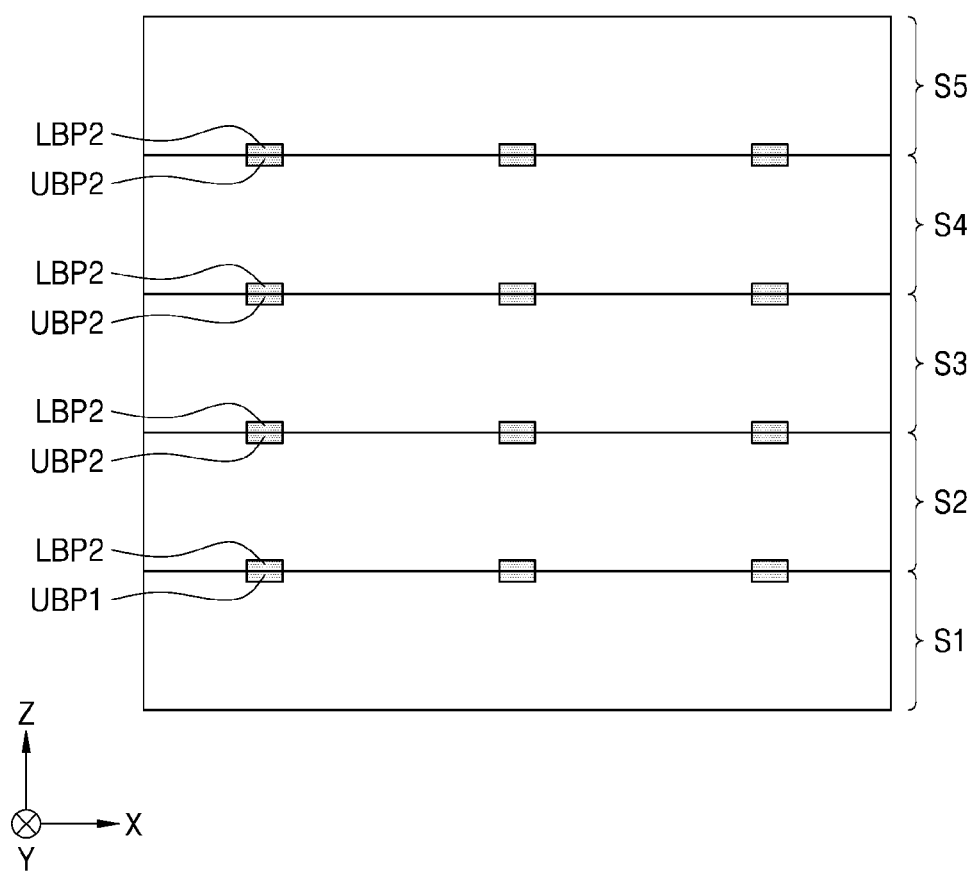
FIG. 3 illustrates a cross-sectional view illustrating a memory device according to embodiments of the inventive concepts.

FIG. 3 illustrates a cross-sectional view of a memory device 10 according to embodiments of the inventive concepts.

Referring to FIG. 3, the memory device 10 may include a plurality of structures S1 to S5 which are stacked in a vertical direction (a Z direction). In FIG. 3, the memory device 10 is illustrated as including five structures S1 to S5, but is not limited thereto and may include more or fewer structures than five. Herein, a lowermost first structure S1 may be referred to as a lower structure, and each of the other structures (for example, second to fifth structures) S2 to S5 may be referred to as an upper structure. A lower structure S1 may include a plurality of upper bonding pads UBP1 disposed on a top surface of the lower structure S1. An upper structure S2 may include a plurality of lower bonding pads LBP2 disposed on a bottom surface of the upper structure S2. Each of upper structures S2 to S4, excluding an uppermost upper structure S5 among a plurality of upper structures S2 to S5, may further include a plurality of upper bonding pads UBP2 disposed on a top surface of each of the upper structures S2 to S4.

A lowermost upper structure S2 of the plurality of upper structures S2 to S5 may be stacked on the lower structure S1 in the vertical direction (the Z direction) so that the lower bonding pads LBP2 of the lowermost upper structure S2 respectively contact the upper bonding pads UBP1 of the lower structure S1. Therefore, the lower bonding pads LBP2 of the lowermost upper structure S2 may be respectively connected to the upper bonding pads UBP1 of the lower structure S1. Lower bonding pads LBP2 of a third structure S3 may respectively contact upper bonding pads UBP2 of a second structure S2. Therefore, the lower bonding pads LBP2 of the third structure S3 may be respectively connected to the upper bonding pads UBP2 of the second structure S2. Similarly, lower bonding pads LBP2 of a fourth structure S4 may respectively contact upper bonding pads UBP2 of a third structure S3, and lower bonding pads LBP2 of a fifth structure S5 may respectively contact upper bonding pads UBP2 of a fourth structure S4. Therefore, the lower bonding pads LBP2 of the fourth structure S4 may be respectively connected to the upper bonding pads UBP2 of the third structure S3, and the lower bonding pads LBP2 of the fifth structure S5 may be respectively connected to the upper bonding pads UBP2 of the fourth structure S4.

The upper bonding pads UBP1 of the lower structure S1, the lower bonding pads LBP2 of the upper structures S2 to S5, and the upper bonding pads UBP2 of the upper structures S2 to S4 may include a conductive material including such as for example copper (Cu), gold (Au), silver (Ag), aluminum (Al), tungsten (W), titanium (Ti), tantalum (Ta), or a combination thereof. In some embodiments, a planar area (i.e., an area of a cross-sectional surface vertical to the Z direction) of each of the upper bonding pads UBP1 of the lower structure S1, the lower bonding pads LBP2 of the upper structures S2 to S5, and the upper bonding pads UBP2 of the upper structures S2 to S4 may be about 1 µm×1 µm or more.

Figure 4:
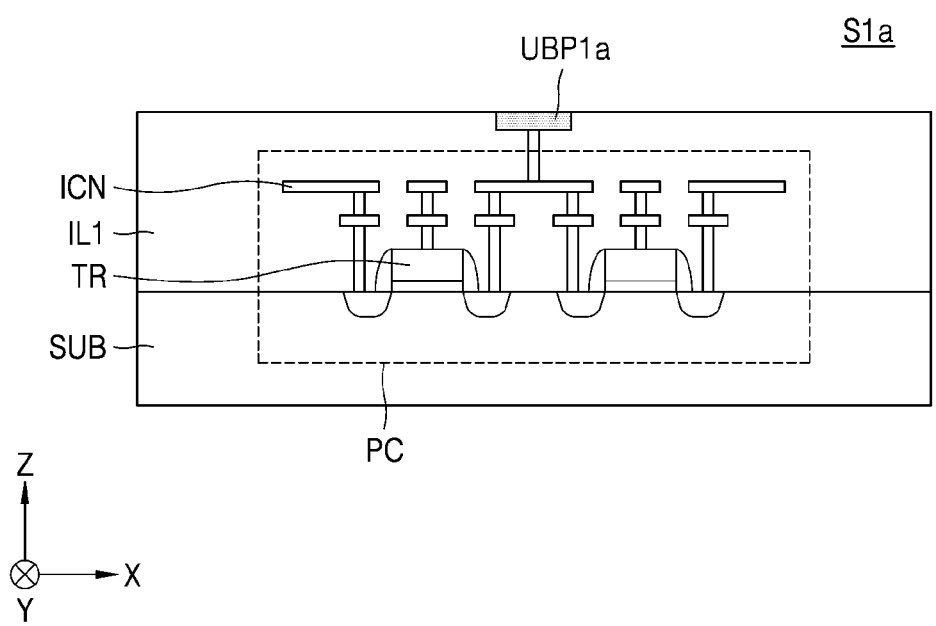
FIG. 4 illustrates s a cross-sectional view illustrating a lower structure included in a memory device according to embodiments of the inventive concepts.
Figure 9A:
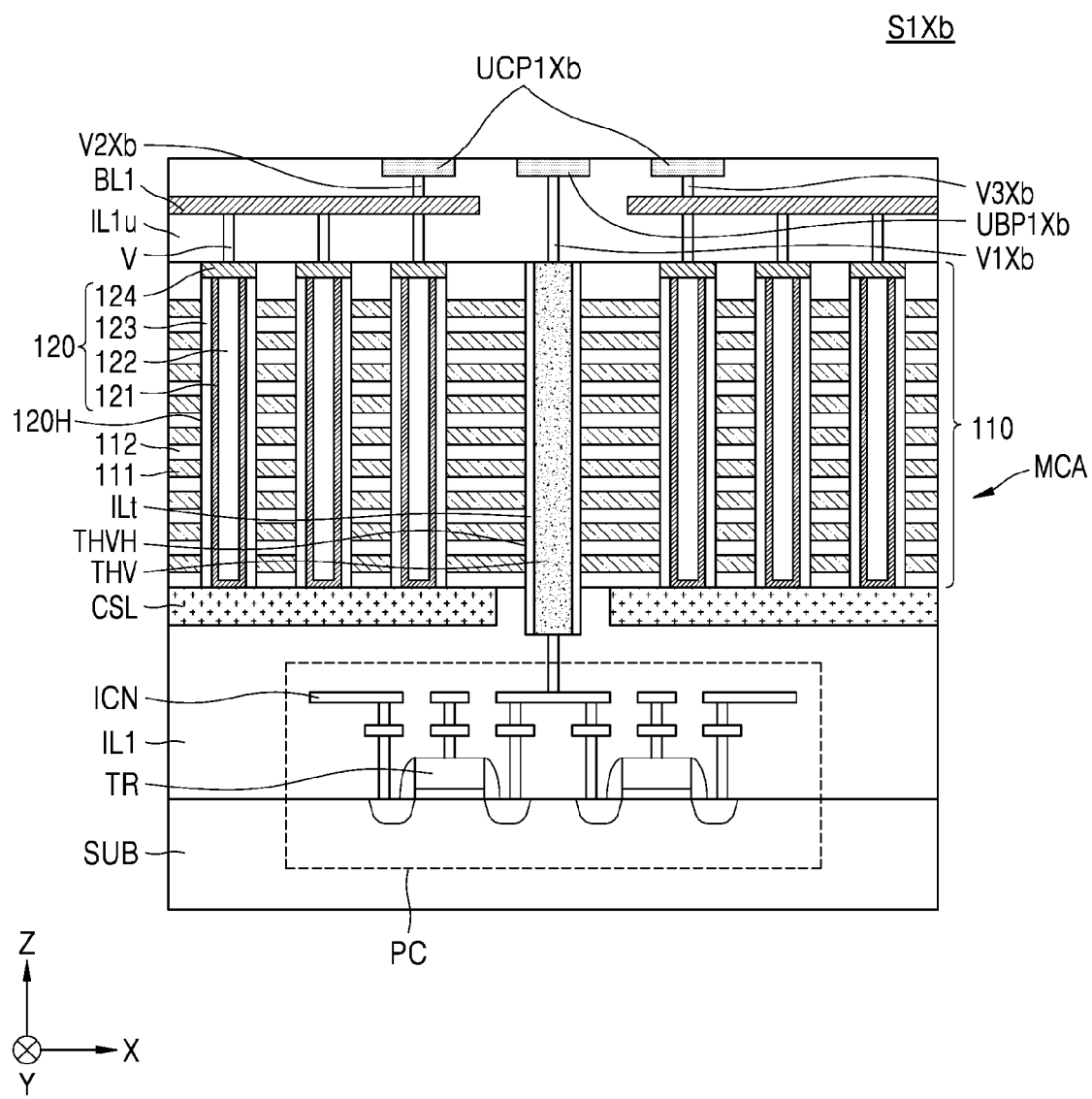
FIGS. 9A and 9B illustrate a cross-sectional view and a plan view of a lower structure included in a memory device according to embodiments of the inventive concepts.
Figure 9B:
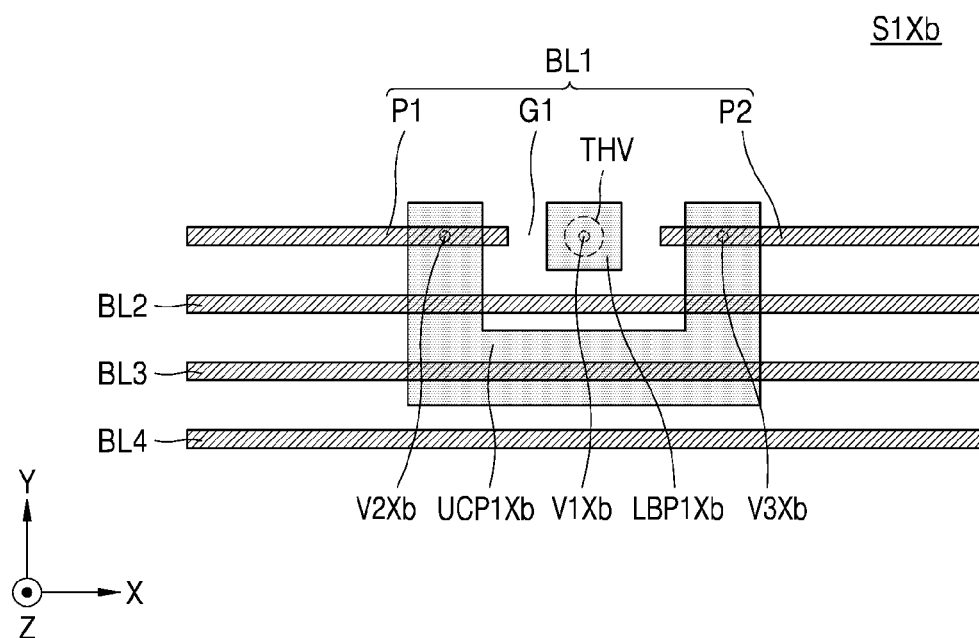
Figure 10A:
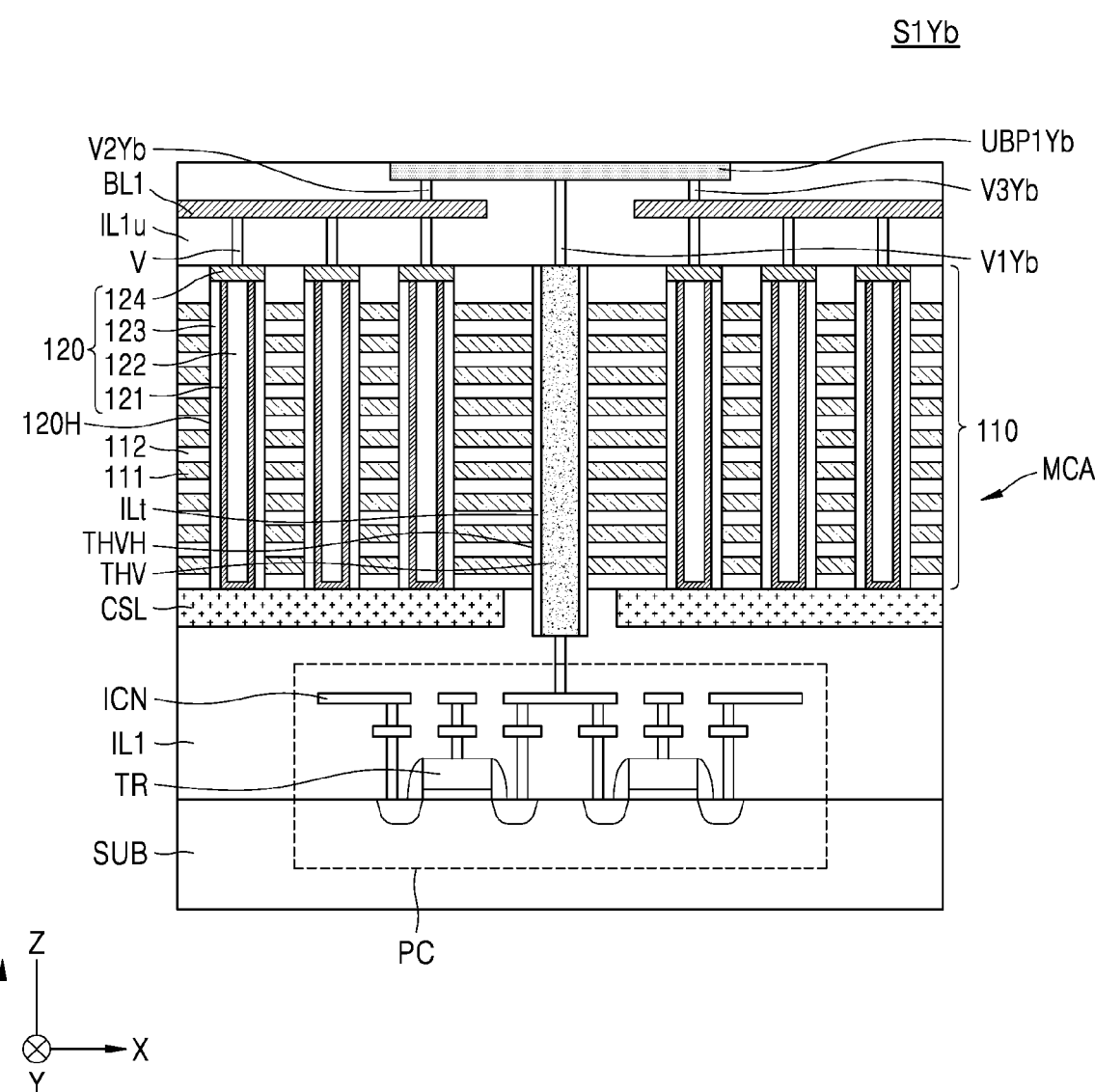
FIGS. 10A and 10B illustrate a cross-sectional view and a plan view of a lower structure included in a memory device according to embodiments of the inventive concepts.
Figure 10B:
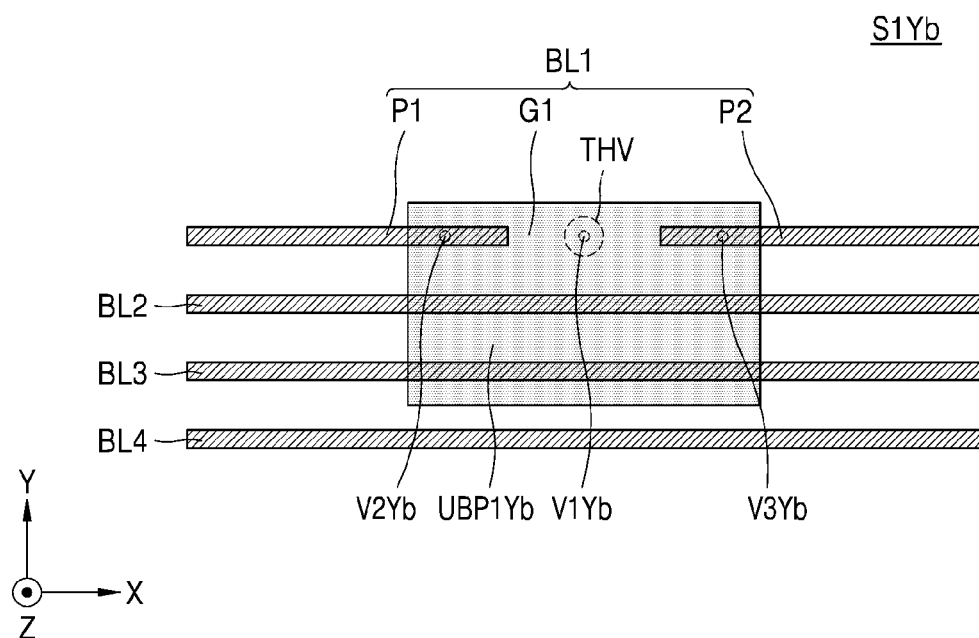
Figure 11A:
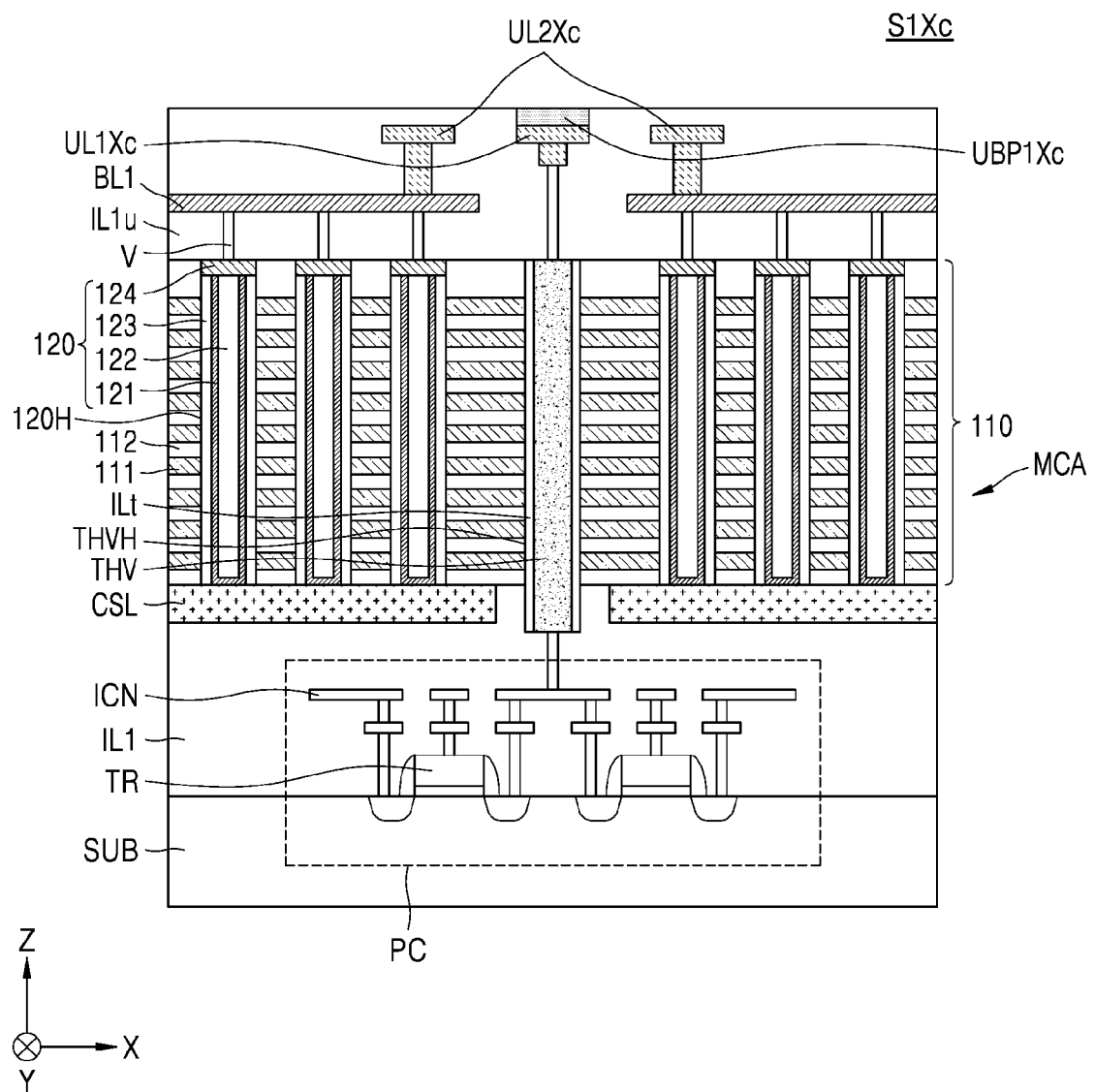
FIGS. 11A and 11B illustrate a cross-sectional view and a plan view of a lower structure included in a memory device according to embodiments of the inventive concepts.
Figure 11B:
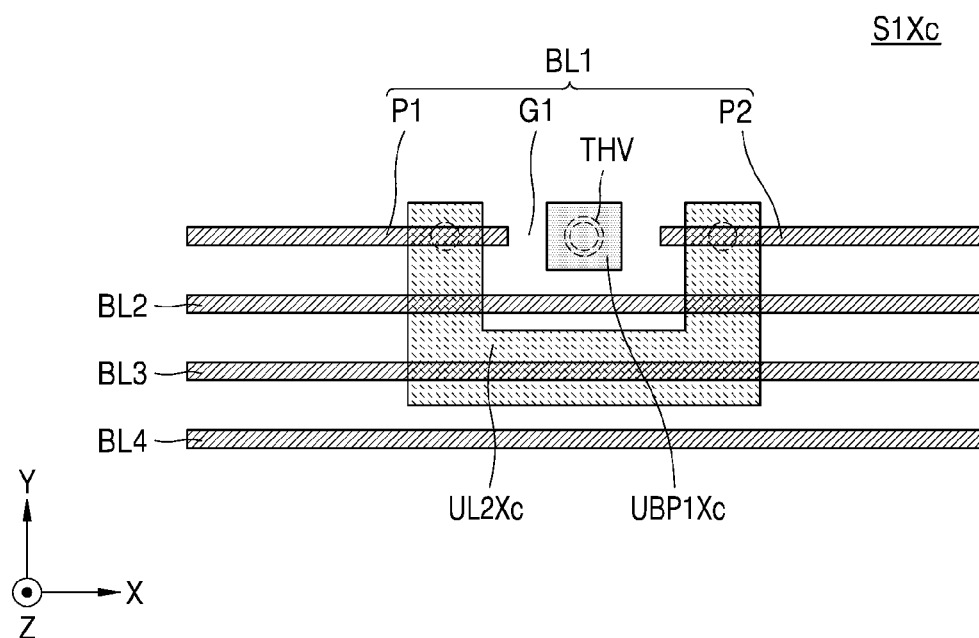
Figure 12A:
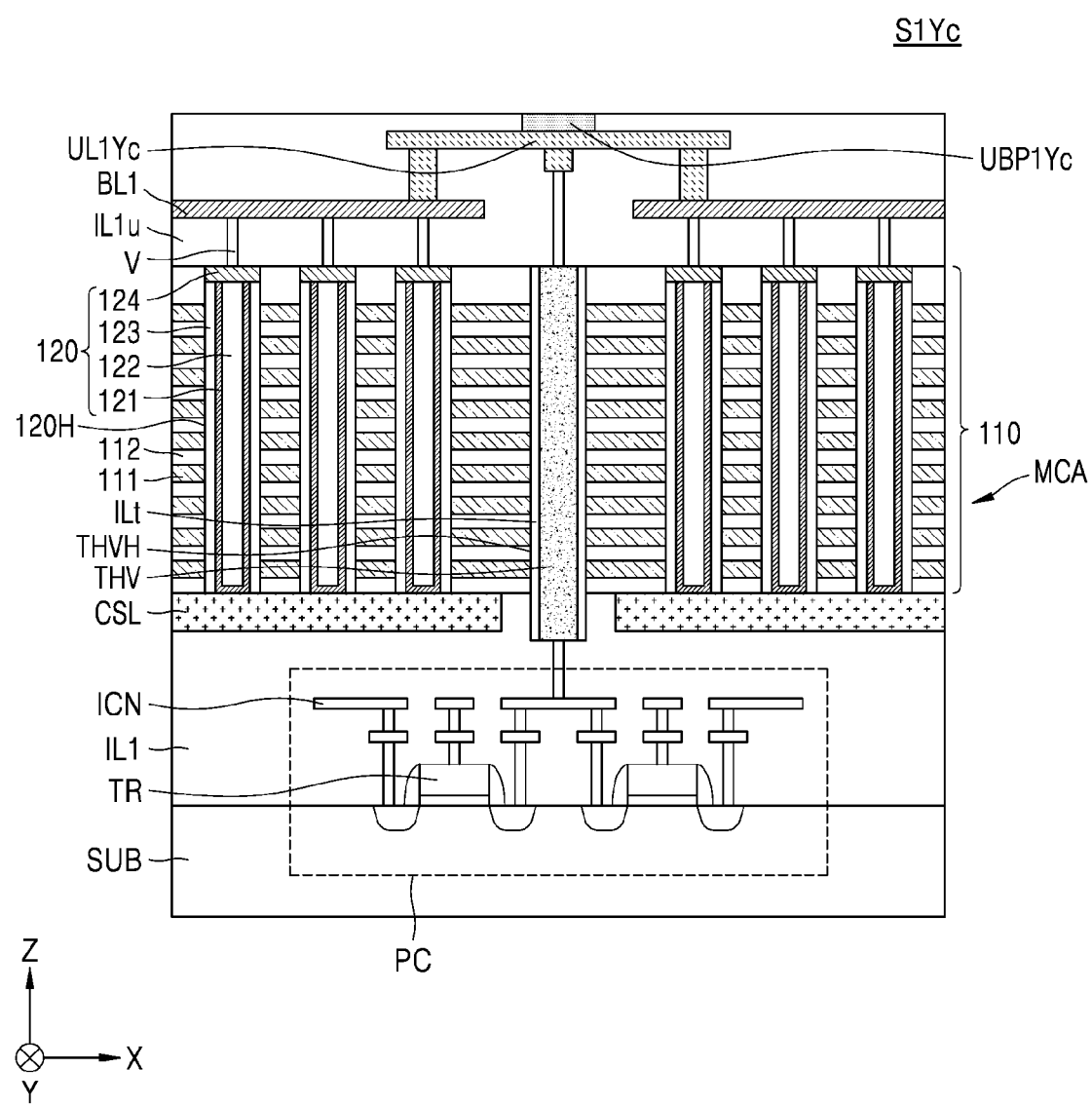
FIGS. 12A and 12B illustrate a cross-sectional view and a plan view of a lower structure included in a memory device according to embodiments of the inventive concepts.
Figure 12B:
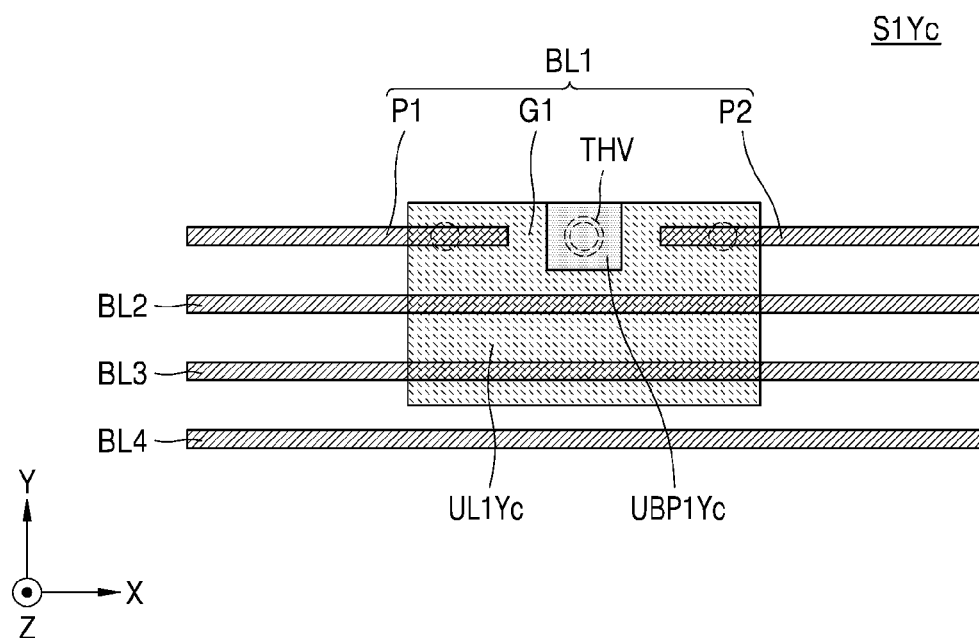

The lower structure S1 may include a lower structure S1$a$ illustrated in FIG. 4, a lower structure S1Xb illustrated in FIGS. 9A and 9B, a lower structure S1Yb illustrated in FIGS. 10A and 10B, a lower structure S1Xc illustrated in FIGS. 11A and 11B, a lower structure S1Yc illustrated in FIGS. 12A and 12B, or a combination thereof.

Figure 5A:
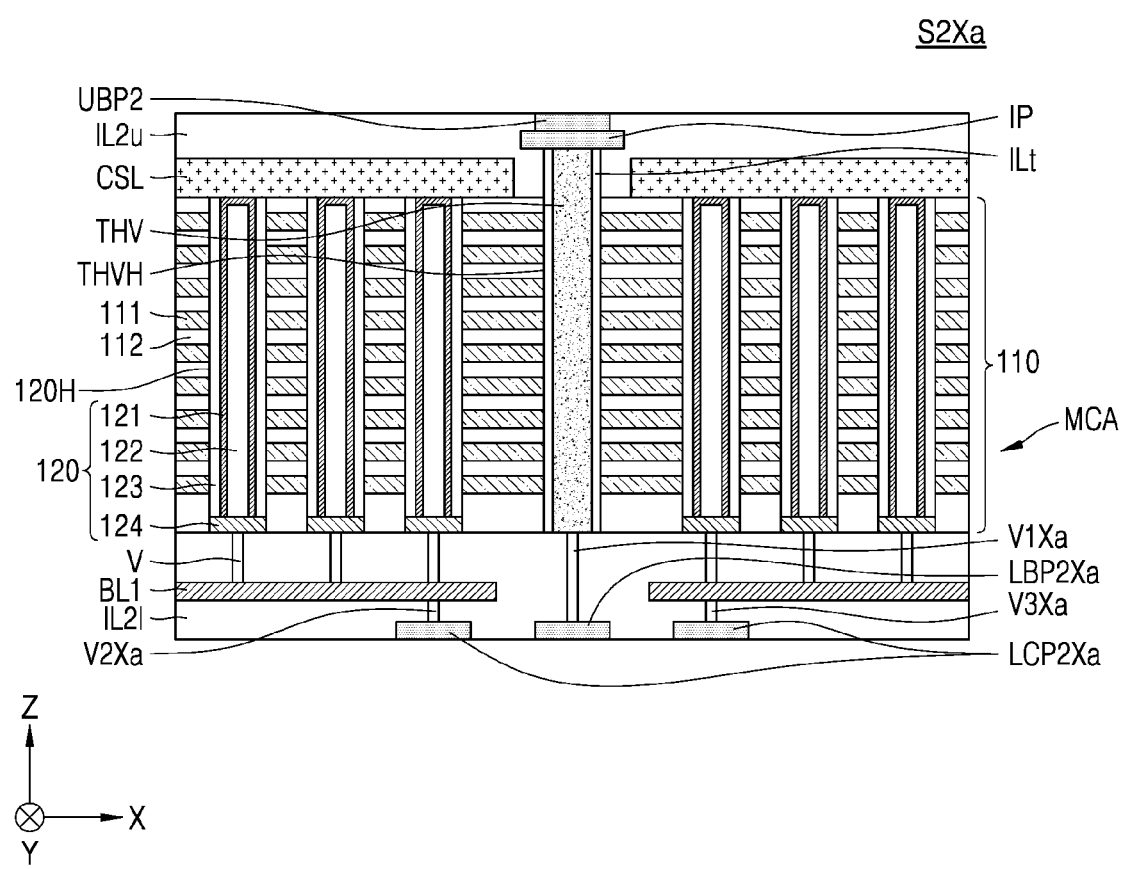
FIGS. 5A and 5B illustrate a cross-sectional view and a plan view of an upper structure included in a memory device according to embodiments of the inventive concepts.
Figure 5B:
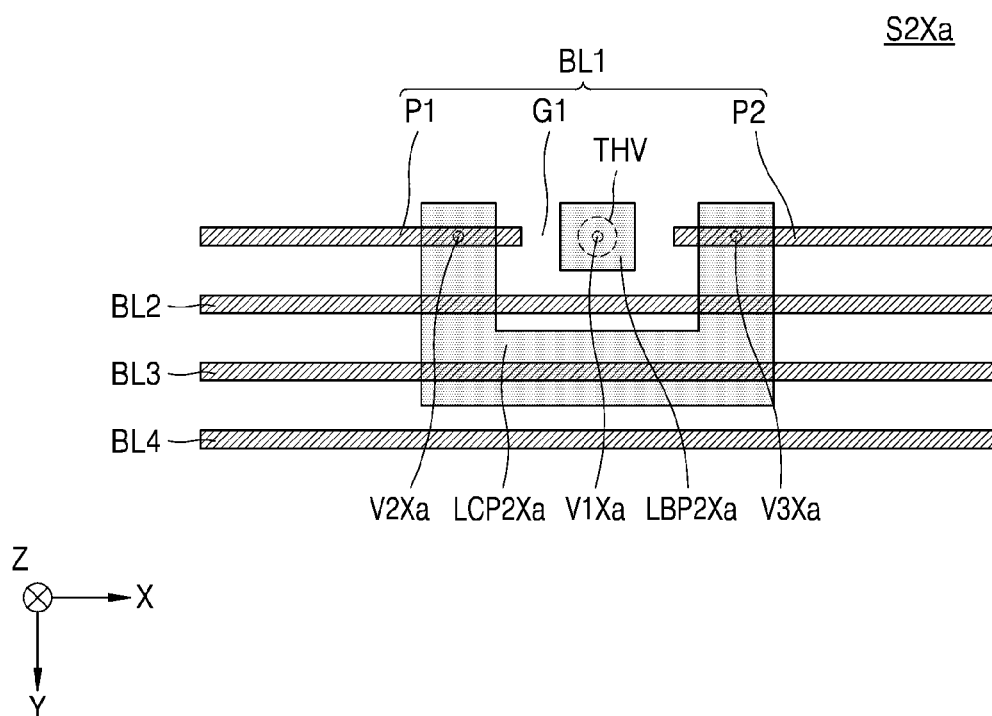
Figure 6A:
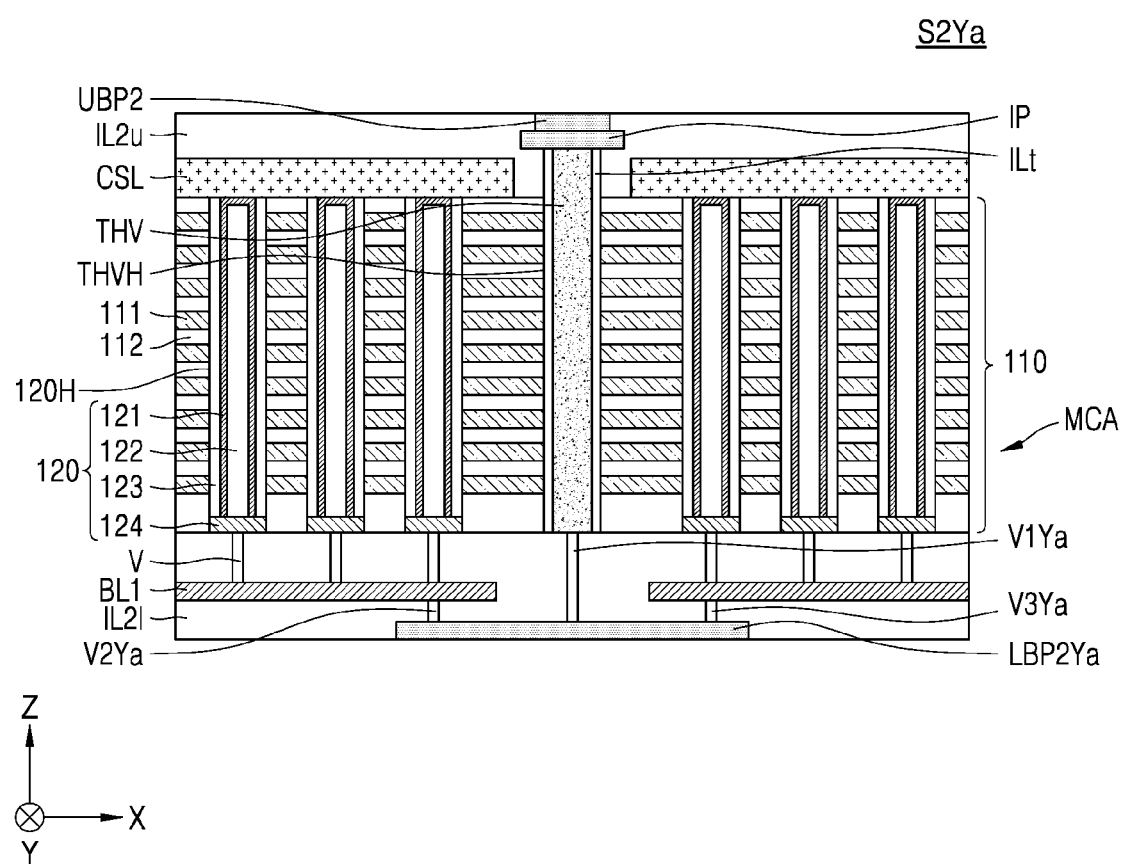
FIGS. 6A and 6B illustrate a cross-sectional view and a plan view of an upper structure included in a memory device according to embodiments of the inventive concepts.
Figure 6B:
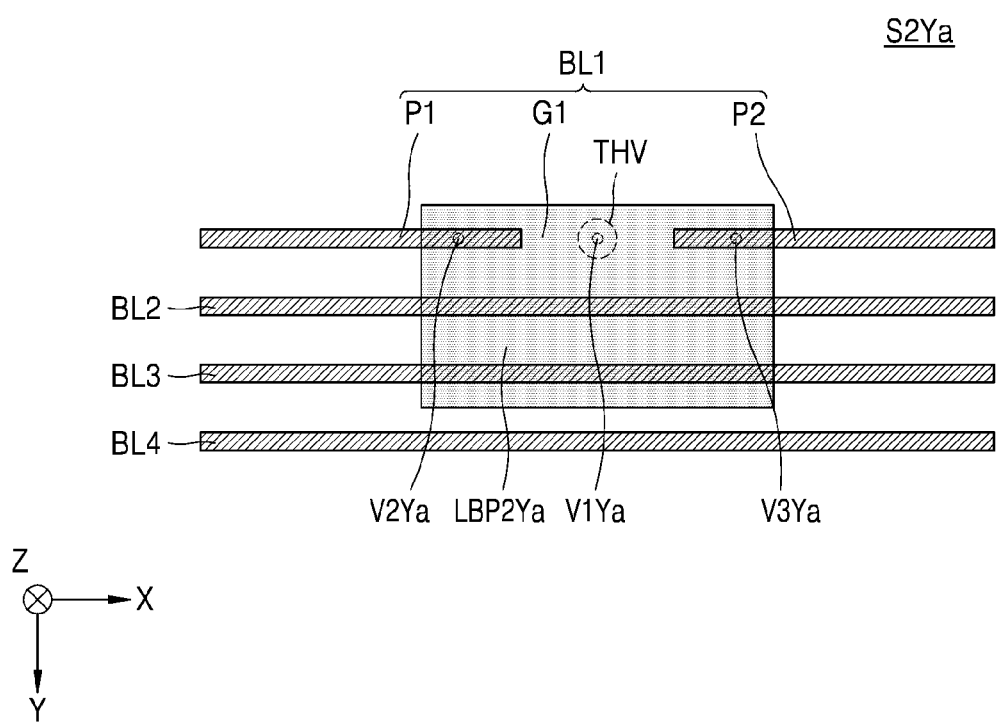
Figure 7A:
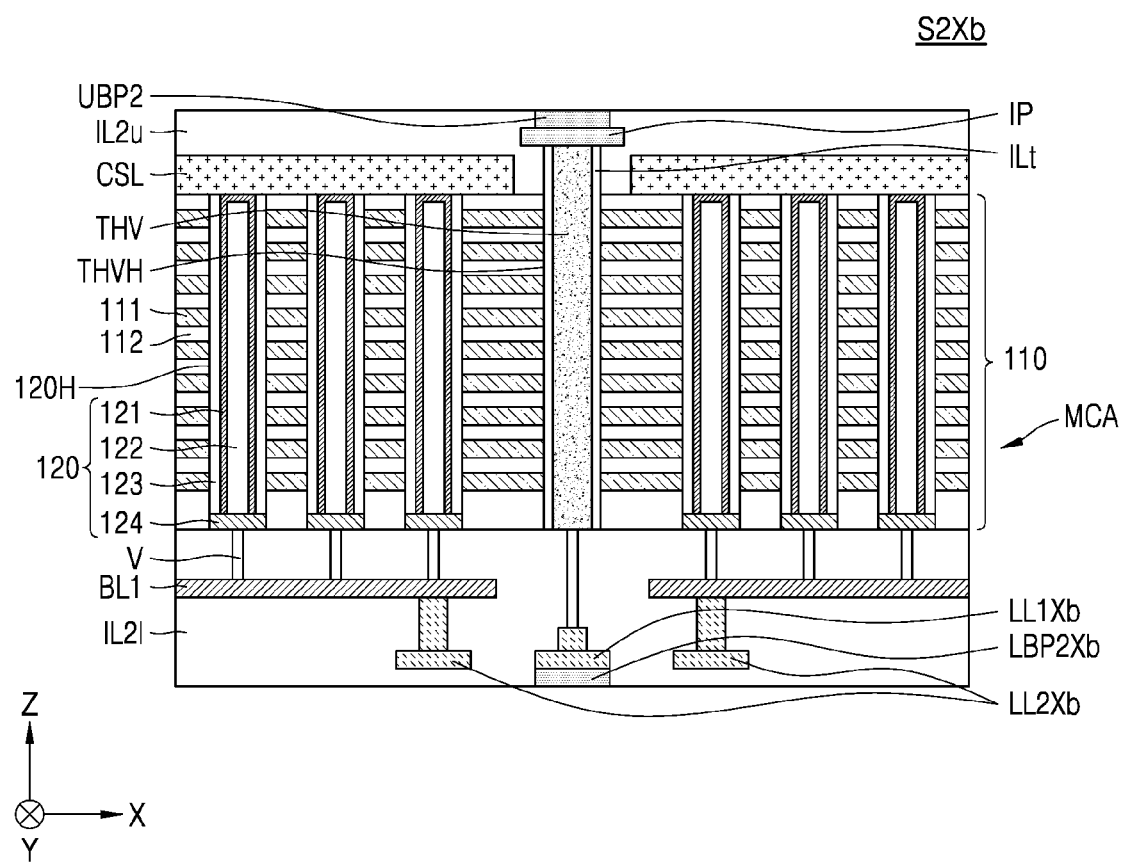
FIGS. 7A and 7B illustrate a cross-sectional view and a plan view of an upper structure included in a memory device according to embodiments of the inventive concepts.
Figure 7B:
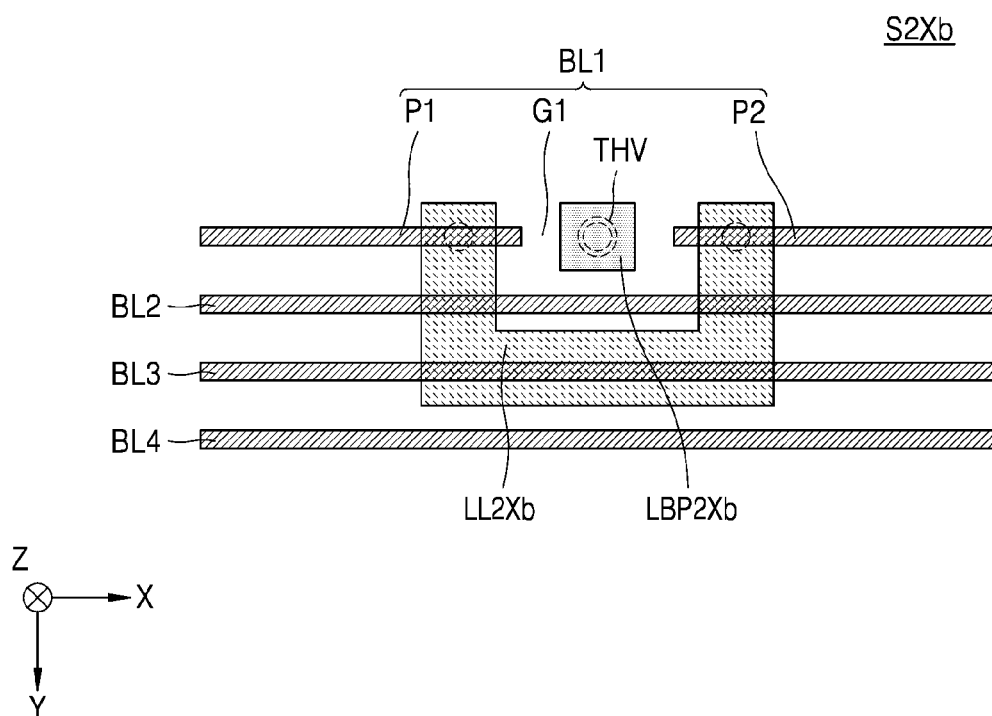
Figure 8A:
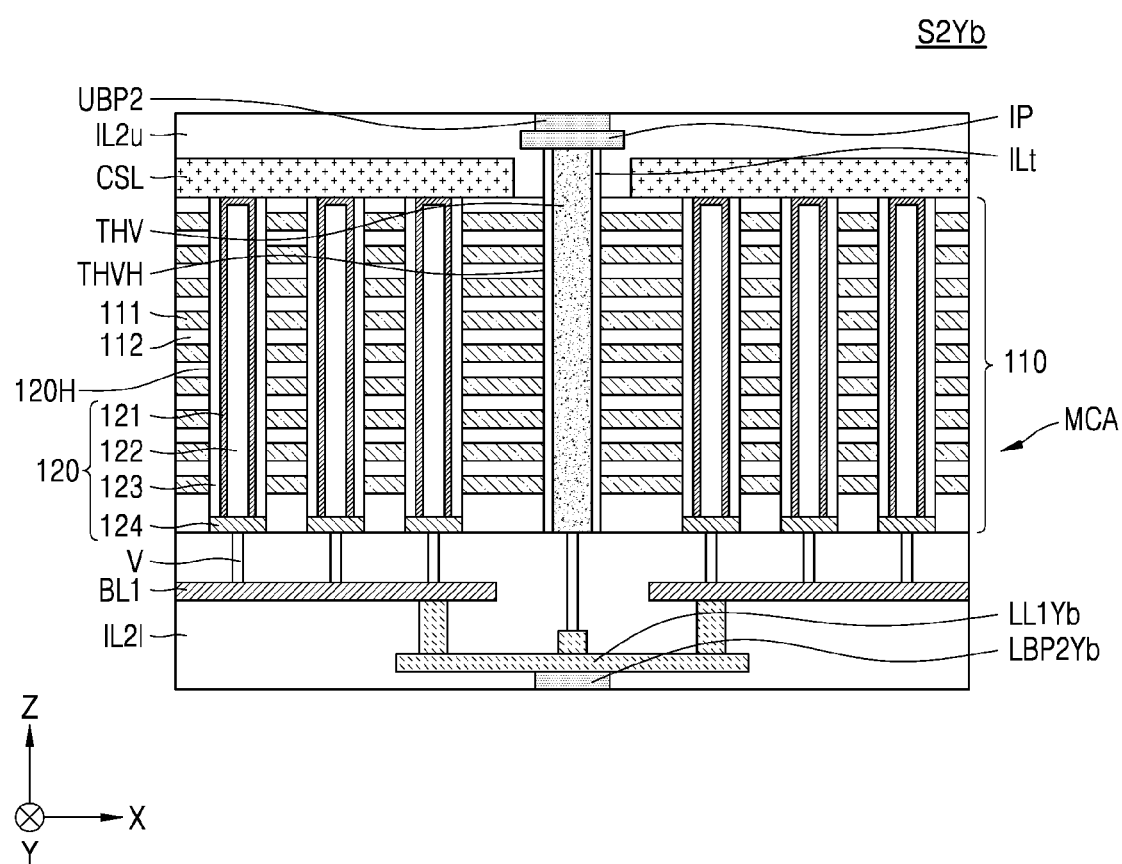
FIGS. 8A and 8B illustrate a cross-sectional view and a plan view of an upper structure included in a memory device according to embodiments of the inventive concepts.
Figure 8B:
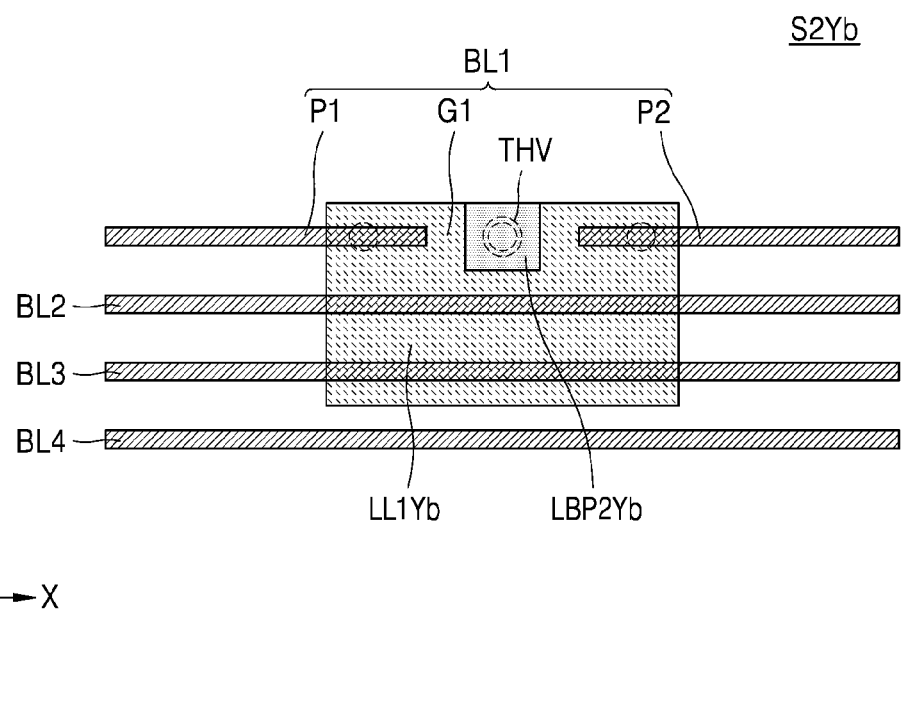
Figure 13A:
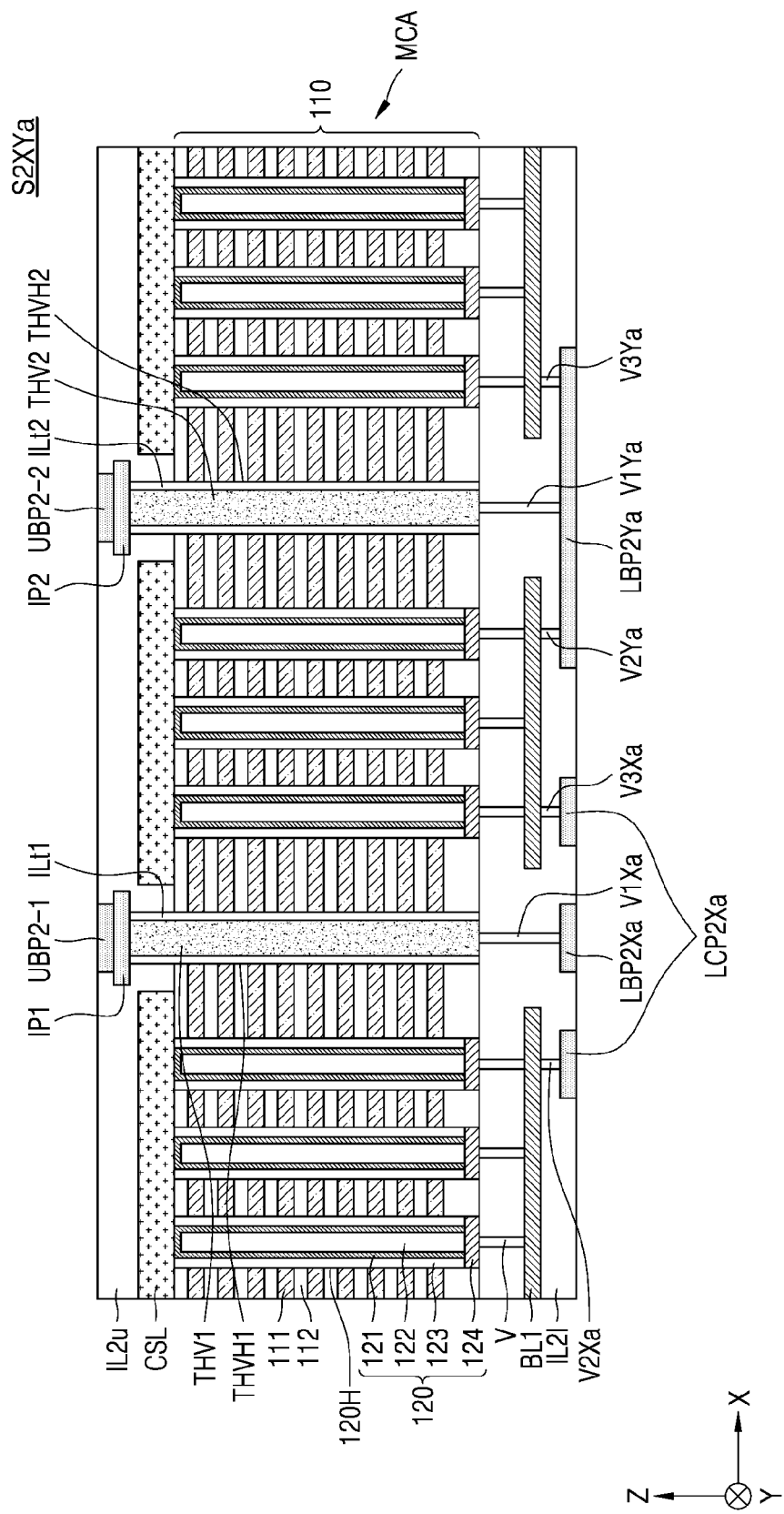
FIGS. 13A and 13B illustrate a cross-sectional view and a plan view of an upper structure included in a memory device according to embodiments of the inventive concepts.
Figure 13B:
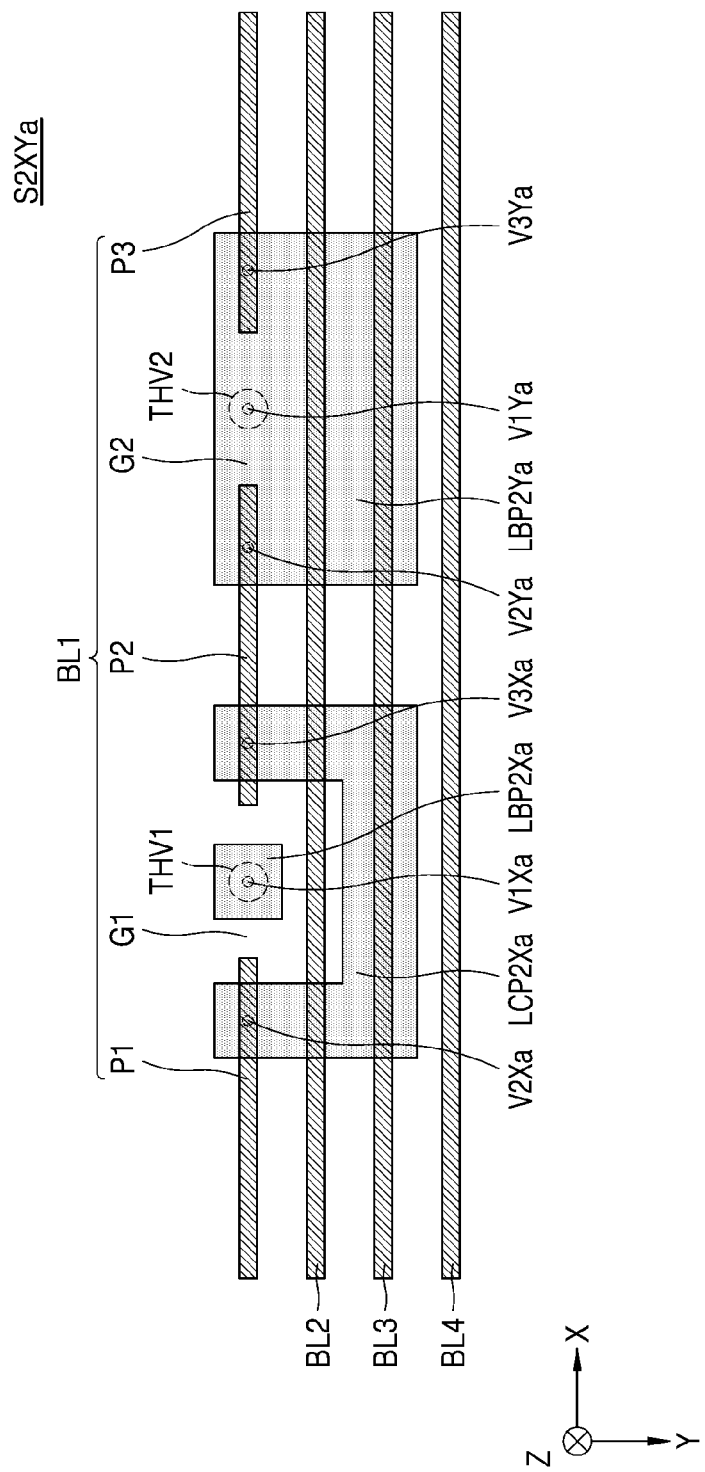
Figure 14A:
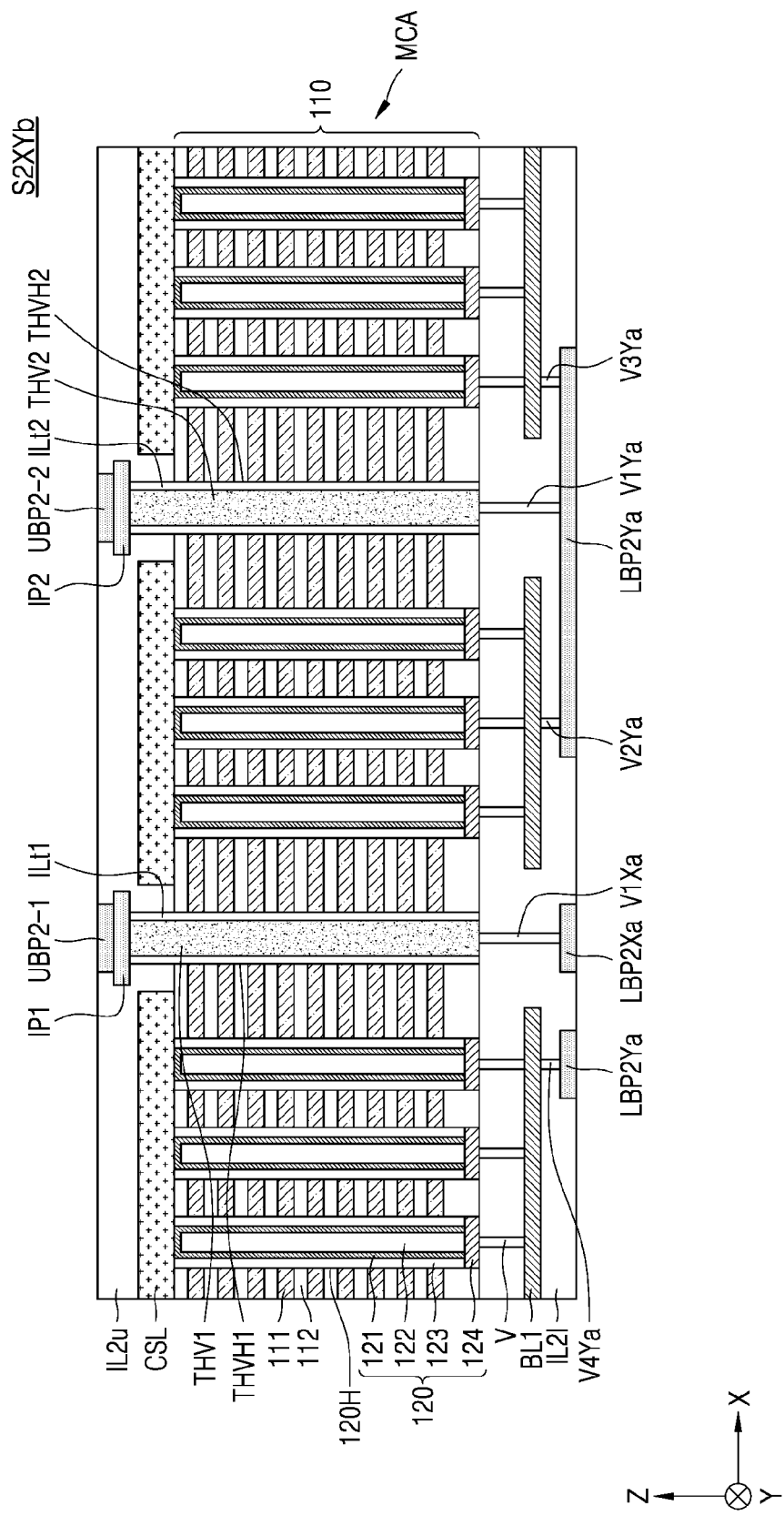
FIGS. 14A and 14B illustrate a cross-sectional view and a plan view of an upper structure included in a memory device according to embodiments of the inventive concepts.
Figure 14B:
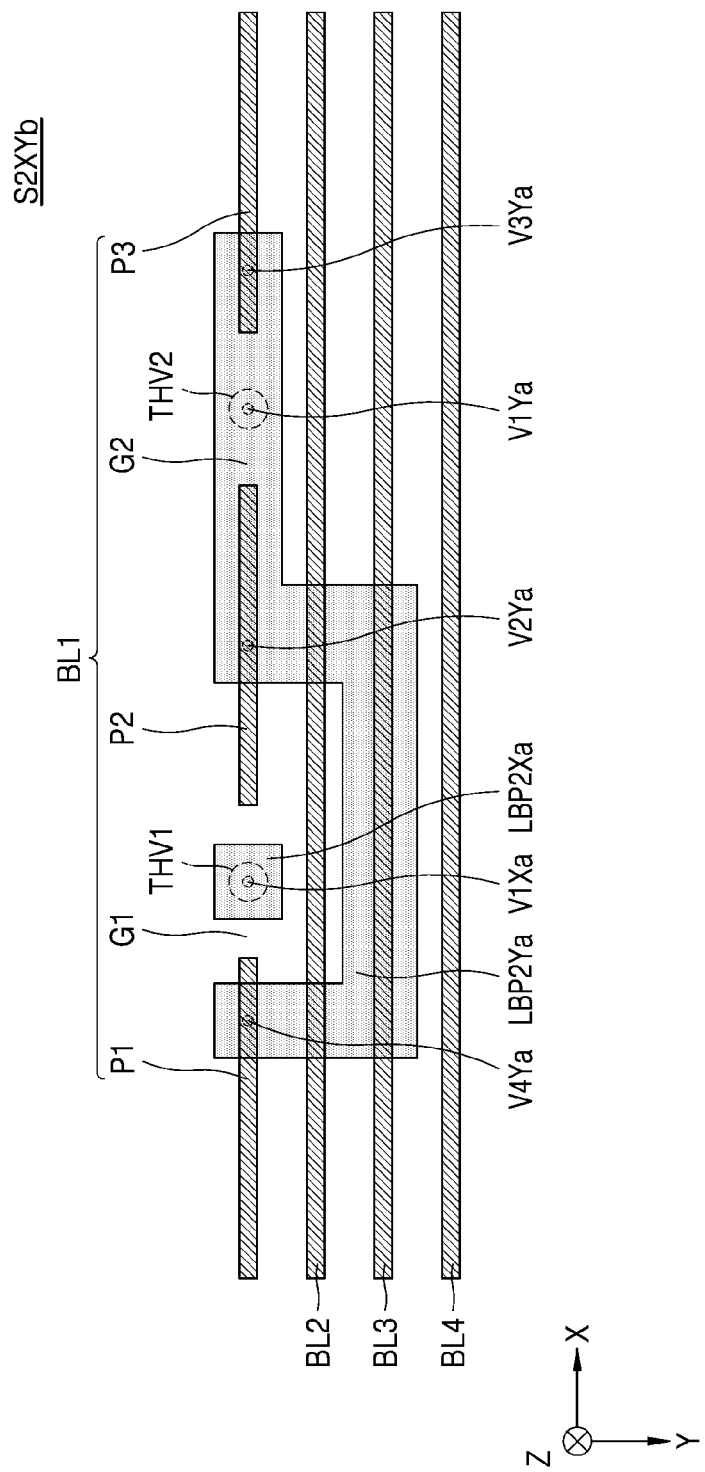
Figure 15A:
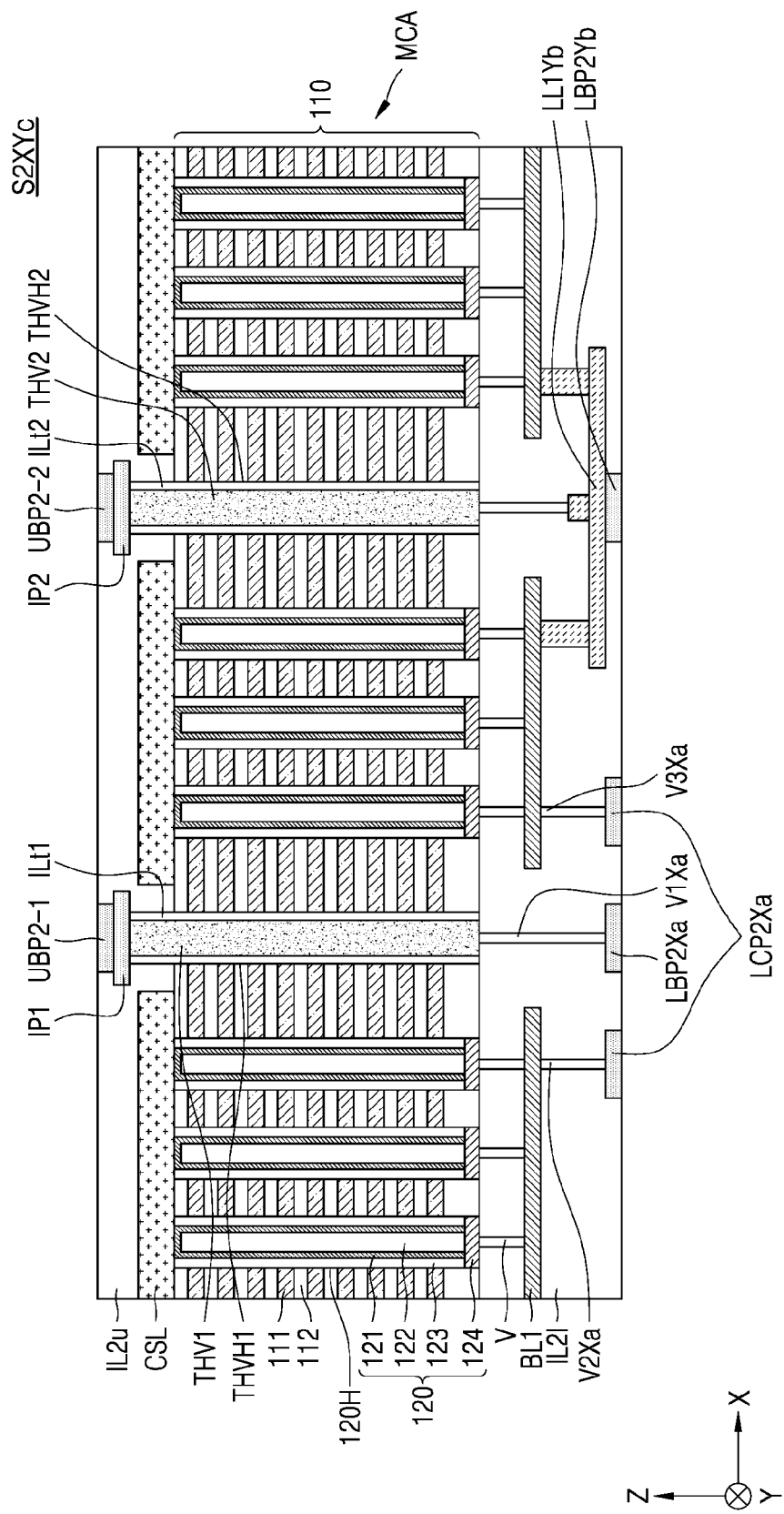
FIGS. 15A and 15B illustrate a cross-sectional view and a plan view of an upper structure included in a memory device according to embodiments of the inventive concepts.
Figure 15B:
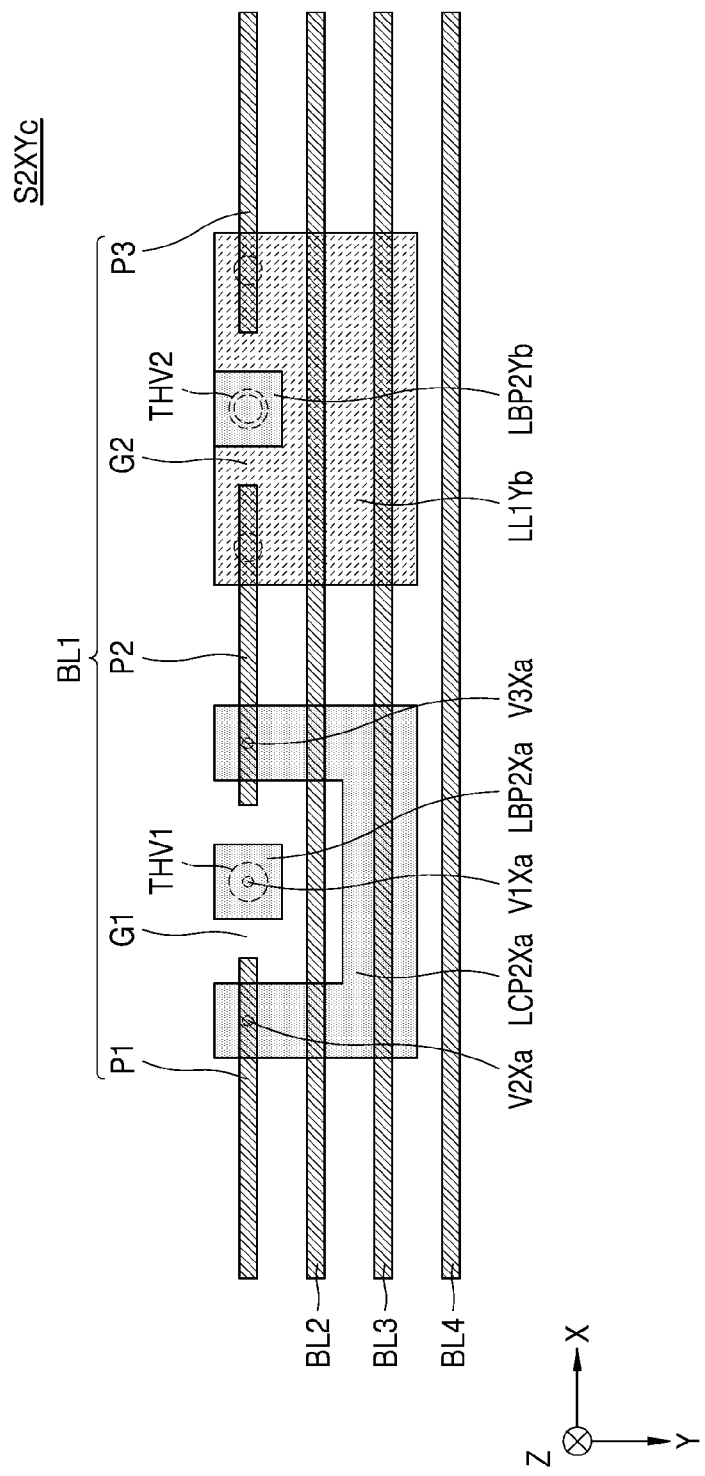
Figure 16A:
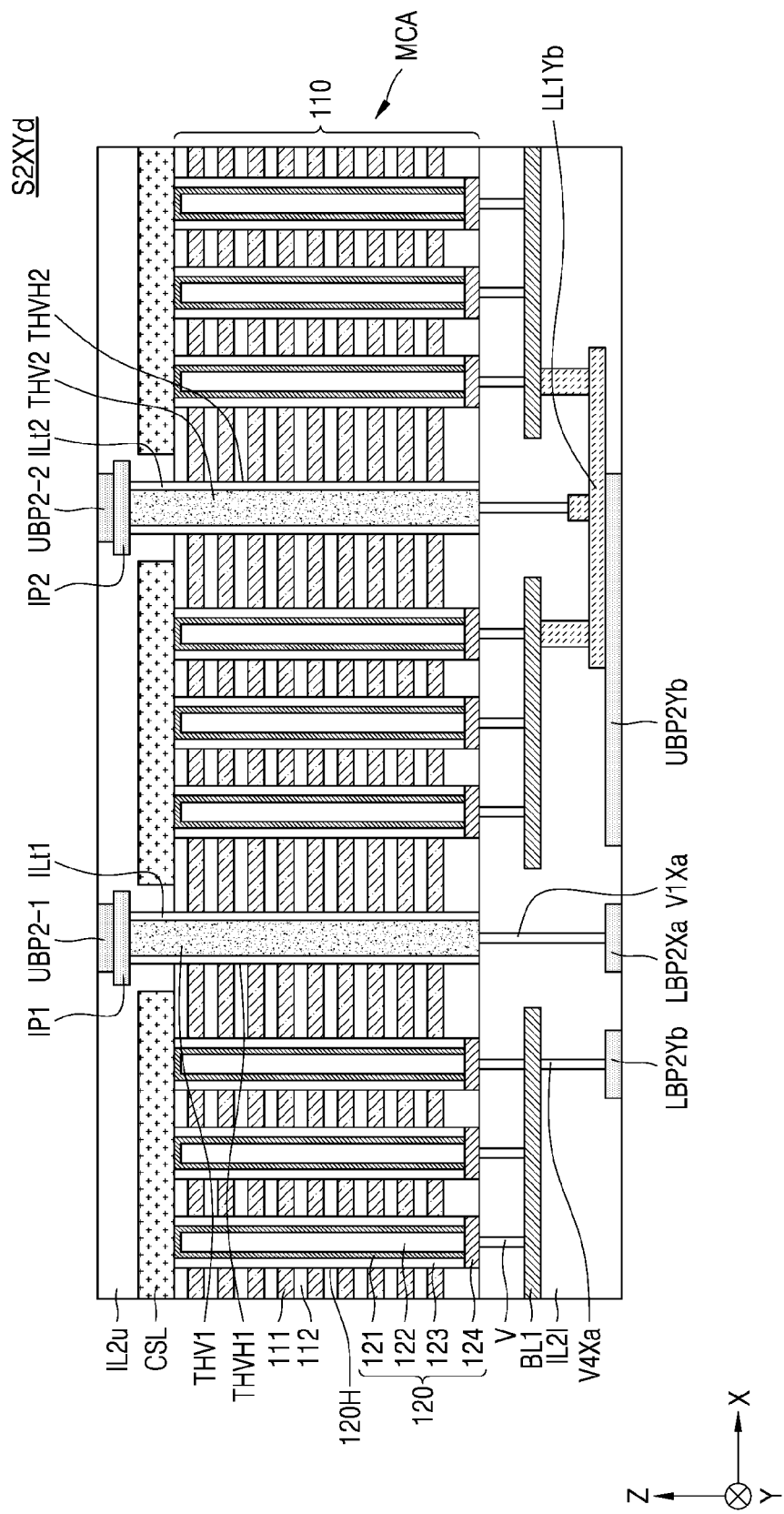
FIGS. 16A and 16B illustrate a cross-sectional view and a plan view of an upper structure included in a memory device according to embodiments of the inventive concepts.
Figure 16B:
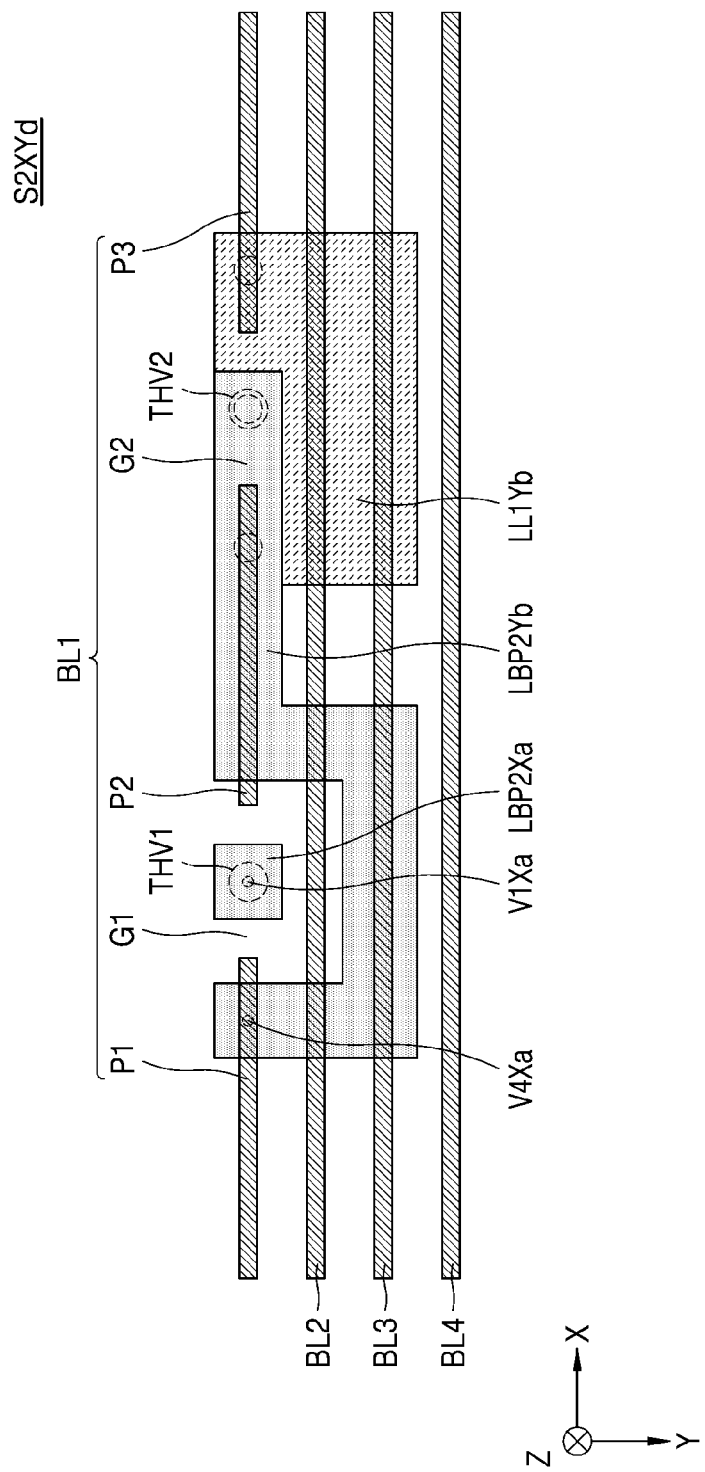
Figure 17A:
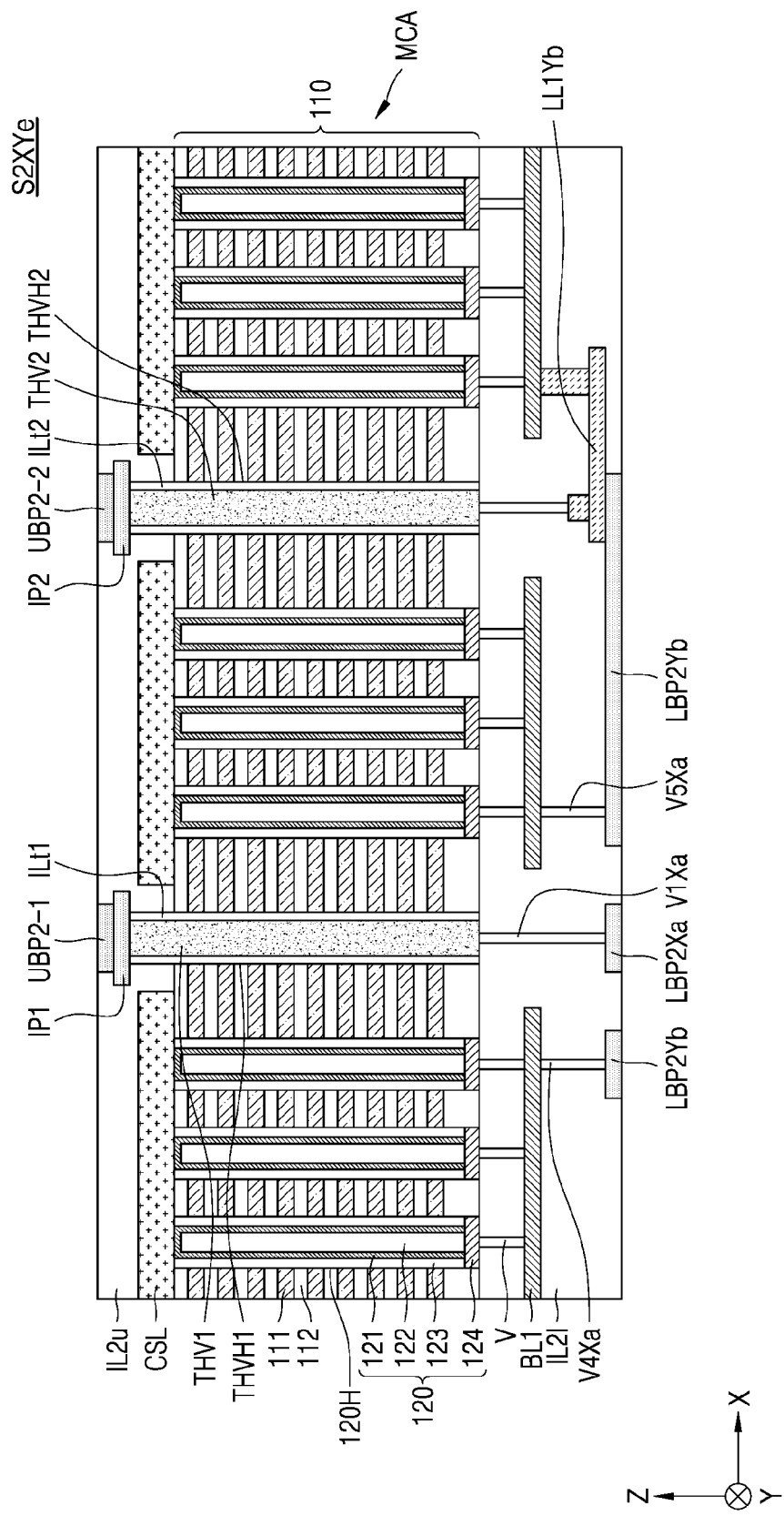
FIGS. 17A and 17B illustrate a cross-sectional view and a plan view of an upper structure included in a memory device according to embodiments of the inventive concepts.
Figure 17B:
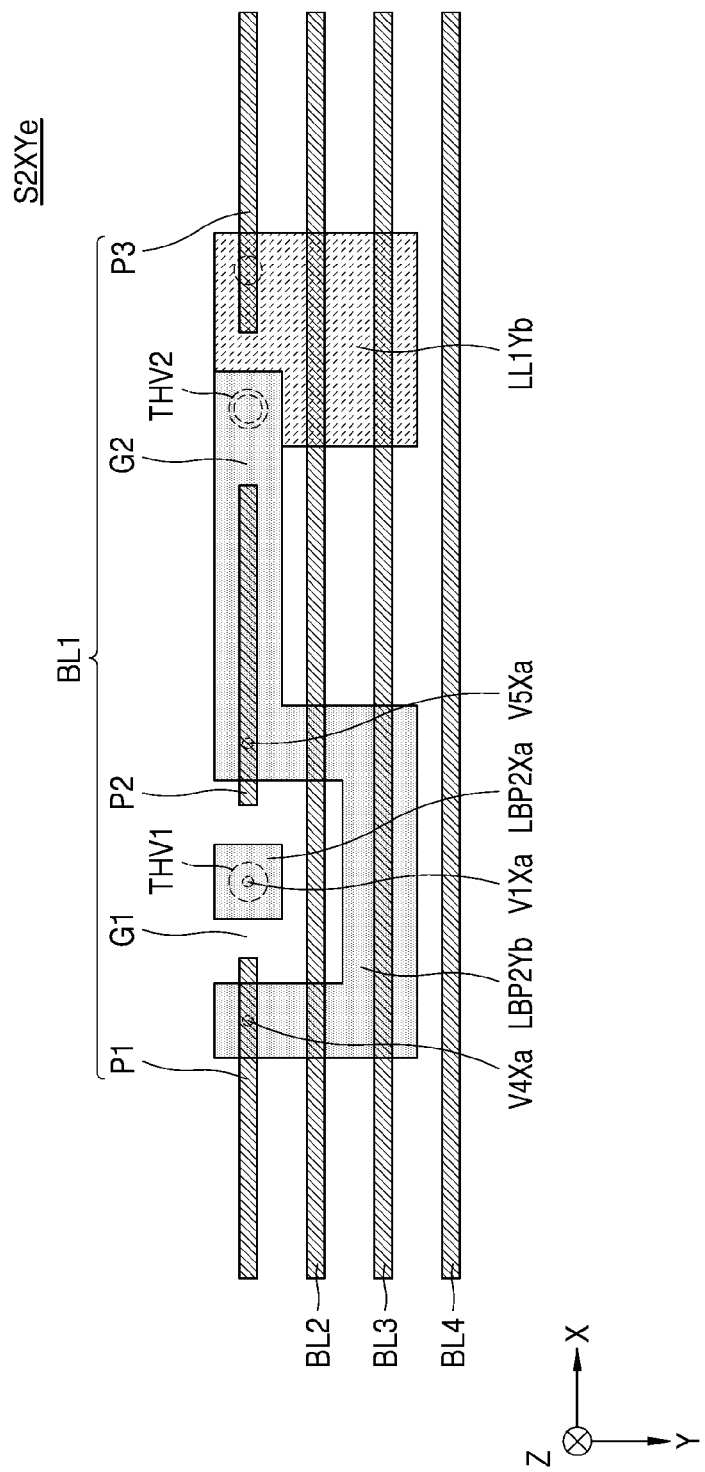
Figure 18A:
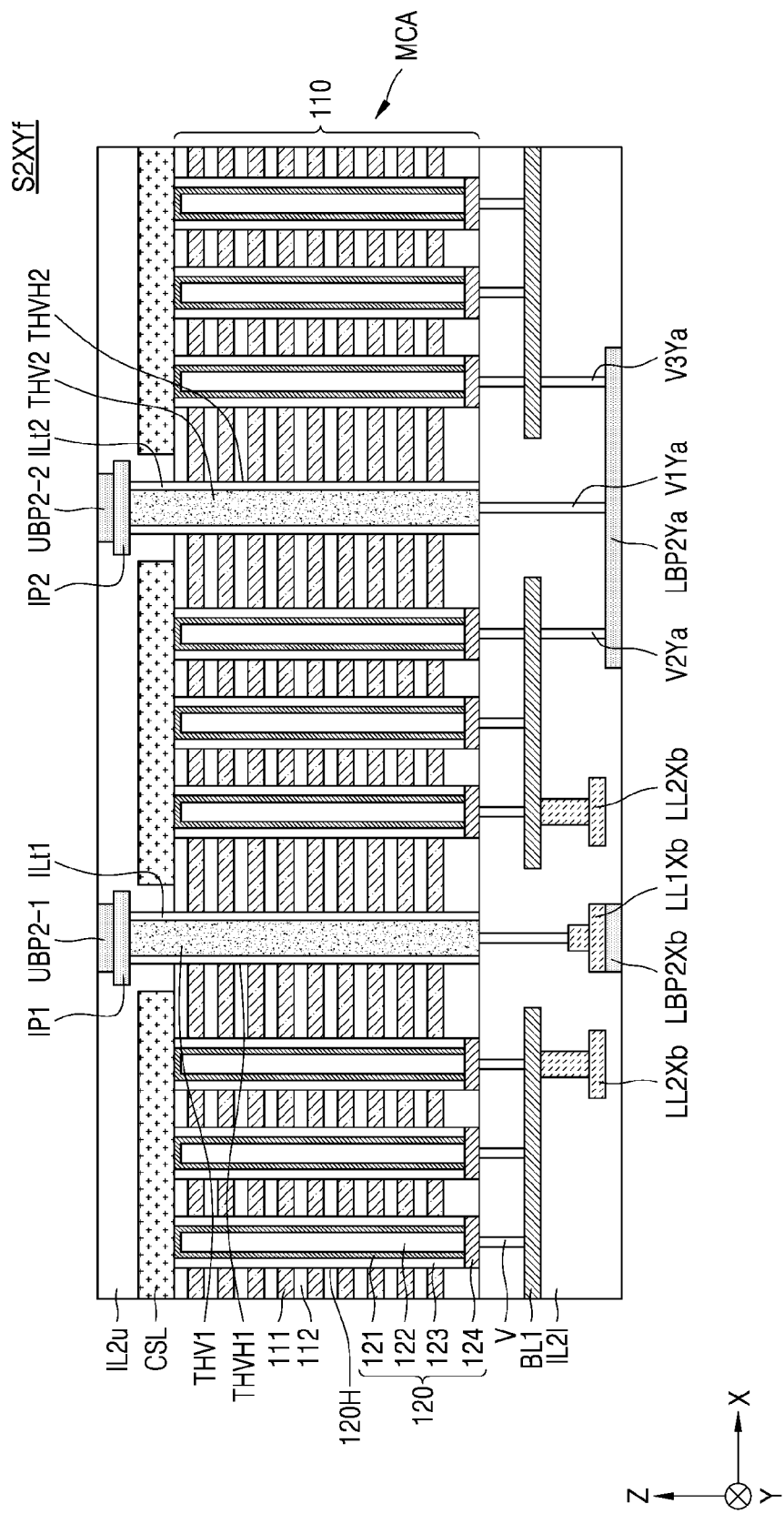
FIGS. 18A and 18B illustrate a cross-sectional view and a plan view of an upper structure included in a memory device according to embodiments of the inventive concepts.
Figure 18B:
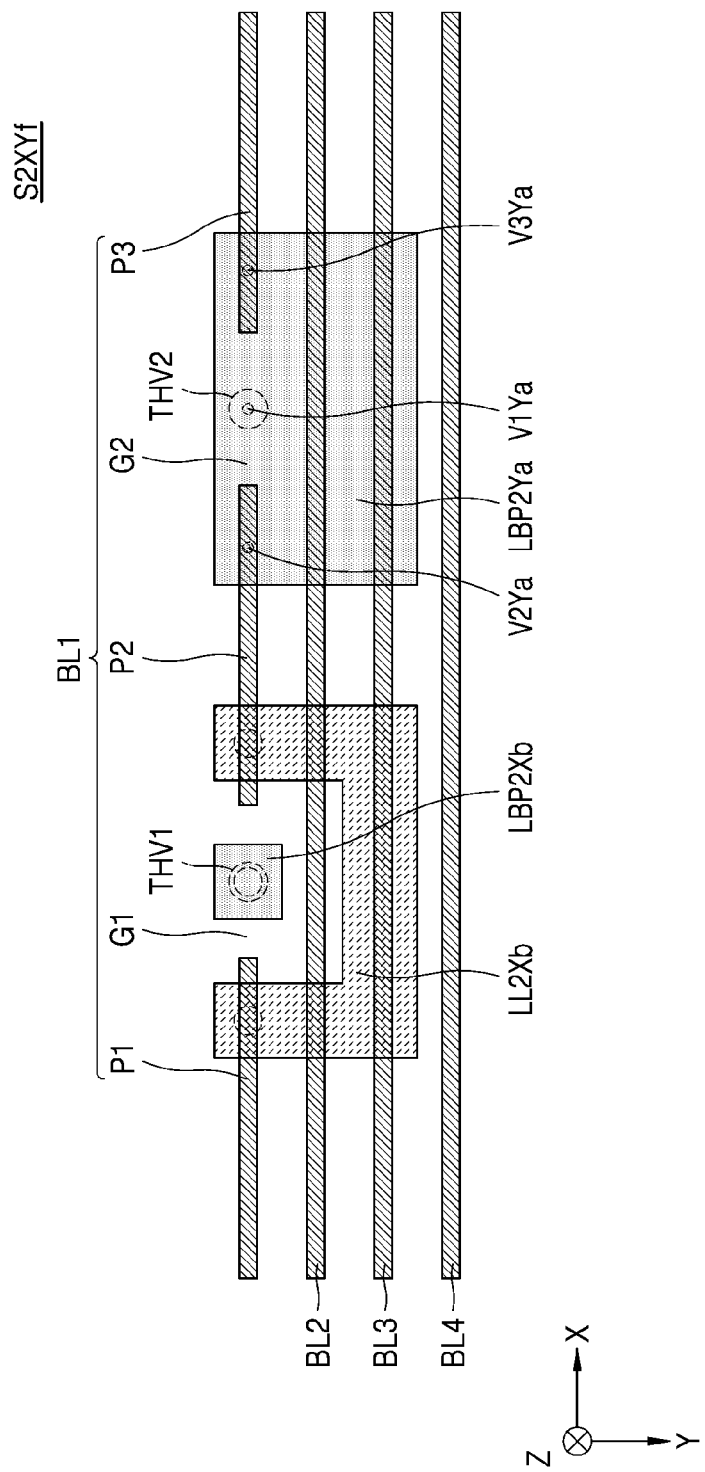
Figure 19A:
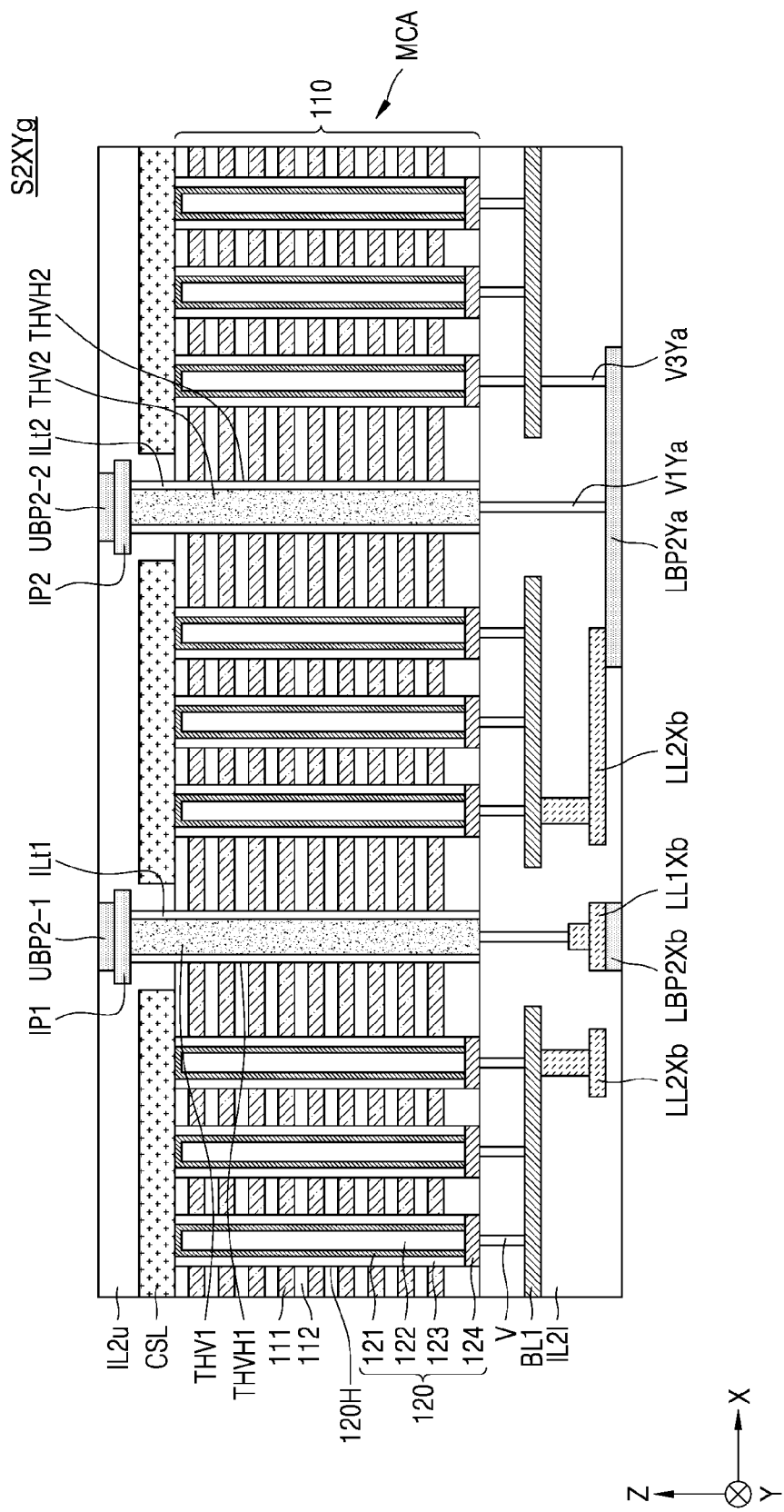
FIGS. 19A and 19B illustrate a cross-sectional view and a plan view of an upper structure included in a memory device according to embodiments of the inventive concepts.
Figure 19B:
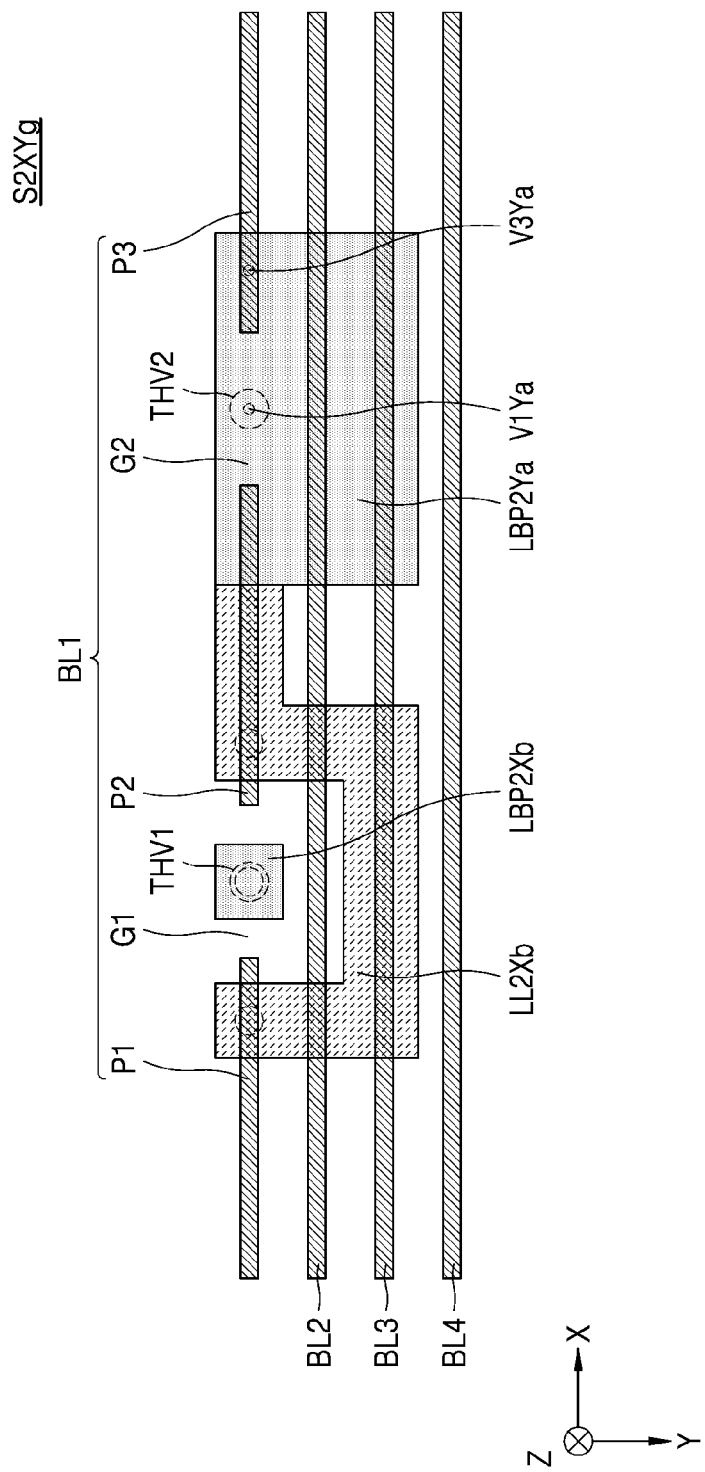
Figure 20A:
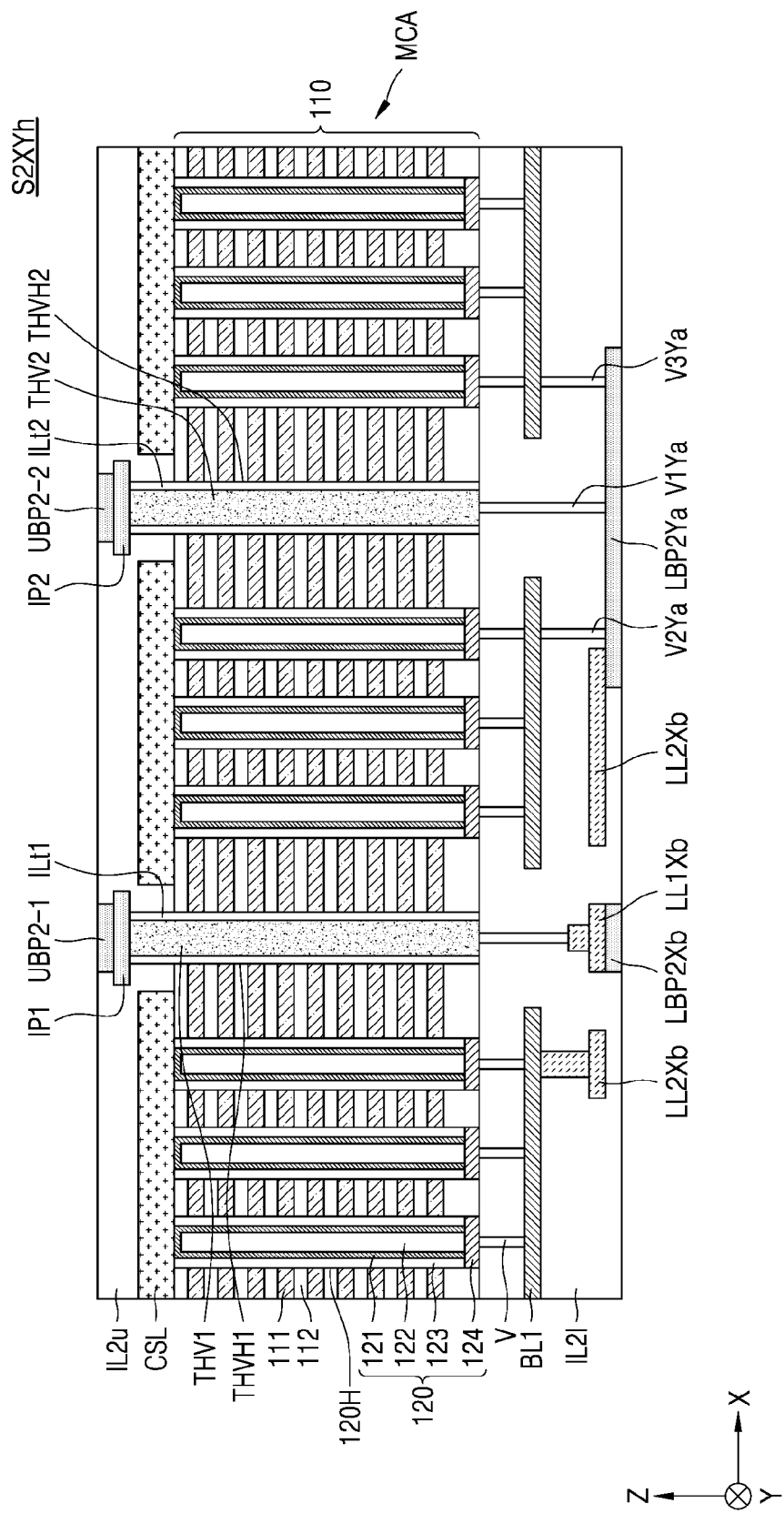
FIGS. 20A and 20B illustrate a cross-sectional view and a plan view of an upper structure included in a memory device according to embodiments of the inventive concepts.
Figure 20B:
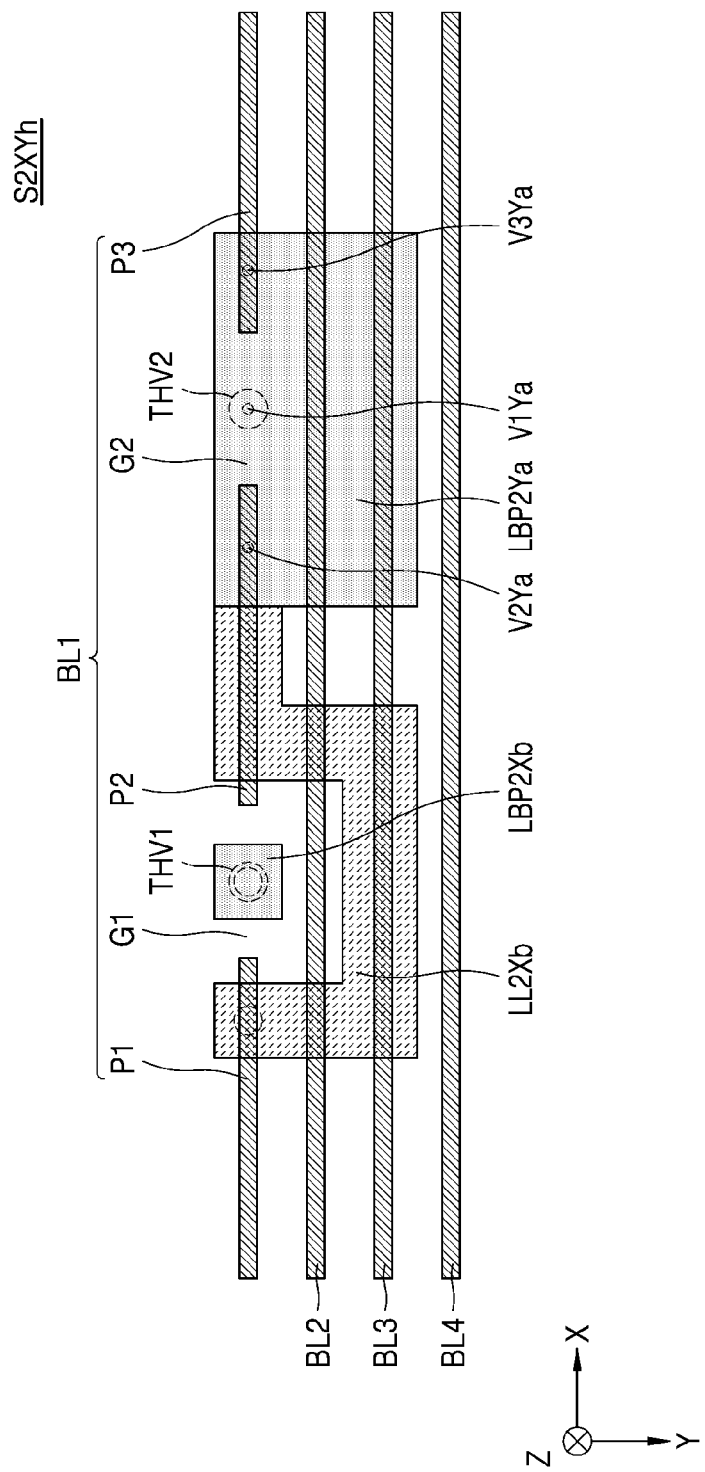
Figure 21A:
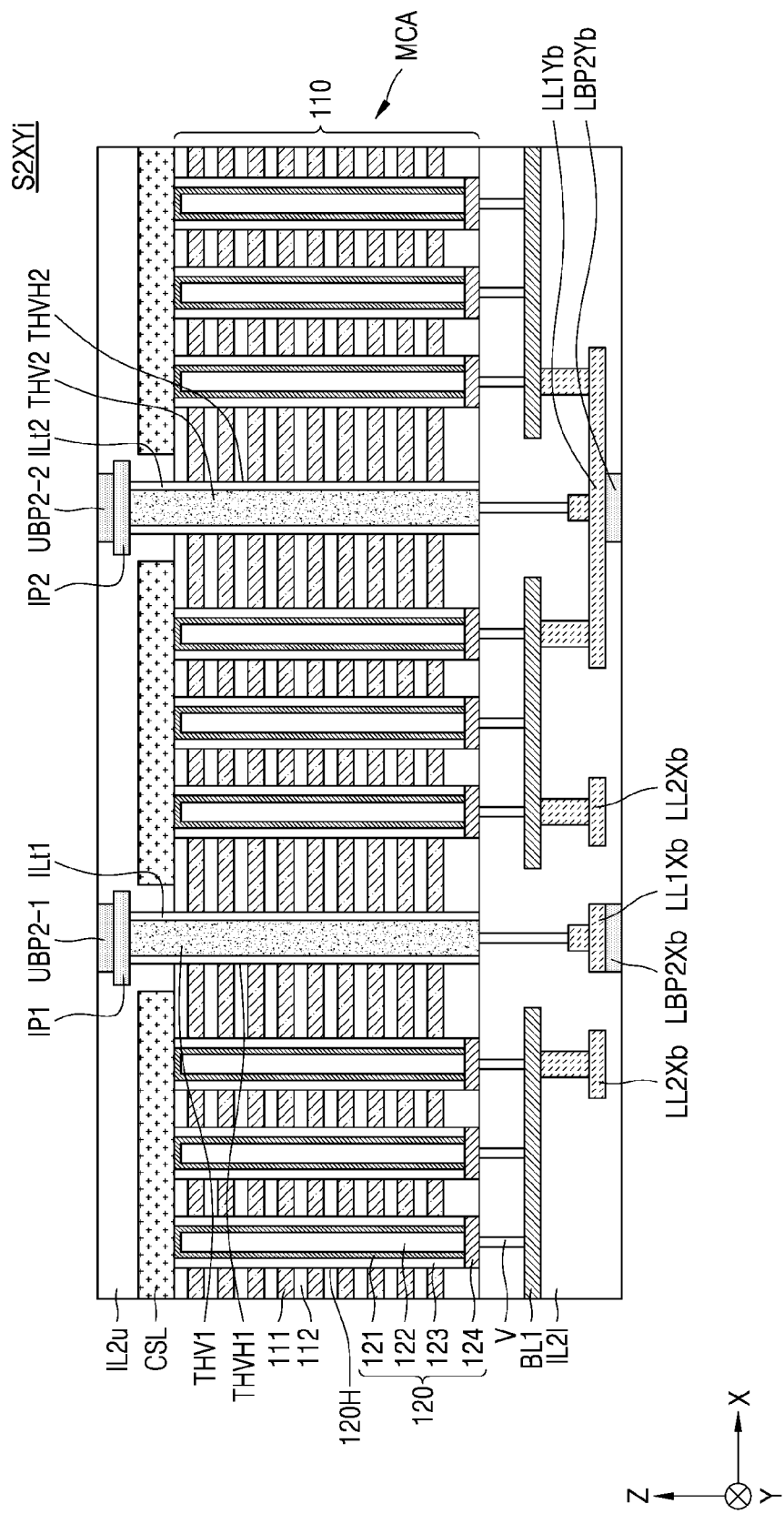
FIGS. 21A and 21B illustrate a cross-sectional view and a plan view of an upper structure included in a memory device according to embodiments of the inventive concepts.
Figure 21B:
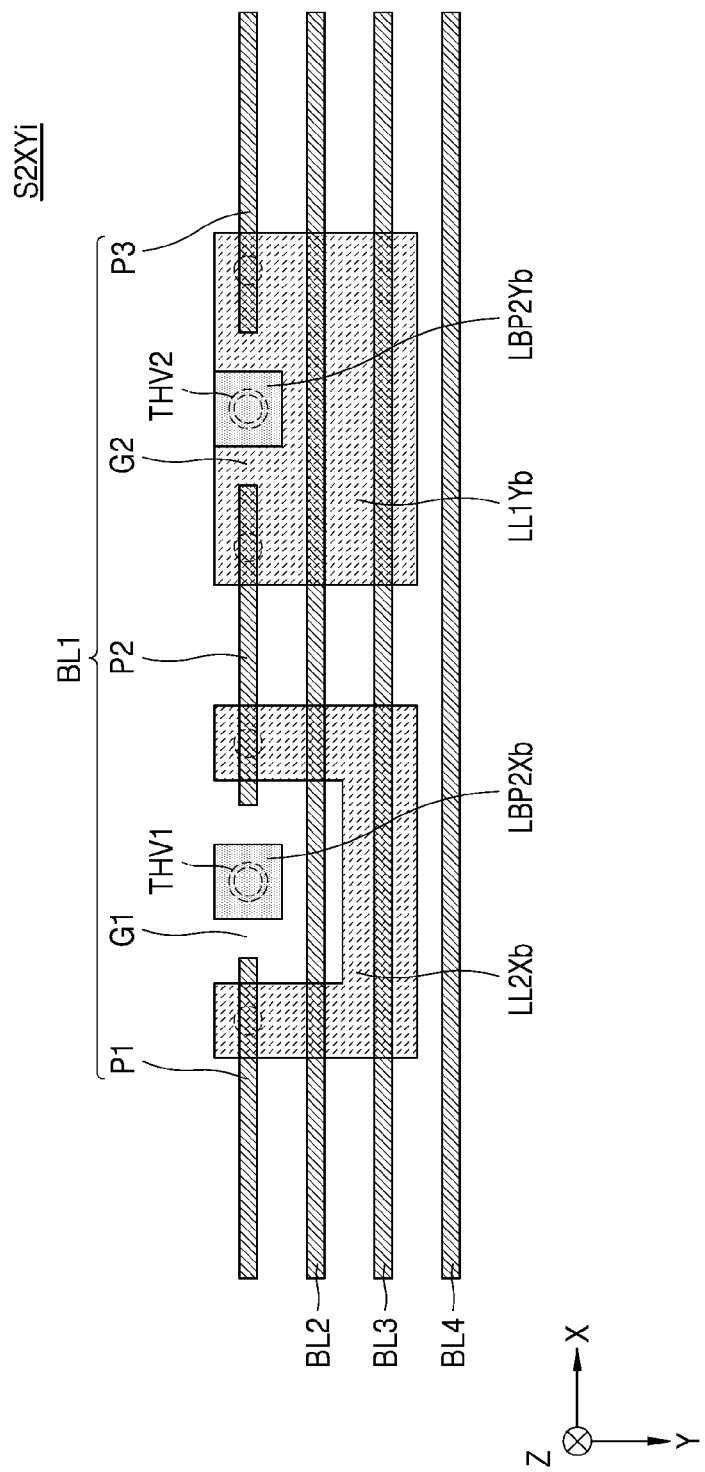
Figure 22A:
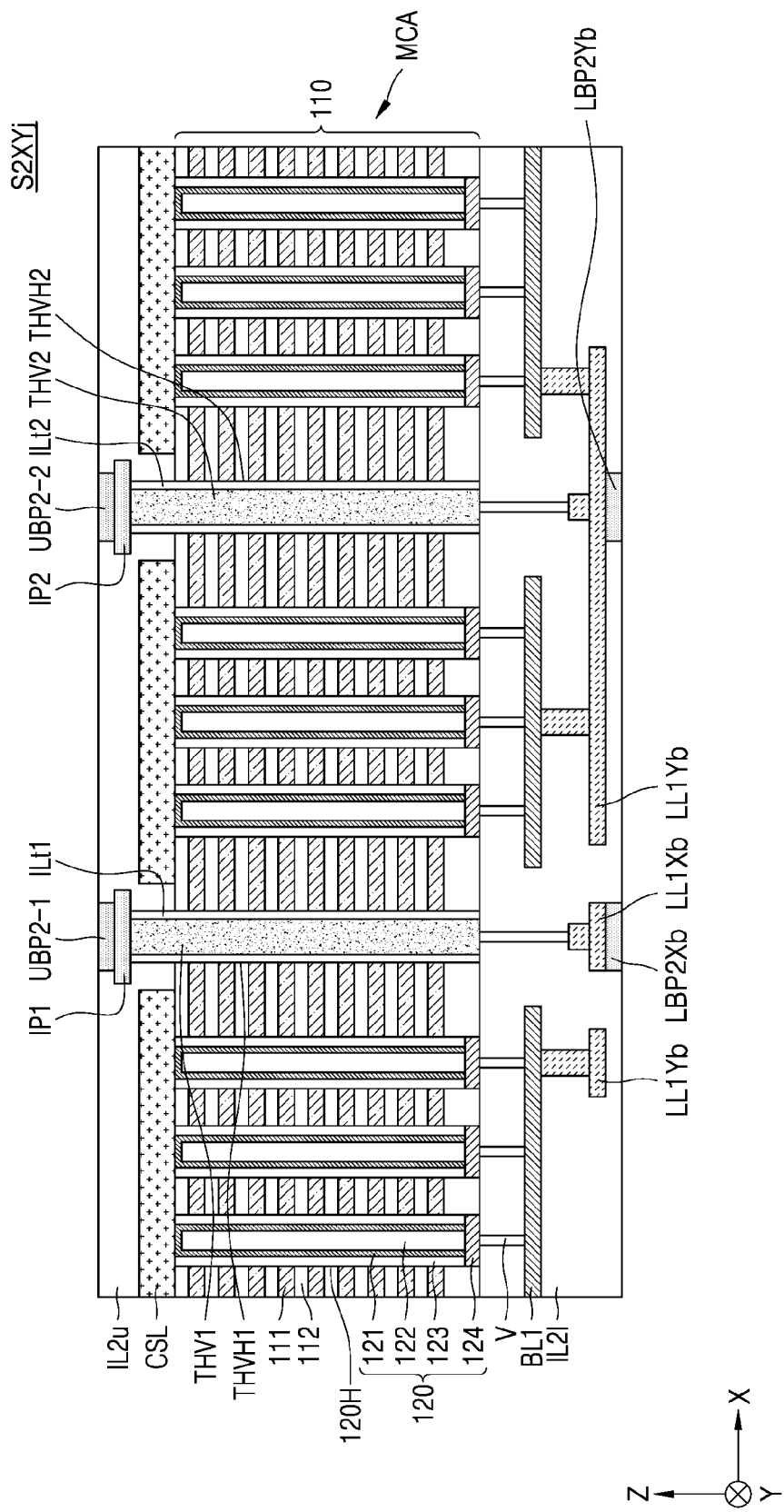
FIGS. 22A and 22B illustrate a cross-sectional view and a plan view of an upper structure included in a memory device according to embodiments of the inventive concepts.
Figure 22B:
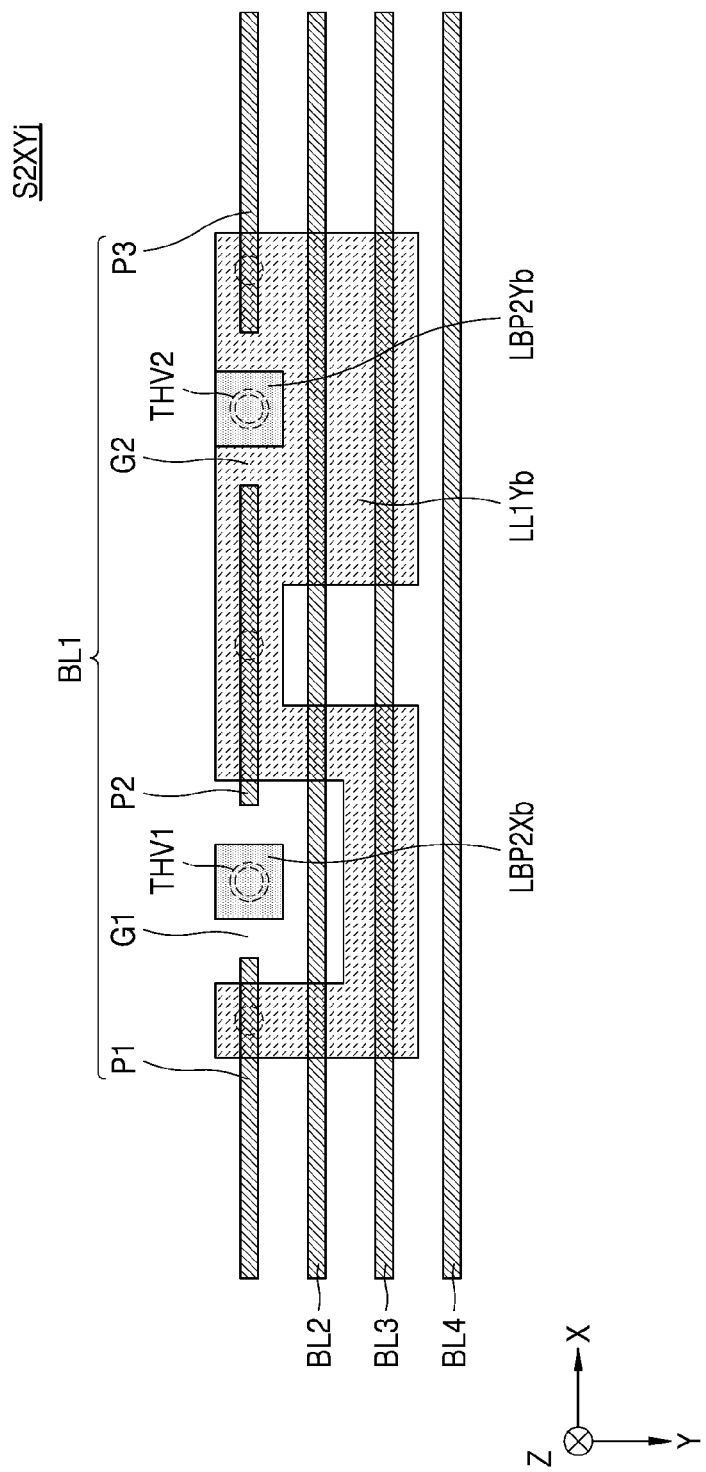
Figure 23:
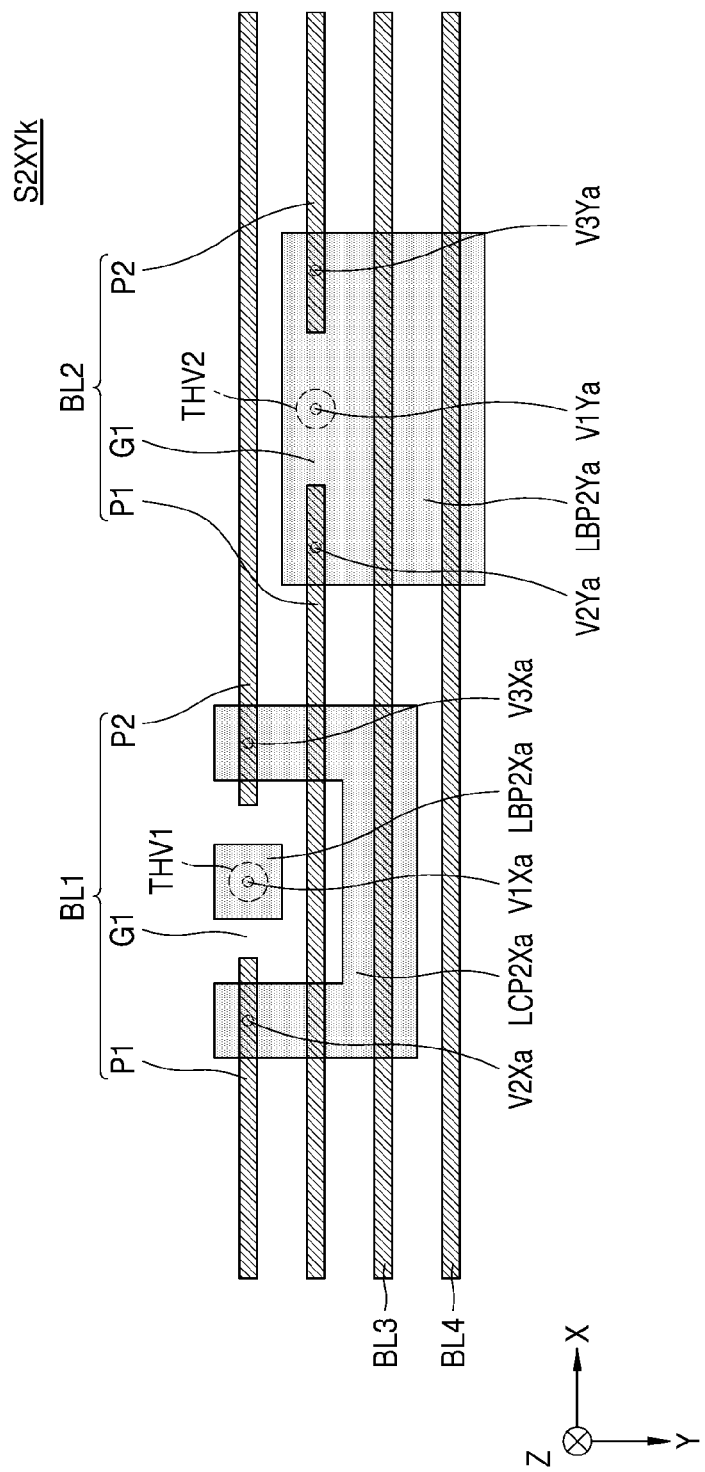
FIG. 23 illustrates a plan view of an upper structure included in a memory device according to embodiments of the inventive concepts.
Figure 24:
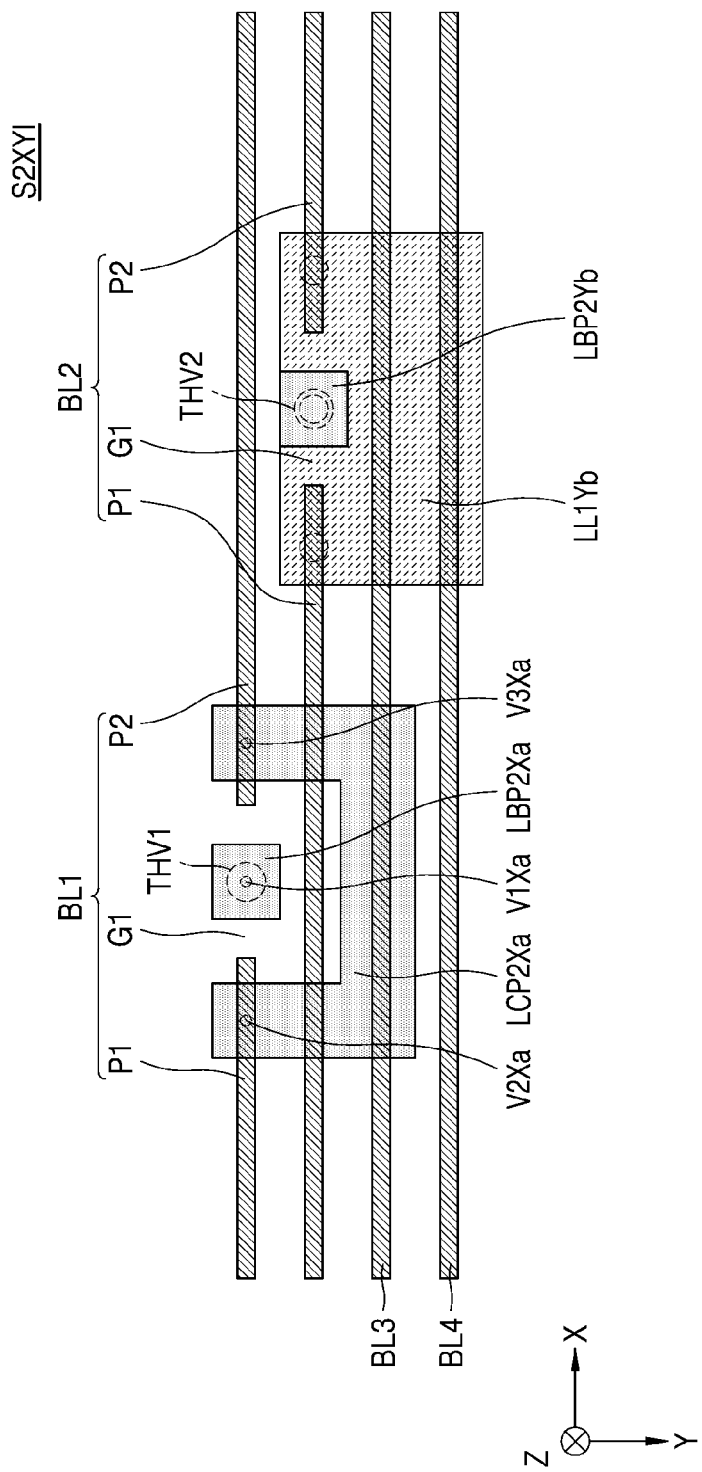
FIG. 24 illustrates a plan view of an upper structure included in a memory device according to embodiments of the inventive concepts.
Figure 25:
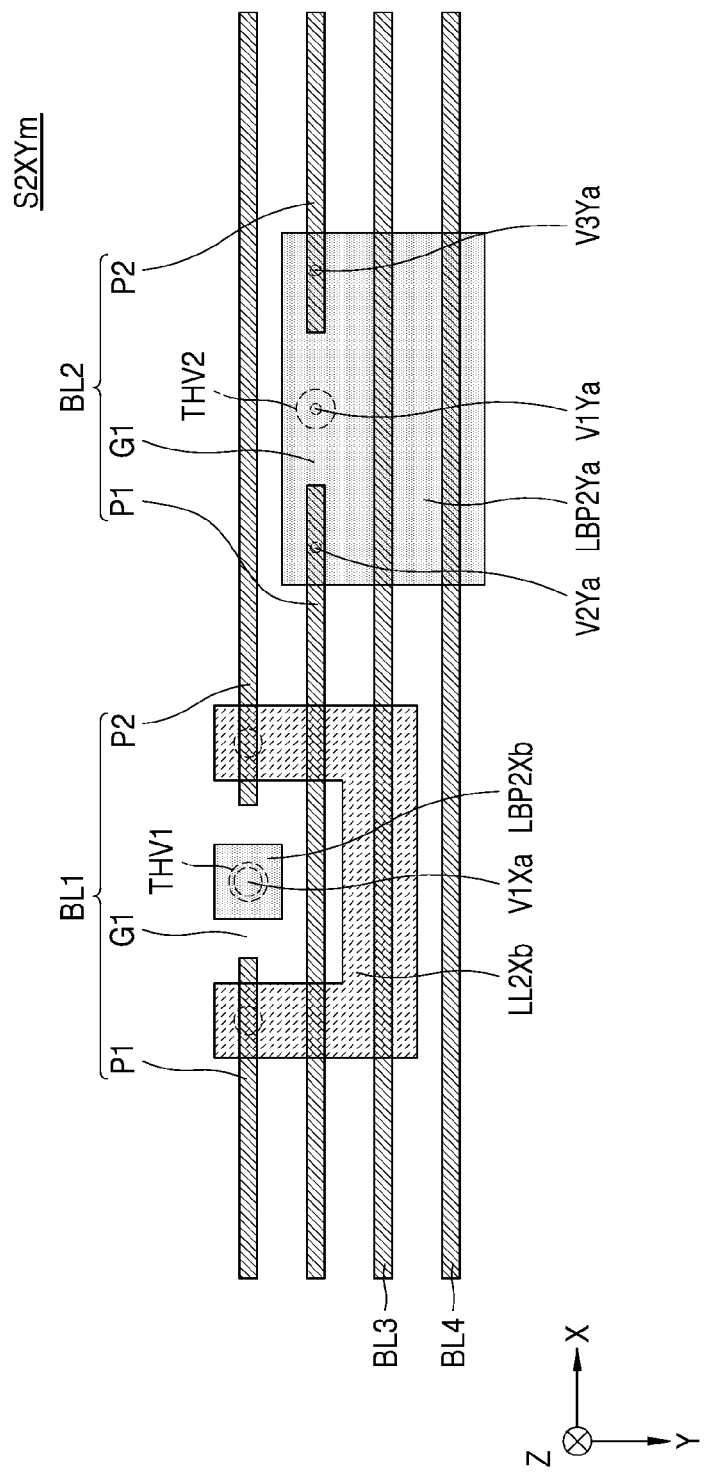
FIG. 25 illustrates a plan view of an upper structure included in a memory device according to embodiments of the inventive concepts.
Figure 26:
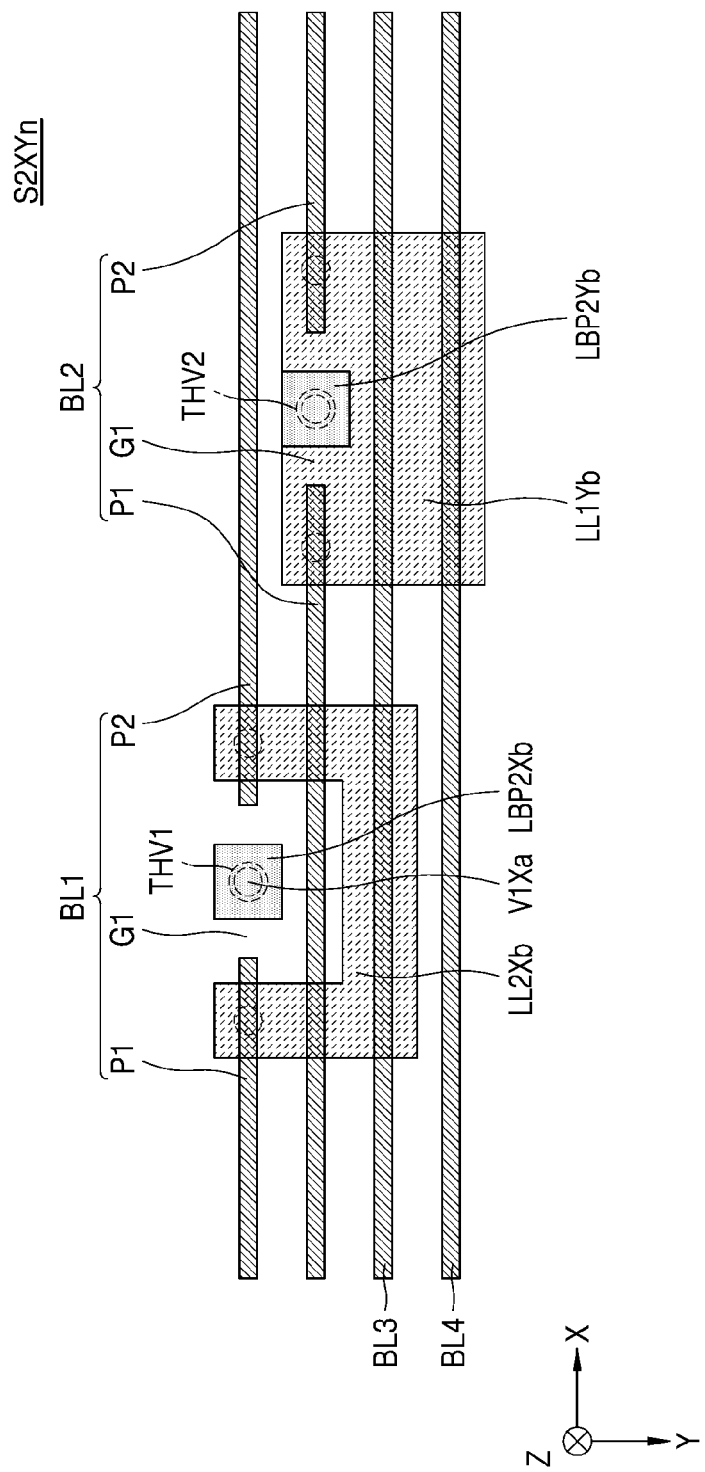
FIG. 26 illustrates a plan view of an upper structure included in a memory device according to embodiments of the inventive concepts.
Figure 27:
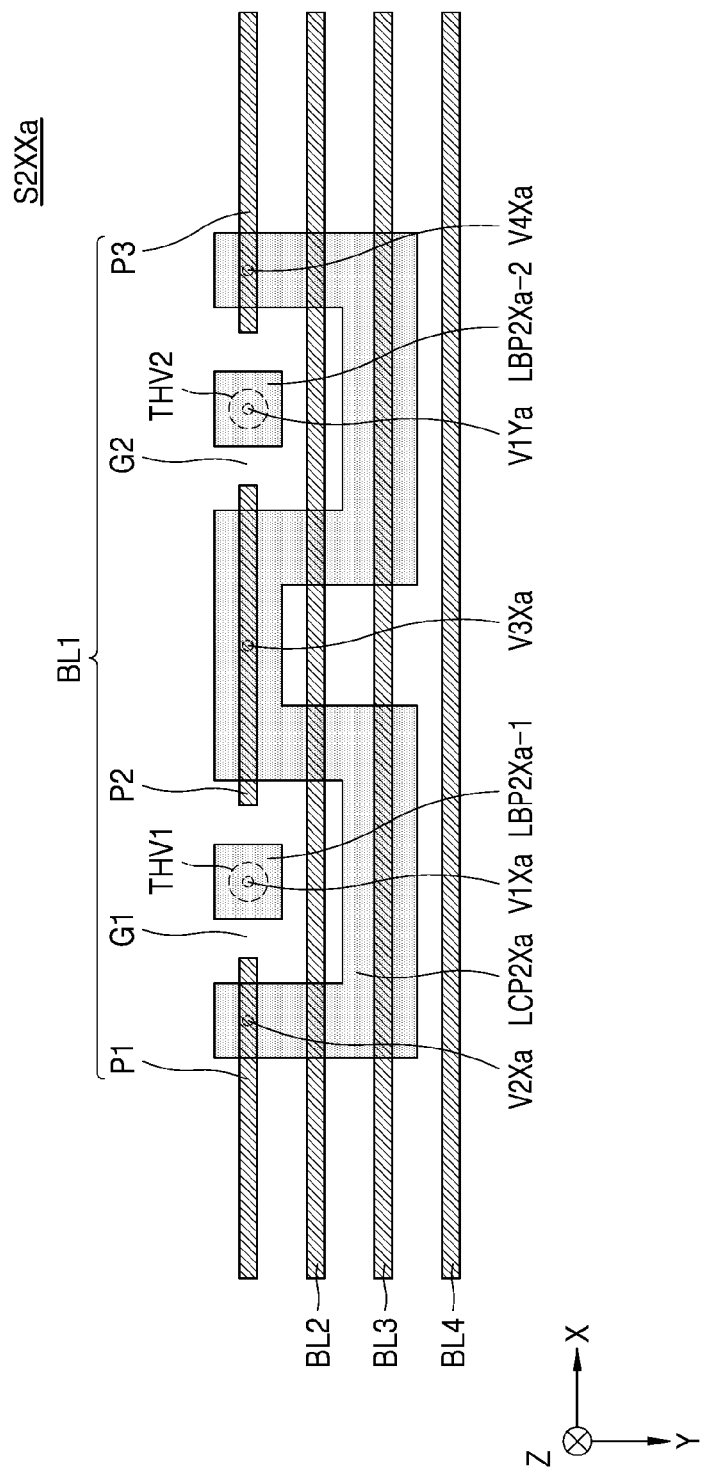
FIG. 27 illustrates a plan view of an upper structure included in a memory device according to embodiments of the inventive concepts.
Figure 28:
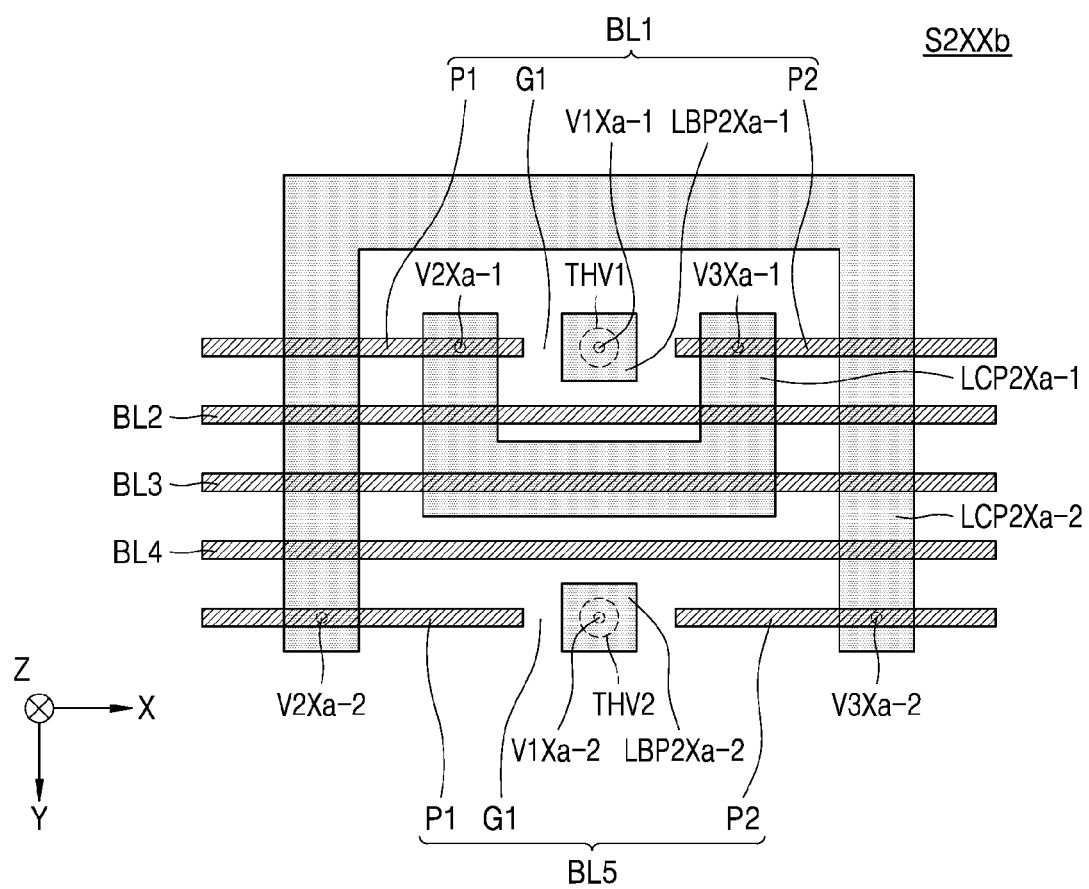
FIG. 28 illustrates a plan view of an upper structure included in a memory device according to embodiments of the inventive concepts.

Each of the upper structures S2 to S5 may include an upper structure S2Xa illustrated in FIGS. 5A and 5B, an upper structure S2Ya illustrated in FIGS. 6A and 6B, an upper structure S2Xb illustrated in FIGS. 7A and 7B, an upper structure S2Yb illustrated in FIGS. 8A and 8B, an upper structure S2XYa illustrated in FIGS. 13A and 13B, an upper structure S2XYb illustrated in FIGS. 14A and 14B, an upper structure S2XYc illustrated in FIGS. 15A and 15B, an upper structure S2XYd illustrated in FIGS. 16A and 16B, an upper structure S2XYe illustrated in FIGS. 17A and 17B, an upper structure S2XYf illustrated in FIGS. 18A and 18B, an upper structure S2XYg illustrated in FIGS. 19A and 19B, an upper structure S2XYh illustrated in FIGS. 20A and 20B, an upper structure S2XYi illustrated in FIGS. 21A and 21B, an upper structure S2XYj illustrated in FIGS. 22A and 22B, an upper structure S2XYk illustrated in FIG. 23, an upper structure S2XYl illustrated in FIG. 24, an upper structure S2XYm illustrated in FIG. 25, an upper structure S2XYn illustrated in FIG. 26, an upper structure S2XXa illustrated in FIG. 27, an upper structure S2XXb illustrated in FIG. 28, or a combination thereof.

FIG. 4 illustrates a cross-sectional view of a lower structure S1$a$ included in a memory device according to embodiments of the inventive concepts.

Referring to FIG. 4, the lower structure S1$a$ may include a peripheral circuit PC and an upper bonding pad UBP1$a$ connected to the peripheral circuit PC. In some embodiments, the peripheral circuit PC may include a substrate SUB, a plurality of active elements such as transistors TR on the substrate SUB, a plurality of passive elements such as capacitors (not shown) or resistors (not shown) on the substrate SUB, and an interconnection ICN connecting the active elements to the passive elements. The lower structure S1$a$ may further include an insulation layer IL1 covering the peripheral circuit PC. The upper bonding pad UBP1$a$ may be disposed on the insulation layer ILE The substrate SUB may include a semiconductor material such as a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenic (GaAs), indium phosphorus (InP), gallium phosphorus (GaP), indium arsenic (InAs), indium antimony (InSb), indium gallium arsenic (InGaAs), or a combination thereof. The Group II-VI semiconductor material may include, for example, zinc telluride (ZnTe), cadmium sulfide (CdS), or a combination thereof. The insulation layer IL1 may include an insulating material such as for example silicon oxide, silicon nitride, or a combination thereof.

FIGS. 5A and 5B illustrate a cross-sectional view and a bottom view of an upper structure S2Xa included in a memory device according to embodiments of the inventive concepts. The cross-sectional view in FIG. 5A is taken along bit line BL1 in the bottom view shown in FIG. 5B, and the bottom view of FIG. 5B shows the bit lines BL1, BL2 and BL3 as overlapping a lower connection pad LCP2Xa.

Referring to FIGS. 5A and 5B, the upper structure S2Xa may include a memory cell array MCA, a common source line CSL on the memory cell array MCA, a plurality of bit lines (for example, first to fourth bit lines) BL1 to BL4 connected to the memory cell array MCA, a lower bonding pad LBP2Xa connected to an upper bonding pad UBP1 on a lower structure S1 (see FIG. 3), and a through via THV connected to the lower bonding pad LBP2Xa.

The memory cell array MCA may include a stacked structure 110 and a plurality of channel structures 120 passing through the stacked structure 110 in a vertical direction (a Z direction). The stacked structure 110 may include a plurality of gate layers 111 stacked in the vertical direction (the Z direction). The stacked structure 110 may further include a plurality of interlayer insulation layers 112 which separate the plurality of gate layers 111 from one another. The plurality of gate layers 111 and the plurality of interlayer insulation layers 112 may be alternately stacked in the vertical direction (the Z direction).

Each of the channel structures 120 may be formed in a channel hole 120H that passes through the stacked structure 110 in the vertical direction (the Z direction). The channel structures 120 may each include a channel layer 121 on a top surface and a side surface of the channel hole 120H and a pad 124 on a bottom surface of the channel hole 120H. The channel layer 121 and the pad 124 may include a semiconductor material. In some embodiments, each of the channel structures 120 may further include a gate insulation layer 123 between the side surface of the channel hole 120H and the channel layer 121. In some embodiments, the gate insulation layer 123 may include a blocking insulation layer, a charge storage layer, and a tunnel insulation layer, and for example, may include an oxide layer, a nitride layer, and an oxide layer. In some embodiments, the channel hole 120H may further include a filling insulation layer 122 which fills an empty space defined by the channel layer 121. In other embodiments, the channel hole 120H may have a cylindrical shape and may not include the filling insulation layer 122.

The common source line CSL may be disposed on the stacked structure 110. The common source line CSL may contact the channel layer 121 of each of the channel structures 120. The common source line CSL may include a semiconductor material. In some embodiments, the upper structure S2Xa may include an upper insulation layer IL2$u$ on the common source line CSL.

The bit lines BL1 to BL4 may be disposed under the stacked structure 110. The bit lines BL1 to BL4 may be connected to the plurality of channel structures 120. The bit lines BL1 to BL4 may extend in an X direction and may be apart from one another in a Y direction. The first bit line BL1 may include a first portion P1 extending in a horizontal direction (the X direction), a second portion P2 extending in the horizontal direction (the X direction), and a first gap G1 which separates the first portion P1 from the second portion P2 in the horizontal direction (the X direction).

In some embodiments, the upper structure S2Xa may further include a plurality of vias V which connect the channel structures 120 to the bit lines BL1 to BL4. The vias V may include a conductive material. In some embodiments, the upper structure S2Xa may further include a lower insulation layer IL21 under the stacked structure 110. The lower bonding pad LBP2Xa may be disposed under the lower insulation layer IL21. The lower bonding pad LBP2Xa may be connected to the through via THV, but as in the case shown in FIGS. 5A and 5B, is not connected to the first portion P1 and the second portion P2 of the first bit line BL1.

In some embodiments, the through via THV may pass through the memory cell array MCA. In detail, the through via THV may pass through the stacked structure 110 in a vertical direction (a Z direction). The through via THV may further pass through the common source line CSL. The through via THV may further pass through the upper insulation layer IL2u. The through via THV may include a conductive material. The through via THV may be disposed in a through via hole THVH. In some embodiments, the upper structure S2Xa may further include a through via insulation layer ILt between a side surface of the through via hole THVH and the through via THV. In some embodiments, in a plan view, the through via THV may overlap the first gap G1 of the first bit line BL1.

In some embodiments, the upper structure S2Xa may further include an upper bonding pad UBP2 connected to the through via THV. The upper bonding pad UBP2 may be disposed on an upper end of the through via THV. In some embodiments, the upper structure S2Xa may further include an internal pad IP which connects the through via THV to the upper bonding pad UBP2. The internal pad IP may include a conductive material.

In some embodiments, the upper structure S2Xa may further include a lower connection pad LCP2Xa which connects the first portion P1 of the first bit line BL1 to the second portion P2 of the first bit line BL1. The lower connection pad LCP2Xa may have an arbitrary shape for connecting the first portion P1 of the first bit line BL1 to the second portion P2 of the first bit line BL1. The lower connection pad LCP2Xa may be disposed on a bottom surface of the upper structure S2Xa. A bottom surface of the lower connection pad LCP2Xa may be disposed along the same plane as a bottom surface of the lower bonding pad LBP2Xa. The lower bonding pad LBP2Xa may include a conductive material. The lower connection pad LCP2Xa may include substantially the same material as that of the lower bonding pad LBP2Xa. Herein, that two elements include substantially the same material may denote or mean that a composition difference between the two elements is within a composition difference between the two elements which occurs due to a process limitation when the two elements are simultaneously formed of the same source material by the same equipment.

In some embodiments, the upper structure S2Xa may further include a first via V1Xa which connects the lower bonding pad LBP2Xa to the through via THV. In some embodiments, the upper structure S2Xa may further include a second via V2Xa, which connects the lower connection pad LCP2Xa to the first portion P1 of the first bit line BL1, and a third via V3Xa which connects the lower connection pad LCP2Xa to the second portion P2 of the first bit line BL1. The first, second, and third vias V1Xa, V2Xa, and V3Xa may include a conductive material.

In the bottom view of FIG. 5B, the bit lines BL1-BL4, the lower connection pad LCP2Xa and the lower bonding pad LBP2Xa are shown while other features of the structure are omitted so as to simplify the drawings. In the following figures, certain features of the structures have similarly been omitted from the bottom views so as to simplify the drawings.

FIGS. 6A and 6B illustrate a cross-sectional view and a bottom view of an upper structure S2Ya included in a memory device according to embodiments of the inventive concepts. The cross-sectional view in FIG. 6A is taken along bit line BL1 in the bottom view shown in FIG. 6B, and the bottom view of FIG. 6B shows the bit lines BL1, BL2 and BL3 as overlapping a lower bonding pad LBP2Ya. Upper structure S2Ya in FIGS. 6A and 6B is similar to upper structure S2Xa shown in FIGS. 5A and 5B, and the following description will focus mainly on differences therebetween while omitting description of like elements and structure.

Referring to FIGS. 6A and 6B, compared with the upper structure S2Xa illustrated in FIGS. 5A and 5B, a lower bonding pad LBP2Ya may be connected to a first portion P1 and a second portion P2 of a first bit line BL1 as well as a through via THV. The lower bonding pad LBP2Ya may have an arbitrary shape for connecting the through via THV to the first portion P1 and the second portion P2 of the first bit line BL1. In some embodiments, the upper structure S2Ya may include a first via V1Ya connecting the lower bonding pad LBP2Ya to the through via THV, a second via V2Ya connecting the lower bonding pad LBP2Ya to the first portion P1 of the first bit line BL1, and a third via V3Ya connecting the lower bonding pad LBP2Ya to the second portion P2 of the first bit line BL1.

FIGS. 7A and 7B illustrate a cross-sectional view and a bottom view of an upper structure S2Xb included in a memory device according to embodiments of the inventive concepts. The cross-sectional view in FIG. 7A is taken along bit line BL1 in the bottom view shown in FIG. 7B, and the bottom view of FIG. 7B shows the bit lines BL1, BL2 and BL3 as overlapping a second lower line LL2Xb. Upper structure S2Xb in FIGS. 7A and 7B is similar to upper structure S2Xa shown in FIGS. 5A and 5B, and the following description will focus mainly on differences therebetween while omitting description of like elements and structure.

Referring to FIGS. 7A and 7B, compared with the upper structure S2Xa illustrated in FIGS. 5A and 5B, the upper structure S2Xb may include a first lower line LL1Xb which connects a lower bonding pad LBP2Xb to a through via THV. The upper structure S2Xb may further include a second lower line LL2Xb which connects the first portion P1 of the first bit line BL1 to the second portion P2 of the first bit line BL1. The second lower line LL2Xb is not connected to the lower bonding pad LBP2Xb. The second lower line LL2Xb may have an arbitrary shape for connecting the first portion P1 of the first bit line BL1 to the second portion P2 of the first bit line BL1. A bottom surface of the first lower line LL1Xb may be disposed on the same plane as a bottom surface of the second lower line LL2Xb. The first lower line LL1Xb and the second lower line LL2Xb may include a conductive material. The first lower line LL1Xb may include substantially the same material as that of the second lower line LL2Xb.

FIGS. 8A and 8B illustrate a cross-sectional view and a bottom view of an upper structure S2Yb included in a memory device according to embodiments of the inventive concepts. The cross-sectional view in FIG. 8A is taken along bit line BL1 in the bottom view shown in FIG. 8B, and the bottom view of FIG. 8B shows the bit lines BL1, BL2 and BL3 as overlapping a lower line LL1Yb. Upper structure S2Yb in FIGS. 8A and 8B is similar to upper structure S2Ya shown in FIGS. 6A and 6B, and the following description will focus mainly on differences therebetween while omitting description of like elements and structure.

Referring to FIGS. 8A and 8B, compared with the upper structure S2Ya illustrated in FIGS. 6A and 6B, the upper structure S2Yb may further include a lower line LL1Yb which connects a through via THV, a first portion P1 and a second portion P2 of a first bit line BL1 to a lower bonding pad LBP2Yb. The lower line LL1Yb may have an arbitrary shape for connecting the lower bonding pad LBP2Yb to the through via THV and the first portion P1 and the second portion P2 of the first bit line BL1. The lower line LL1Yb may include a conductive material.

FIGS. 9A and 9B illustrate a cross-sectional view and a plan view of a lower structure S1Xb included in a memory device according to embodiments of the inventive concepts. The cross-sectional view in FIG. 9A is taken along bit line BL1 in the plan view shown in FIG. 9B, and the plan view of FIG. 9B shows an upper connection pad UCP1Xb as overlapping the bit lines BL1, BL2 and BL3. Lower structure S1Xb in FIGS. 9A and 9B is similar to lower structure S1a shown in FIG. 4, and description of like elements and structure will be omitted from the following.

Referring to FIGS. 9A and 9B, compared with the lower structure S1a illustrated in FIG. 4, a lower structure S1Xb may include a common source line CSL on an insulation layer IL1 on a peripheral circuit PC, a memory cell array MCA on the common source line CSL, a plurality of bit lines (for example, first to fourth bit lines) BL1 to BL4 connected to the memory cell array MCA, and a through via THV connecting an upper bonding pad UBP1Xb to the peripheral circuit PC.

The memory cell array MCA may include a stacked structure 110 and a plurality of channel structures 120 which each pass through the stacked structure 110 in a vertical direction (a Z direction). The stacked structure 110 may include a plurality of gate layers 111 which are stacked on the peripheral circuit PC in the vertical direction (the Z direction). The stacked structure 110 may further include a plurality of interlayer insulation layers 112 which separate the plurality of gate layers 111 from one another. The plurality of gate layers 111 and the plurality of interlayer insulation layers 112 may be alternately stacked in the vertical direction (the Z direction). The channel structure 120 may include a channel layer 121 on a bottom surface and a side surface of the channel hole 120H and a pad 124 on a top surface of the channel hole 120H. The channel layer 121 of the channel structure 120 may contact the common source line CSL.

The bit lines BL1 to BL4 may be disposed on the stacked structure 110 and may be connected to the plurality of channel structures 120. The first bit line BL1 may include a first portion P1 extending in a horizontal direction (the X direction), a second portion P2 extending in the horizontal direction (the X direction), and a first gap G1 which separates the first portion P1 from the second portion P2 in the horizontal direction (the X direction). In some embodiments, the lower structure S1Xb may further include a plurality of vias V which connect the channel structures 120 to the bit lines BL1 to BL4.

In some embodiments, the lower structure S1Xb may include an upper insulation layer IL1u on the stacked structure 110. The upper bonding pad UBP1Xb may be disposed on the upper insulation layer IL1u. The upper bonding pad UBP1Xb may be connected to the through via THV, but in this case as shown in FIGS. 9A and 9B is not connected to the first portion P1 and the second portion P2 of the first bit line BL1.

In some embodiments, the through via THV may pass through the memory cell array MCA. In detail, the through via THV may pass through the stacked structure 110 in the vertical direction (the Z direction). The through via THV may further pass through the common source line CSL. The through via THV may further pass through the insulation layer IL1. The through via THV may be disposed in a through via hole THVH. In some embodiments, the lower structure S1Xb may further include a through via insulation layer ILt between a side surface of the through via hole THVH and the through via THV. In some embodiments, in a plan view, the through via THV may overlap the first gap G1 of the first bit line BL1.

In some embodiments, the lower structure S1Xb may further include an upper connection pad UCP1Xb which connects the first portion P1 of the first bit line BL1 to the second portion P2 of the first bit line BL1. The upper connection pad UCP1Xb may have an arbitrary shape for connecting the first portion P1 of the first bit line BL1 to the second portion P2 of the first bit line BL1. The upper connection pad UCP1Xb may be disposed on a top surface of the lower structure S1Xb. A top surface of the upper connection pad UCP1Xb may be disposed on the same plane as a top surface of the upper bonding pad UBP1Xb. The upper connection pad UCP1Xb may include a conductive material. The upper connection pad UCP1Xb may include substantially the same material as that of the upper bonding pad UBP1Xb.

In some embodiments, the lower structure S1Xb may further include a first via V1Xb which connects the upper bonding pad UBP1Xb to the through via THV. In some embodiments, the lower structure S1Xb may further include a second via V2Xb, which connects the upper connection pad UCP1Xb to the first portion P1 of the first bit line BL1, and a third via V3Xb which connects the upper connection pad UCP1Xb to the second portion P2 of the first bit line BL1. The first, second, and third vias V1Xb, V2Xb, and V3Xb may include a conductive material.

FIGS. 10A and 10B illustrate a cross-sectional view and a plan view of a lower structure S1Yb included in a memory device according to embodiments of the inventive concepts. The cross-sectional view in FIG. 10A is taken along bit line BL1 in the plan view shown in FIG. 10B, and the plan view of FIG. 10B shows an upper bonding pad UBP1Yb as overlapping the bit lines BL1, BL2 and BL3. Lower structure S1Yb in FIGS. 10A and 10B is similar to lower structure S1Xb shown in FIGS. 9A and 9B, and the following description will focus mainly on differences therebetween while omitting description of like elements and structure.

Referring to FIGS. 10A and 10B, compared with the lower structure S1Xb illustrated in FIGS. 9A and 9B, an upper bonding pad UBP1Yb may be connected to a first portion P1 and a second portion P2 of a first bit line BL1 as well as a through via THV. The upper bonding pad UBP1Yb may have an arbitrary shape for connecting the through via THV to the first portion P1 and the second portion P2 of the first bit line BL1. In some embodiments, the lower structure S1Yb may include a first via Y1Yb connecting the upper bonding pad UBP1Yb to the through via THV, a second via V2Yb connecting the upper bonding pad UBP1Yb to the first portion P1 of the first bit line BL1, and a third via V3Yb connecting the upper bonding pad UBP1Yb to the second portion P2 of the first bit line BL1.

FIGS. 11A and 11B illustrate a cross-sectional view and a plan view of a lower structure S1Xc included in a memory device according to embodiments of the inventive concepts. The cross-sectional view in FIG. 11A is taken along bit line BL1 in the plan view shown in FIG. 11B, and the plan view of FIG. 11B shows a second upper line UL2Xc as overlapping the bit lines BL1, BL2 and BL3. Lower structure S1Xc in FIGS. 11A and 11B is similar to lower structure S1Xb shown in FIGS. 9A and 9B, and the following description will focus mainly on differences therebetween while omitting description of like elements and structure.

Referring to FIGS. 11A and 11B, compared with the lower structure S1Xb illustrated in FIGS. 9A and 9B, the lower structure S1Xc may include a first upper line UL1Xc which connects an upper bonding pad UBP1Xc to a through via THV. The lower structure S1Xc may further include a second upper line UL2Xc which connects a first portion P1 of a first bit line BL1 to a second portion P2 of the first bit line BL1. In this case as shown, the second upper line UL2Xc is not connected to the upper bonding pad UBP1Xc. The second upper line UL2Xc may have an arbitrary shape for connecting the first portion P1 of the first bit line BL1 to the second portion P2 of the first bit line BL1. A top surface of the first upper line UL1Xc may be disposed on the same plane as a top surface of the second upper line UL2Xc. The first upper line UL1Xc and the second upper line UL2Xc may include a conductive material. The first upper line UL1Xc may include substantially the same material as that of the second upper line UL2Xc.

FIGS. 12A and 12B illustrate a cross-sectional view and a plan view of a lower structure S1Yc included in a memory device according to embodiments of the inventive concepts. The cross-sectional view in FIG. 12A is taken along bit line BL1 in the plan view shown in FIG. 12B, and the plan view of FIG. 12B shows an upper line UL1Yc as overlapping the bit lines BL1, BL2 and BL3. Lower structure S1Yc in FIGS. 12A and 12B is similar to lower structure S1Yb shown in FIGS. 10A and 10B, and the following description will focus mainly on differences therebetween while omitting description of like elements and structure.

Referring to FIGS. 12A and 12B, compared with the lower structure S1Yb illustrated in FIGS. 10A and 10B, the lower structure S1Yc may further include a through via THV and an upper line UL1Yc which connects a first portion P1 and a second portion P2 of a first bit line BL1 to an upper bonding pad UBP1Yc. The upper line UL1Yc may have an arbitrary shape for connecting the upper bonding pad UBP1Yc to the through via THV and the first portion P1 and the second portion P2 of the first bit line BL1. The upper line UL1Yc may include a conductive material.

FIGS. 13A and 13B illustrate a cross-sectional view and a bottom view of an upper structure S2XYa included in a memory device according to embodiments of the inventive concepts. The cross-sectional view in FIG. 13A is taken along bit line BL1 in the bottom view shown in FIG. 13B, and the bottom view of FIG. 13B shows the bit lines BL1, BL2 and BL3 as overlapping a first lower connection pad LCP2Xa and a second lower bonding pad LBP2Ya. Upper structure S2XYa in FIGS. 13A and 13B is similar to upper structures S2Xa and S2Ya respectively shown in FIGS. 5A and 5B and FIGS. 6A and 6B, and the following description will focus mainly on differences therebetween while omitting description of like elements and structure.

Referring to FIGS. 13A and 13B, the upper structure S2XYa may include a first lower bonding pad LBP2Xa connected to a first upper bonding pad UBP1 (see FIG. 3) of a lower structure S1 (see FIG. 3), a first through via THV1 connected to the first lower bonding pad LBP2Xa, a first upper bonding pad UBP2-1 connected to the first through via THV1, a second lower bonding pad LBP2Ya connected to a second upper bonding pad UBP1 (see FIG. 3) of the lower structure S1 (see FIG. 3), a first bit line BL1 connected to a second lower bonding pad LBP2Ya, and a memory cell array MCA connected to the first bit line BL1. In some embodiments, the upper structure S2XYa may include a combination of the upper structure S2Xa illustrated in FIGS. 5A and 5B and the upper structure S2Ya illustrated in FIGS. 6A and 6B.

The first lower bonding pad LBP2Xa and the second lower bonding pad LBP2Ya may be disposed on a bottom surface of the upper structure S2XYa. The first bit line BL1 may include a first portion P1, a second portion P2, and a first gap G1 between the first portion P1 and the second portion P2. The first lower bonding pad LBP2Xa is not connected to the first portion P1 and the second portion P2 of the first bit line BL1. The first upper bonding pad UBP2-1 may be disposed at an upper end of the first through via THV1. In some embodiments, the upper structure S2XYa may further include a first internal pad IP1 which connects the first through via THV1 to the first upper bonding pad UBP2-1.

In some embodiments, the first through via THV1 may pass through the memory cell array MCA. In detail, the first through via THV1 may pass through the stacked structure 110 in a vertical direction (a Z direction). The first through via THV1 may be disposed in a first through via hole THVH1. In some embodiments, the upper structure S2XYa may further include a first through via insulation layer ILt1 between a side surface of the first through via hole THVH1 and the first through via THV1. In some embodiments, in a plan view, the first through via THV1 may overlap the first gap G1 of the first bit line BL1.

In some embodiments, the upper structure S2XYa may further include a first lower connection pad LCP2Xa which connects the first portion P1 of the first bit line BL1 to the second portion P2 of the first bit line BL1. The first lower connection pad LCP2Xa is not connected to the first lower bonding pad LBP2Xa. In some embodiments, the upper structure S2XYa may further include a first via V1Xa connecting the first lower bonding pad LBP2Xa to the first through via THV1, a second via V2Xa connecting the first lower connection pad LCP2Xa to the first portion P1 of the first bit line BL1, and a third via V3Xa connecting the first lower connection pad LCP2Xa to the second portion P2 of the first bit line BL1.

In some embodiments, the upper structure S2XYa may further include a second through via THV2 connected to the second lower bonding pad LBP2Ya and a second upper bonding pad UBP2-2 connected to the second through via THV2. That is, the second through via THV2 as well as the first bit line BL1 may be connected to the second lower bonding pad LBP2Ya. In some embodiments, the upper structure S2XYa may further include a second internal pad IP2 connecting the second through via THV2 to the second upper bonding pad UBP2-2.

In some embodiments, the first bit line BL1 may further include a third portion P3 and a second gap G2 between the second portion P2 and the third portion P3 of the first bit line BL1. The second lower bonding pad LBP2Ya may be connected to the second portion P2 and the third portion P3 of the first bit line BL1. In some embodiments, the upper structure S2XYa may further include a fourth via V1Ya connecting the second lower bonding pad LBP2Ya to the second through via THV2, a fifth via V2Ya connecting the second lower bonding pad LBP2Ya to the second portion P2 of the first bit line BL1, and a sixth via V3Ya connecting the second lower bonding pad LBP2Ya to the third portion P3 of the first bit line BL1.

In some embodiments, the second through via THV2 may pass through the memory cell array MCA. In detail, the second through via THV2 may pass through the stacked structure 110 in a vertical direction (a Z direction). The second through via THV2 may be disposed in a second through via hole THVH2. In some embodiments, the upper structure S2XYa may further include a second through via insulation layer ILt2 between a side surface of the second through via hole THVH2 and the second through via THV2. In some embodiments, in a plan view, the second through via THV2 may overlap the second gap G2 of the first bit line BL1.

FIGS. 14A and 14B illustrate a cross-sectional view and a bottom view of an upper structure S2XYb included in a memory device according to embodiments of the inventive concepts. The cross-sectional view in FIG. 14A is taken along bit line BL1 in the bottom view shown in FIG. 14B, and the bottom view of FIG. 14B shows the bit lines BL1, BL2 and BL3 as overlapping a second lower bonding pad LBP2Ya. Upper structure S2XYb in FIGS. 14A and 14B is similar to upper structure S2XYa shown in FIGS. 13A and 13B, and the following description will focus mainly on differences therebetween while omitting description of like elements and structure.

Referring to FIGS. 14A and 14B, compared with the upper structure S2XYa illustrated in FIGS. 13A and 13B, a second lower bonding pad LBP2Ya may be connected to a first portion P1 of a first bit line BL1 as well as a second through via THV2 and a second portion P2 and a third portion P3 of the first bit line BL1. In some embodiments, the upper structure S2XYb may include a first via V1Ya connecting the second lower bonding pad LBP2Ya to the second through via THV2, a second via V2Ya connecting the second lower bonding pad LBP2Ya to the second portion P2 of the first bit line BL1, a third via V3Ya connecting the second lower bonding pad LBP2Ya to the third portion P3 of the first bit line BL1, a fourth via V4Ya connecting the second lower bonding pad LBP2Ya to the first portion P1 of the first bit line BL1, and a fifth via V1Xa connecting a first lower bonding pad LBP2Xa to a first through via THV1.

FIGS. 15A and 15B illustrate a cross-sectional view and a bottom view of an upper structure S2XYc included in a memory device according to embodiments of the inventive concepts. The cross-sectional view in FIG. 15A is taken along bit line BL1 in the bottom view shown in FIG. 15B, and the bottom view of FIG. 15B shows the bit lines BL1, BL2 and BL3 as overlapping a first lower connection pad LCP2Xa and a lower line LL1Yb. Upper structure S2XYc in FIGS. 15A and 15B is similar to upper structure S2XYa shown in FIGS. 13A and 13B, and the following description will focus mainly on differences therebetween while omitting description of like elements and structure.

Referring to FIGS. 15A and 15B, compared with the upper structure S2XYa illustrated in FIGS. 13A and 13B, the upper structure S2XYc may further include a second through via THV2 and a lower line LL1Yb which connects a second portion P2 and a third portion P3 of a first bit line BL1 to a second lower bonding pad LBP2Yb. In some embodiments, the upper structure S2XYc may include a combination of the upper structure S2Xa illustrated in FIGS. 5A and 5B and the upper structure S2Yb illustrated in FIGS. 8A and 8B.

FIGS. 16A and 16B illustrate a cross-sectional view and a bottom view of an upper structure included in a memory device according to embodiments of the inventive concepts. The cross-sectional view in FIG. 16A is taken along bit line BL1 in the bottom view shown in FIG. 16B, and the bottom view of FIG. 16B shows the bit lines BL1, BL2 and BL3 as overlapping a second lower bonding pad LBP2Yb and a lower line LL1Yb. Upper structure S2XYd in FIGS. 16A and 16B is similar to upper structure S2XYc shown in FIGS. 15A and 15B, and the following description will focus mainly on differences therebetween while omitting description of like elements and structure.

Referring to FIGS. 16A and 16B, compared with the upper structure S2XYc illustrated in FIGS. 15A and 15B, a second lower bonding pad LBP2Yb may be connected to a first portion P1 of a first bit line BL1 as well as a lower line LL1Yb. In some embodiments, the upper structure S2XYd may include a first via V1Xa connecting a first bonding pad LBP2Xa to a first through via THV1 and a second via V4Xa connecting the second lower bonding pad LBP2Yb to the first portion P1 of the first bit line BL1.

FIGS. 17A and 17B illustrate a cross-sectional view and a bottom view of an upper structure S2XYe included in a memory device according to embodiments of the inventive concepts. The cross-sectional view in FIG. 17A is taken along bit line BL1 in the bottom view shown in FIG. 17B, and the bottom view of FIG. 17B shows the bit lines BL1, BL2 and BL3 as overlapping a second lower bonding pad LBP2Yb and a lower line LL1Yb. Upper structure S2XYe in FIGS. 17A and 17B is similar to upper structure S2XYc shown in FIGS. 15A and 15B, and the following description will focus mainly on differences therebetween while omitting description of like elements and structure.

Referring to FIGS. 17A and 17B, compared with the upper structure S2XYc illustrated in FIGS. 15A and 15B, a lower line LL1Yb may connect a second through via THV2 and a third portion P3 of a first bit line BL1 to a second lower bonding pad LBP2Yb. A second lower bonding pad LBP2Yb may be connected to a first portion P1 of the first bit line BL1 as well as the lower line LL1Yb. In some embodiments, the upper structure S2XYe may further include a first via V1Xa connecting the first lower bonding pad LBP2Xa to a first through via THV1, a second via V4Xa connecting the second lower bonding pad LBP2Yb to the first portion P1 of the first bit line BL1, and a third via V5Xa connecting the second lower bonding pad LBP2Yb to the second portion P2 of the first bit line BL1.

FIGS. 18A and 18B illustrate a cross-sectional view and a bottom view of an upper structure S2XYf included in a memory device according to embodiments of the inventive concepts. The cross-sectional view in FIG. 18A is taken along bit line BL1 in the bottom view shown in FIG. 18B, and the bottom view of FIG. 18B shows the bit lines BL1, BL2 and BL3 as overlapping a second lower line LL2Xb and a second lower bonding pad LBP2Ya. Upper structure S2XYf in FIGS. 18A and 18B is similar to upper structure S2XYa shown in FIGS. 13A and 13B, and the following description will focus mainly on differences therebetween while omitting description of like elements and structure.

Referring to FIGS. 18A and 18B, compared with the upper structure S2XYa illustrated in FIGS. 13A and 13B, the upper structure S2XYf may further include a first lower line LL1Xb connecting a first lower bonding pad LBP2Xb to a first through via THV1 and a second lower line LL2Xb connecting a first portion P1 of a first bit line BL1 to a second portion P2 of the first bit line BL1. As shown, the second lower line LL2Xb is not connected to the first lower bonding pad LBP2Xb. In some embodiments, the upper structure S2XYf may include a combination of the upper structure S2Xb illustrated in FIGS. 7A and 7B and the upper structure S2Ya illustrated in FIGS. 6A and 6B.

FIGS. 19A and 19B illustrate a cross-sectional view and a bottom view of an upper structure S2XYg included in a memory device according to embodiments of the inventive concepts. The cross-sectional view in FIG. 19A is taken along bit line BL1 in the bottom view shown in FIG. 19B, and the bottom view of FIG. 19B shows the bit lines BL1, BL2 and BL3 as overlapping a second lower line LL2Xb and a second lower bonding pad LBP2Ya. Upper structure S2XYg in FIGS. 19A and 19B is similar to upper structure S2XYf shown in FIGS. 18A and 18B, and the following description will focus mainly on differences therebetween while omitting description of like elements and structure.

Referring to FIGS. 19A and 19B, compared with the upper structure S2XYf illustrated in FIGS. 18A and 18B, a second lower line LL2Xb may be connected to a second lower bonding pad LBP2Ya. The second lower bonding pad LBP2Ya may be connected to a second portion P2 of a first bit line BL1 through the second lower line LL2Xb. The upper structure S2XYg may include a first via V1Ya connecting a second lower bonding pad LBP2Ya to a second through via THV2 and a second via V3Ya connecting a second lower bonding pad LBP2Ya to a third portion P3 of the first bit line BL1.

FIGS. 20A and 20B illustrate a cross-sectional view and a bottom view of an upper structure S2XYh included in a memory device according to embodiments of the inventive concepts. The cross-sectional view in FIG. 20A is taken along bit line BL1 in the bottom view shown in FIG. 20B, and the bottom view of FIG. 20B shows the bit lines BL1, BL2 and BL3 as overlapping a second lower line LL2Xb and a second lower bonding pad LBP2Ya. Upper structure S2XYh in FIGS. 20A and 20B is similar to upper structure S2XYf shown in FIGS. 18A and 18B, and the following description will focus mainly on differences therebetween while omitting description of like elements and structure.

Referring to FIGS. 20A and 20B, compared with the upper structure S2XYf illustrated in FIGS. 18A and 18B, a second lower line LL2Xb may be connected to a first portion P1 of a first bit line BL1 and a second lower bonding pad LBP2Ya. The second lower line LL2Xb may be connected to a second portion P2 of the first bit line BL1 through the second lower bonding pad LBP2Ya.

FIGS. 21A and 21B illustrate a cross-sectional view and a bottom view of an upper structure S2XYi included in a memory device according to embodiments of the inventive concepts. The cross-sectional view in FIG. 21A is taken along bit line BL1 in the bottom view shown in FIG. 21B, and the bottom view of FIG. 21B shows the bit lines BL1, BL2 and BL3 as overlapping a second lower line LL2Xb and a third lower line LL1Yb. Upper structure S2XYi in FIGS. 21A and 21B is similar to upper structure S2XYf shown in FIGS. 18A and 18B, and the following description will focus mainly on differences therebetween while omitting description of like elements and structure.

Referring to FIGS. 21A and 21B, compared with the upper structure S2XYf illustrated in FIGS. 18A and 18B, the upper structure S2XYi may further include a second through via THV2 and a third lower line LL1Yb which connects a second portion P2 and a third portion P3 of a first bit line BL1 to a second lower bonding pad LBP2Yb. In some embodiments, the upper structure S2XYi may include a combination of the upper structure S2Xb illustrated in FIGS. 7A and 7B and the upper structure S2Yb illustrated in FIGS. 8A and 8B.

FIGS. 22A and 22B illustrate a cross-sectional view and a bottom view of an upper structure S2XYj included in a memory device according to embodiments of the inventive concepts. The cross-sectional view in FIG. 22A is taken along bit line BL1 in the bottom view shown in FIG. 22B, and the bottom view of FIG. 22B shows the bit lines BL1, BL2 and BL3 as overlapping a third lower line LL1Yb. Upper structure S2XYj in FIGS. 22A and 22B is similar to upper structure S2XYi shown in FIGS. 21A and 21B, and the following description will focus mainly on differences therebetween while omitting description of like elements and structure.

Referring to FIGS. 22A and 22B, compared with the upper structure S2XYi illustrated in FIGS. 21A and 21B, a third lower line LL1Yb may be connected to a first portion P1 of a first bit line BL1 as well as a second through via THV2 and a second portion P2 and a third portion P3 of the first bit line BL1. That is, the third lower line LL1Yb may connect a second lower bonding pad LBP2Yb to the first portion P1, the second portion P2, and the third portion P3 of the first bit line BL1 and the second through via THV2.

FIG. 23 illustrates a bottom view of an upper structure S2XYk included in a memory device according to embodiments of the inventive concepts.

Referring to FIG. 23, a first bit line BL1 may include a first portion P1, a second portion P2, and a gap G1 between the first portion P1 and the second portion P2. In a plan view, a first through via THV1 may overlap the gap G1 of the first bit line BL1. A first lower bonding pad LBP2Xa may be connected to the first through via THV1. A first lower connection pad LCP2Xa may connect the first portion P1 of the first bit line BL1 to the second portion P2 of the first bit line BL1, and as illustrated first lower connection pad LCP2Xa is not connected to the first lower bonding pad LBP2Xa.

A second bit line BL2 extending in parallel with the first bit line BL1 may include a first portion P1, a second portion P2, and a first gap G1 between the first portion P1 and the second portion P2. In a bottom view, a second through via THV2 may overlap the gap G1 of the second bit line BL2. A second lower bonding pad LBP2Ya may be connected to the second through via THV2 and the first portion P1 and the second portion P2 of the second bit line BL2. Second lower bonding pad LBP2Ya as shown is not connected to the first lower connection pad LCP2Xa.

In some embodiments, the upper structure S2XYk may include a first via V1Xa connecting the first through via THV1 to the first lower bonding pad LBP2Xa, a second via V2Xa connecting the first portion P1 of the first bit line BL1 to the first lower connection pad LCP2Xa, a third via V3Xa connecting the second portion P2 of the first bit line BL1 to the first lower connection pad LCP2Xa, a fourth via V1Ya connecting the second through via THV2 to the second lower bonding pad LBP2Ya, a fifth via V2Ya connecting the first portion P1 of the second bit line BL2 to the second lower bonding pad LBP2Ya, and a sixth via V3Ya connecting the second portion P2 of the second bit line BL2 to the second lower bonding pad LBP2Ya.

FIG. 24 illustrates a bottom view of an upper structure S2XY1 included in a memory device according to embodiments of the inventive concepts.

Referring to FIG. 24, compared with the upper structure S2XYk illustrated in FIG. 23, the upper structure S2XY1 may further include a second through via THV2 and a lower line LL1Yb which connects a second lower bonding pad LBP2Yb to a second through via THV2 and a first portion P1 and a second portion P2 of a second bit line BL2. The lower line LL1Yb is not connected to a first connection pad LCP2Xa. The lower line LLiYb is disposed on second lower bonding pad LBP2Yb.

FIG. 25 illustrates a bottom view of an upper structure S2XYm included in a memory device according to embodiments of the inventive concepts.

Referring to FIG. 25, compared with the upper structure S2XYk illustrated in FIG. 23, the upper structure S2XYm may include a first lower line LL2Xb which connects a first portion P1 of a first bit line BL1 to a second portion P2 of the first bit line BL1 and that is not connected to a first lower bonding pad LBP2Xb and a second lower bonding pad LBP2Ya.

In some embodiments, the upper structure S2XYm may include a first via V1Ya connecting a second through via THV2 to the second lower bonding pad LBP2Ya, a second via V2Ya connecting a first portion P1 of a second bit line BL2 to the second lower bonding pad LBP2Ya, a third via V3Ya connecting a second portion P2 of the second bit line BL2 to the second lower bonding pad LBP2Ya, and a fourth via V1Xa connecting a first through via THV1 to the first lower bonding pad LBP2Xb.

FIG. 26 illustrates a bottom view of an upper structure S2XYn included in a memory device according to embodiments of the inventive concepts.

Referring to FIG. 26, compared with the upper structure S2XYm illustrated in FIG. 25, the upper structure S2XYn may further include a second through via THV2 and a second lower line LL1Yb which connects a second lower bonding pad LBP2Yb to a first portion P1 and a second portion P2 of a second bit line BL2. The second lower line LL1Yb is not connected to a first lower line LL2Xb. The upper structure S2XYn may include a first via V1Xa connecting a first through via THV1 to a first lower bonding pad LBP2Xb.

FIG. 27 illustrates a bottom view of an upper structure S2XXa included in a memory device according to embodiments of the inventive concepts.

Referring to FIG. 27, a first bit line BL1 may include a first portion P1, a second portion P2, a third portion P3, a first gap G1 between the first portion P1 and the second portion P2, and a second gap G2 between the second portion P2 and the third portion P3. In a plan view, a first through via THV1 may overlap the first gap G1 of the first bit line BL1, and a second through via THV2 may overlap the second gap G2 of the first bit line BL1.

A first lower bonding pad LBP2Xa-1 may be connected to the first through via THV1 and as shown is not connected to the first portion P1, the second portion P2, and the third portion P3 of the first bit line BL1. A second lower bonding pad LBP2Xa-2 may be connected to the second through via THV2 and as also shown is not connected to the first portion P1, the second portion P2, and the third portion P3 of the first bit line BL1. A lower connection pad LCP2Xa may connect the first portion P1 of the first bit line BL1 to the second portion P2 of the first bit line BL1 and may connect the second portion P2 of the first bit line BL1 to the third portion P3 of the first bit line BL1.

The upper structure S2XXa may include a first via V1Xa connecting the first through via THV1 to the first lower bonding pad LBP2Xa-1, a second via V2Xa connecting the first portion P1 of the first bit line BL1 to the lower connection pad LCP2Xa, a third via V3Xa connecting the second portion P2 of the first bit line BL1 to the lower connection pad LCP2Xa, a fourth via V4Xa connecting the third portion P3 of the first bit line BL1 to the lower connection pad LCP2Xa, and a fifth via V1Ya connecting the second through via THV2 to the second lower bonding pad LBP2Xa-2.

FIG. 28 illustrates a bottom view of an upper structure S2XXb included in a memory device according to embodiments of the inventive concepts.

Referring to FIG. 28, a first lower connection pad LCP2Xa-1 may connect a first portion P1 of a first bit line BL1 to a second portion P2 of the first bit line BL1 and as shown is not e connected a first lower bonding pad LBP2Xa-1. The first lower connection pad LCP2Xa-1 may have an arbitrary shape which connects the first portion P1 of the first bit line BL1 to a second portion P2 of the first bit line BL1 and which does not connect the first lower bonding pad LBP2Xa-1.

A fifth bit line BL5 extending in parallel with the first bit line BL1 may include a first portion P1, a second portion P2, and a first gap G1 between the first portion P1 and the second portion P2. In a plan view, a second through via THV2 may overlap the gap G1 of the fifth bit line BL5. A second lower bonding pad LBP2Xa-2 may be connected to the second through via THV2. A second lower connection pad LCP2Xa-2 may connect the first portion P1 of the fifth bit line BL5 to the second portion P2 of the fifth bit line BL5 and as shown is not connected to the second lower bonding pad LBP2Xa-2 and the first lower connection pad LCP2Xa-1. The second lower connection pad LCP2Xa-2 may have an arbitrary shape which connects the first portion P1 of the fifth bit line BL5 to the second portion P2 of the fifth bit line BL5 and which does not connect to the second lower bonding pad LBP2Xa-2 and the first lower connection pad LCP2Xa-1.

In some embodiments, the upper structure S2XXb may include a first via V1Xa-1 connecting the first through via THV1 to the first lower bonding pad LBP2Xa-1, a second via V2Xa-1 connecting the first portion P1 of the first bit line BL1 to the first lower connection pad LCP2Xa-1, a third via V3Xa-1 connecting the second portion P2 of the first bit line BL1 to the first lower connection pad LCP2Xa-1, a fourth via V1Xa-2 connecting the second through via THV2 to the second lower bonding pad LBP2Xa-2, a fifth via V2Xa-2 connecting the first portion P1 of the fifth bit line BL5 to the second lower connection pad LCP2Xa-2, and a sixth via V3Xa-2 connecting the second portion P2 of the fifth bit line BL5 to the second lower connection pad LCP2Xa-2.

Figure 29:
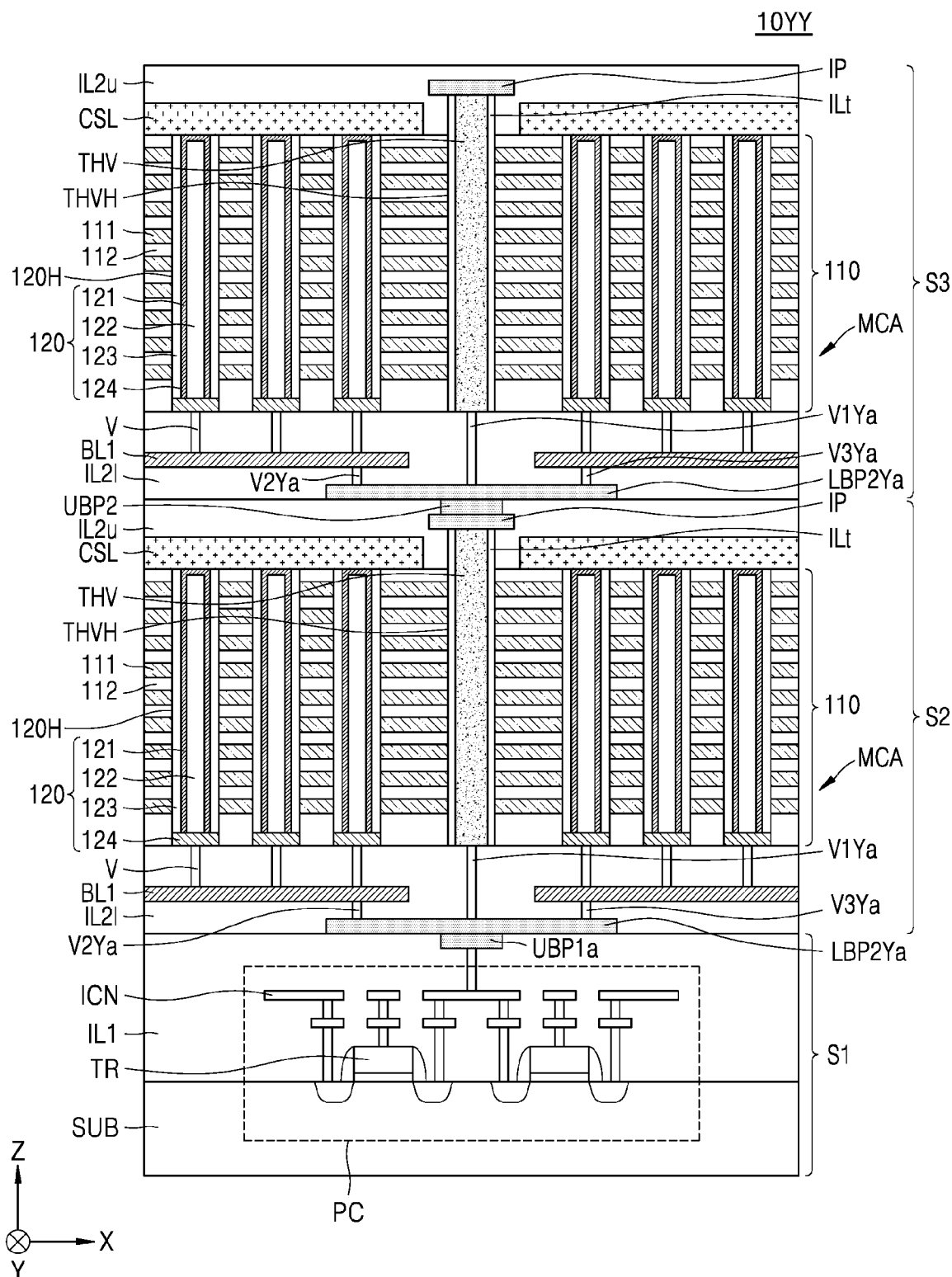
FIG. 29 illustrates a cross-sectional view of a memory device according to embodiments of the inventive concepts.

FIG. 29 illustrates a cross-sectional view illustrating a memory device 10YY according to embodiments of the inventive concepts.

Referring to FIG. 29, the memory device 10YY may include first to third structures S1 to S3 which are stacked in a vertical direction (a Z direction). For example, the first structure S1 may be the lower structure S1$a$ described above with reference to FIG. 4, and each of the second structure S2 and the third structure S3 may be the upper structure S2Ya described above with reference to FIGS. 6A and 6B. A first bit line BL1 of the third structure S3 may be connected to a lower bonding pad LBP2Ya of the third structure S3 and may be connected to a lower bonding pad LBP2Ya of the second structure S2 through an upper bonding pad UBP2 of the second structure S2 and a through via THV of the second structure S2. A first bit line BL1 of the second structure S2 may be connected to the lower bonding pad LBP2Ya of the second structure S2. Therefore, the first bit line BL1 of the second structure S2 and the first bit line BL1 of the third structure S3 may be connected to the same transistor of a peripheral circuit PC. That is, the first bit line BL1 of the second structure S2 and the first bit line BL1 of the third structure S3 may be connected to the same node.

Figure 30:
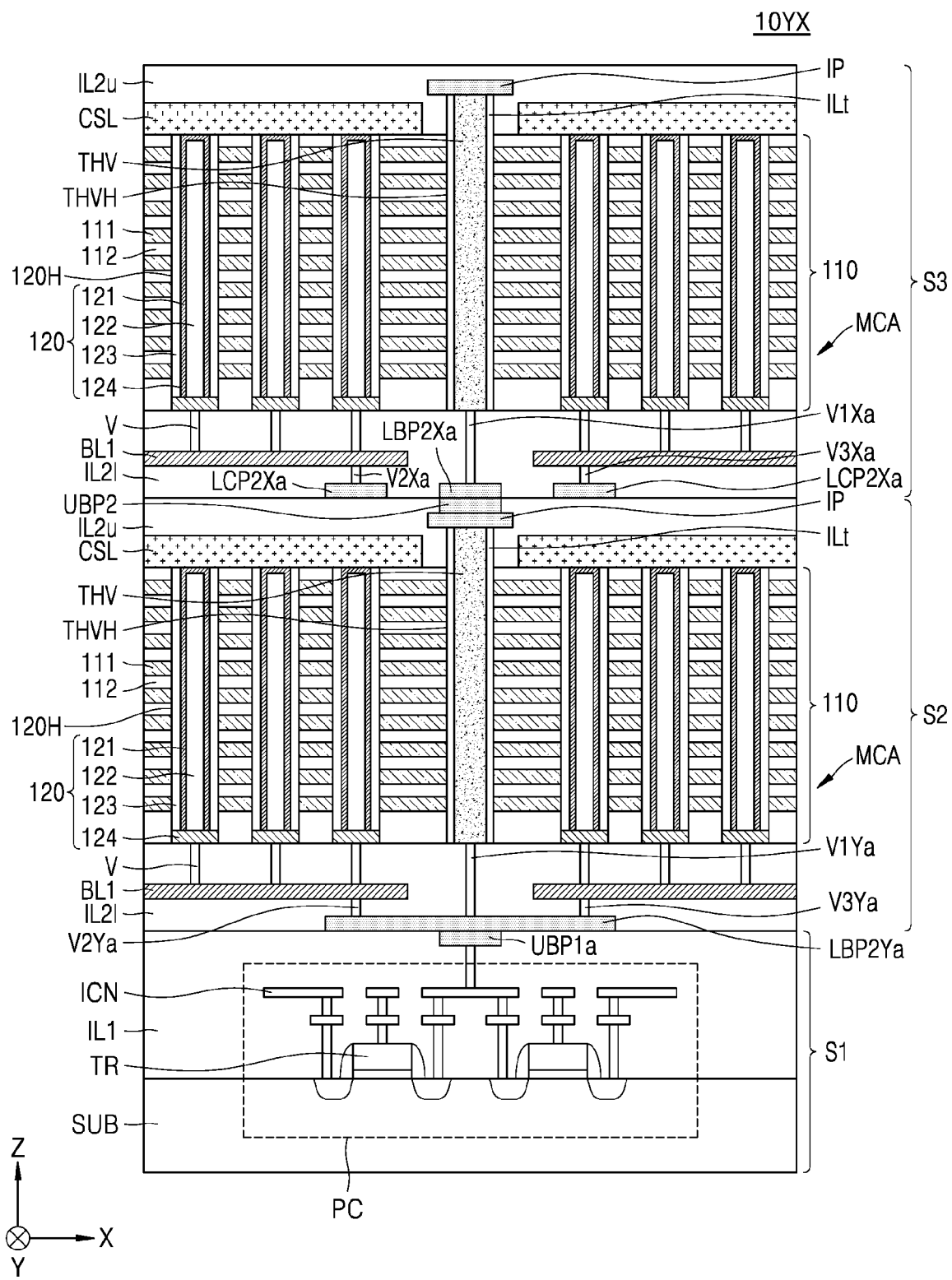
FIG. 30 illustrates a cross-sectional view of a memory device according to embodiments of the inventive concepts.

FIG. 30 illustrates a cross-sectional view of a memory device 10YX according to embodiments of the inventive concepts.

Referring to FIG. 30, the memory device 10YX may include first to third structures S1 to S3 which are stacked in a vertical direction (a Z direction). For example, the first structure S1 may be the lower structure S1a described above with reference to FIG. 4, the second structure S2 may be the upper structure S2Ya described above with reference to FIGS. 6A and 6B, and the third structure S3 may be the upper structure S2Xa described above with reference to FIGS. 5A and 5B. A first bit line BL1 of the third structure S3 is not connected to a lower bonding pad LBP2Xa of the third structure S3, and thus, is not connected to a lower bonding pad LBP2Ya of the second structure S2. On the other hand, a first bit line BL1 of the second structure S2 may be connected to a lower bonding pad LBP2Ya of the second structure S2. Therefore, the first bit line BL1 of the second structure S2 and the first bit line BL1 of the third structure S3 may be connected to different transistors of a peripheral circuit PC. That is, the first bit line BL1 of the second structure S2 and the first bit line BL1 of the third structure S3 may be connected to different nodes.

Figure 31:
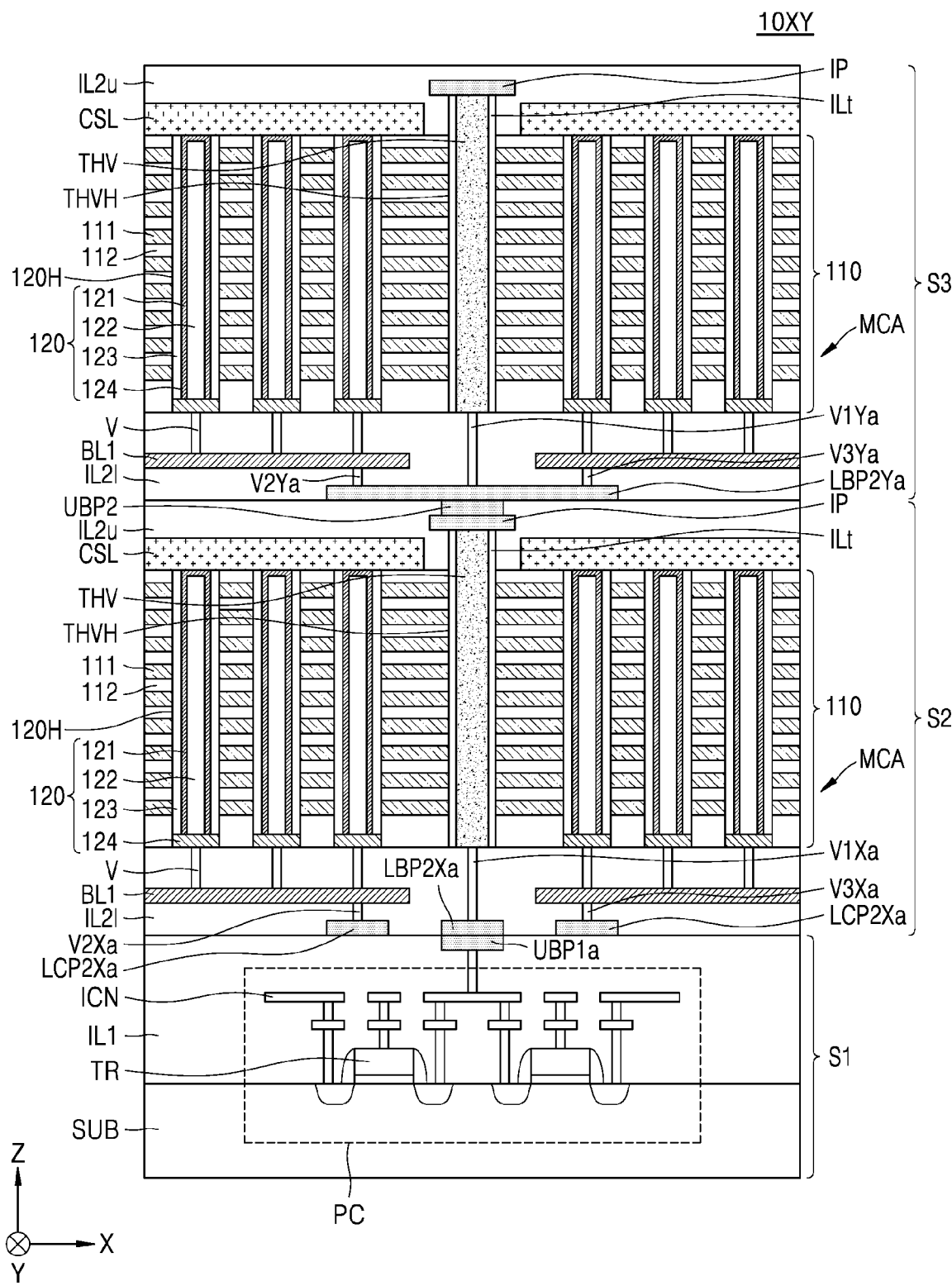
FIG. 31 illustrates a cross-sectional view of a memory device according to embodiments of the inventive concepts.

FIG. 31 illustrates a cross-sectional view of a memory device 10XY according to embodiments of the inventive concepts.

Referring to FIG. 31, the memory device 10XY may include first to third structures S1 to S3 which are stacked in a vertical direction (a Z direction). For example, the first structure S1 may be the lower structure S1a described above with reference to FIG. 4, the second structure S2 may be the upper structure S2Xa described above with reference to FIGS. 5A and 5B, and the third structure S3 may be the upper structure S2Ya described above with reference to FIGS. 6A and 6B. A first bit line BL1 of the third structure S3 may be connected to a lower bonding pad LBP2Ya of the third structure S3, and thus, may be connected to a lower bonding pad LBP2Xa of the second structure S2 through an upper bonding pad UBP2 of the second structure S2 and a through via THV of the second structure S2. On the other hand, a first bit line BL1 of the second structure S2 is not connected to the lower bonding pad LBP2Xa of the second structure S2. Therefore, the first bit line BL1 of the second structure S2 and the first bit line BL1 of the third structure S3 may be connected to different transistors of a peripheral circuit PC. That is, the first bit line BL1 of the second structure S2 and the first bit line BL1 of the third structure S3 may be connected to different nodes.

Figure 32:
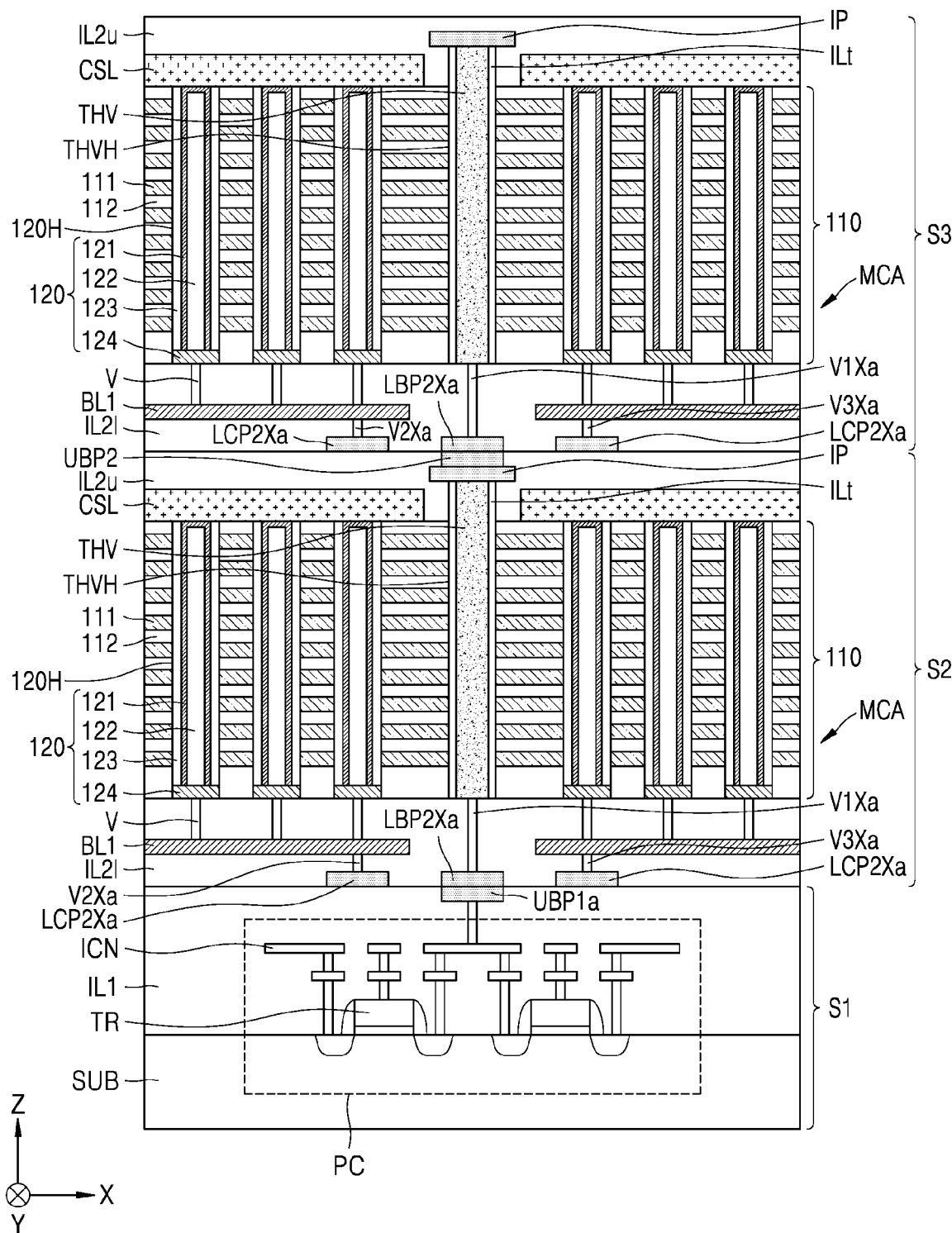
FIG. 32 illustrates a cross-sectional view of a memory device according to embodiments of the inventive concepts.

FIG. 32 illustrates a cross-sectional view illustrating a memory device 10XX according to embodiments of the inventive concepts.

Referring to FIG. 32, the memory device 10XX may include first to third structures S1 to S3 which are stacked in a vertical direction (a Z direction). For example, the first structure S1 may be the lower structure S1a described above with reference to FIG. 4, and each of the second structure S2 and the third structure S3 may be the lower structure S2Xa described above with reference to FIGS. 5A and 5B. A first bit line BL1 of the third structure S3 is not connected to a lower bonding pad LBP2Xa of the third structure S3, and a first bit line BL1 of the second structure S2 is not connected to a lower bonding pad LBP2Xa of the second structure S2. That is, an electrical path formed by a through via THV of the second structure S2 and a through via THV of the third structure S3 is not used for an electrical connection between the first bit lines BL1 of the second and third structures S2 and S3 and a peripheral circuit PC.

Referring to FIGS. 3 to 32, through vias (for example, THV, THV1, and THV2) and bonding pads (for example, LBP2Xa, LBP2Xb, LBP2Ya, LBP2Yb, UBP2, UBP1a, UBP1Xb, UBP1Yb, UBP1Xc, and UBP1Yc) connected to one another may be used as an electrical path between bit lines (for example, BL1) of structures (for example, S1 to S5) and a peripheral circuit PC. By appropriately selecting the bonding pads (for example, LBP2Xa, LBP2Xb, LBP2Ya, LBP2Yb, UBP2, UBP1a, UBP1Xb, UBP1Yb, UBP1Xc, and UBP1Yc) and lower lines (for example, LL1Xb, LL2Xb, and LL1Yb) for each of the structures (for example, S1 to S5), the bit lines (for example, BL1) of the structures (for example, S1 to S5) may be connected or not connected to the electrical path to the peripheral circuit PC. Therefore, bit lines (for example, BL1) of different structures (for example, S1 to S5) may be easily connected to the same node or different nodes. For example, in an embodiment, the first bit line BL1 of the second structure S2 and the first bit line BL1 of the third structure S3 may be connected to different nodes, and the first bit line BL1 of the second structure S2 and a first bit line BL1 of a fourth structure S4 may be connected to the same node.

When bit lines BL1 connected to different structures S1 to S5 are connected to the same node, the number of transistors TR needed for the peripheral circuit PC may be reduced, and thus, a planar area of a memory device may decrease, but however the performance of the memory device may be reduced. On the other hand, when the bit lines BL1 connected to the different structures S1 to S5 are connected to different nodes, the performance of a memory device may increase, but the number of transistors TR needed for the peripheral circuit PC may increase, causing an increase in a planar area of the memory device. Therefore, the planar area and performance of the memory device according to the present embodiment may be easily adjusted.

Figure 33:
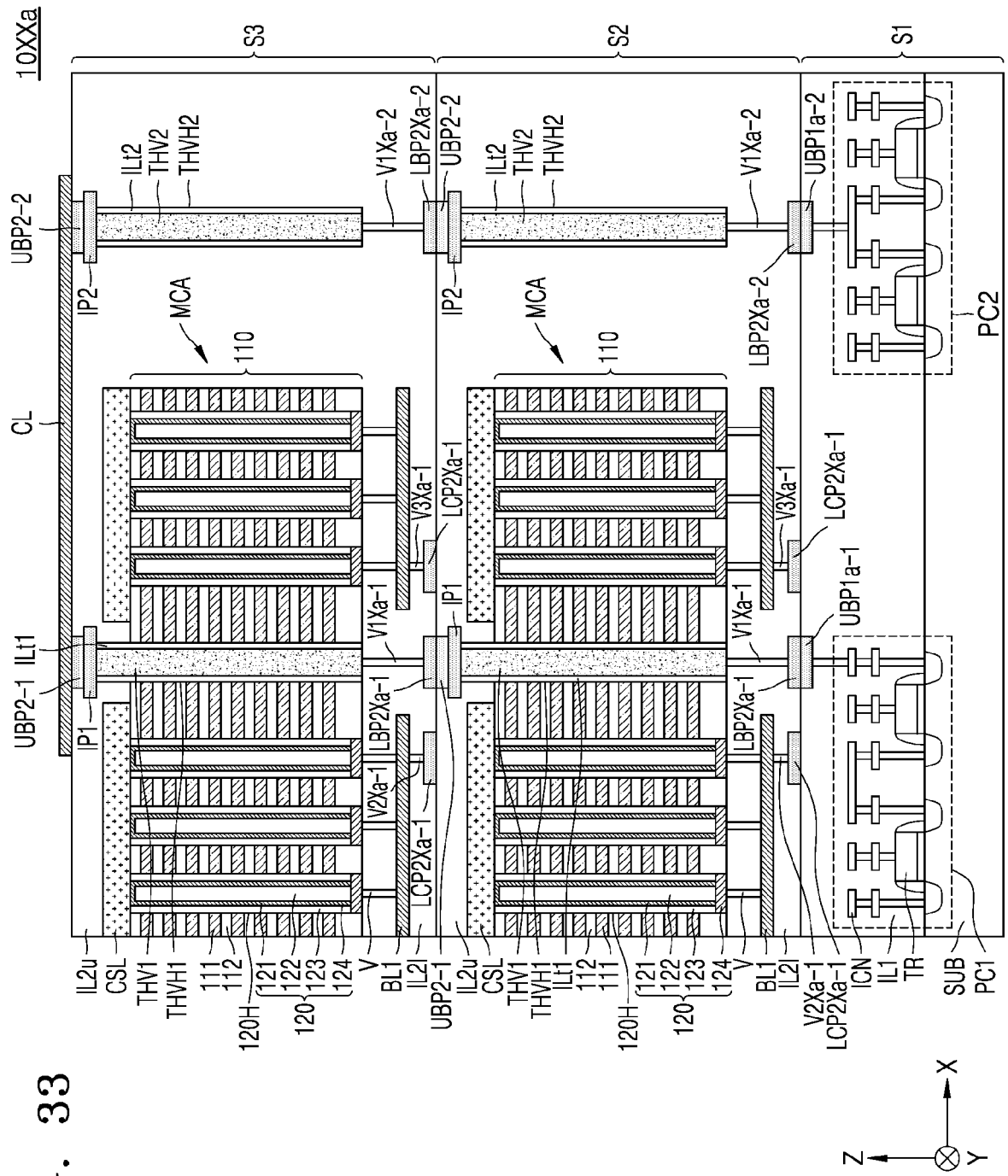
FIG. 33 illustrates a cross-sectional view of a memory device according to embodiments of the inventive concepts.

FIG. 33 illustrates a cross-sectional view of a memory device 10XXa according to embodiments of the inventive concepts.

Referring to FIG. 33, the memory device 10XXa may include first to third structures S1 to S3 which are stacked in a vertical direction (a Z direction). The first structure S1 may include a first portion PC1 and a second portion PC2 of a peripheral circuit which are each similar to the peripheral circuit PC described with respect to FIG. 4 and which are apart from each other, a first upper bonding pad UBP1a-1 connected to the first portion PC1 of the peripheral circuit, and a second upper bonding pad UBP1a-2 connected to the second portion PC2 of the peripheral circuit.

The second structure S2 may be similar to the structure shown in FIGS. 5A and 5B and may include a first lower bonding pad LBP2Xa-1 connected to the first upper bonding pad UBP1a-1 of the first structure S1, a first through via THV1 connected to the first lower bonding pad LBP2Xa-1, a first upper bonding pad UBP2-1 connected to the first through via THV1, a memory cell array MCA through which the first through via THV1 passes, and a first bit line BL1 connected to the memory cell array MCA. The second structure S2 may further include a second lower bonding pad LBP2Xa-2 connected to the second upper bonding pad UBP1a-2 of the first structure S1, a second through via THV2 connected to the second lower bonding pad LBP2Xa-2, and a second upper bonding pad UBP2-2 connected to the second through via THV2. In some embodiments, the second through via THV2 of the second structure S2 does not pass through the memory cell array MCA of the second structure S2 and may be disposed at an outer portion of the second structure S2 outside the memory cell array MCA of the second structure S2.

The third structure S3 may be similar to the structure shown in FIGS. 5A and 5B and may include a first lower bonding pad LBP2Xa-1 connected to the first upper bonding pad UBP2-1 of the second structure S2, a first through via THV1 connected to the first lower bonding pad LBP2Xa-1, a first upper bonding pad UBP2-1 connected to the first through via THV1, a memory cell array MCA through which the first through via THV1 passes, and a first bit line BL1 connected to the memory cell array MCA. The third structure S3 may further include a second lower bonding pad LBP2Xa-2 connected to the second upper bonding pad UBP2-2 of the second structure S2, a second through via THV2 connected to the second lower bonding pad LBP2Xa-2, and a second upper bonding pad UBP2-2 connected to the second through via THV2. In some embodiments, the second through via THV2 of the third structure S3 does not pass through the memory cell array MCA of the third structure S3 and may be disposed at an outer portion of the third structure S3 outside the memory cell array MCA of the third structure S3.

The first bit line BL1 of the second structure S2 is not connected to the first lower bonding pad LBP2Xa-1 and the second lower bonding pad LBP2Xa-2 of the second structure S2. The first bit line BL1 of the third structure S3 is not connected to the first lower bonding pad LBP2Xa-1 and the second lower bonding pad LBP2Xa-2 of the third structure S3. The memory device 10XXa may further include a connection line CL which is disposed on the third structure S3 and connects the first upper bonding pad UBP2-1 of the third structure S3 to the second upper bonding pad UBP2-2 of the third structure S3.

Therefore, the first portion PC1 of the peripheral circuit may be connected to the second portion PC2 of the peripheral circuit through the first upper bonding pad UBP1a-1 of the first structure S1, the first lower bonding pad LBP2Xa-1 of the second structure S2, the first through via THV1 of the second structure S2, the first upper bonding pad UBP2-1 of the second structure S2, the first lower bonding pad LBP2Xa-1 of the third structure S3, the first through via THV1 of the third structure S3, the first upper bonding pad UBP2-1 of the third structure S3, the connection line CL, the second upper bonding pad UBP2-2 of the third structure S3, the second through via THV2 of the third structure S3, the second lower bonding pad LBP2Xa-2 of the third structure S3, the second upper bonding pad UBP2-2 of the second structure S2, the second through via THV2 of the second structure S2, the second lower bonding pad LBP2Xa-2 of the second structure S2, and the second upper bonding pad UBP1a-2 of the first structure S1. That is, the first bit lines BL1 of the second structure S2 and the third structure S3 are not connected to the first through vias THV1 and the second through vias THV2 of the second structure S2 and the third structure S3, and the first through vias THV1 and the second through vias THV2 of the second structure S2 and the third structure S3 may be used as an electrical path between the first portion PC1 and the second portion PC2 of the peripheral circuit.

Figure 34:
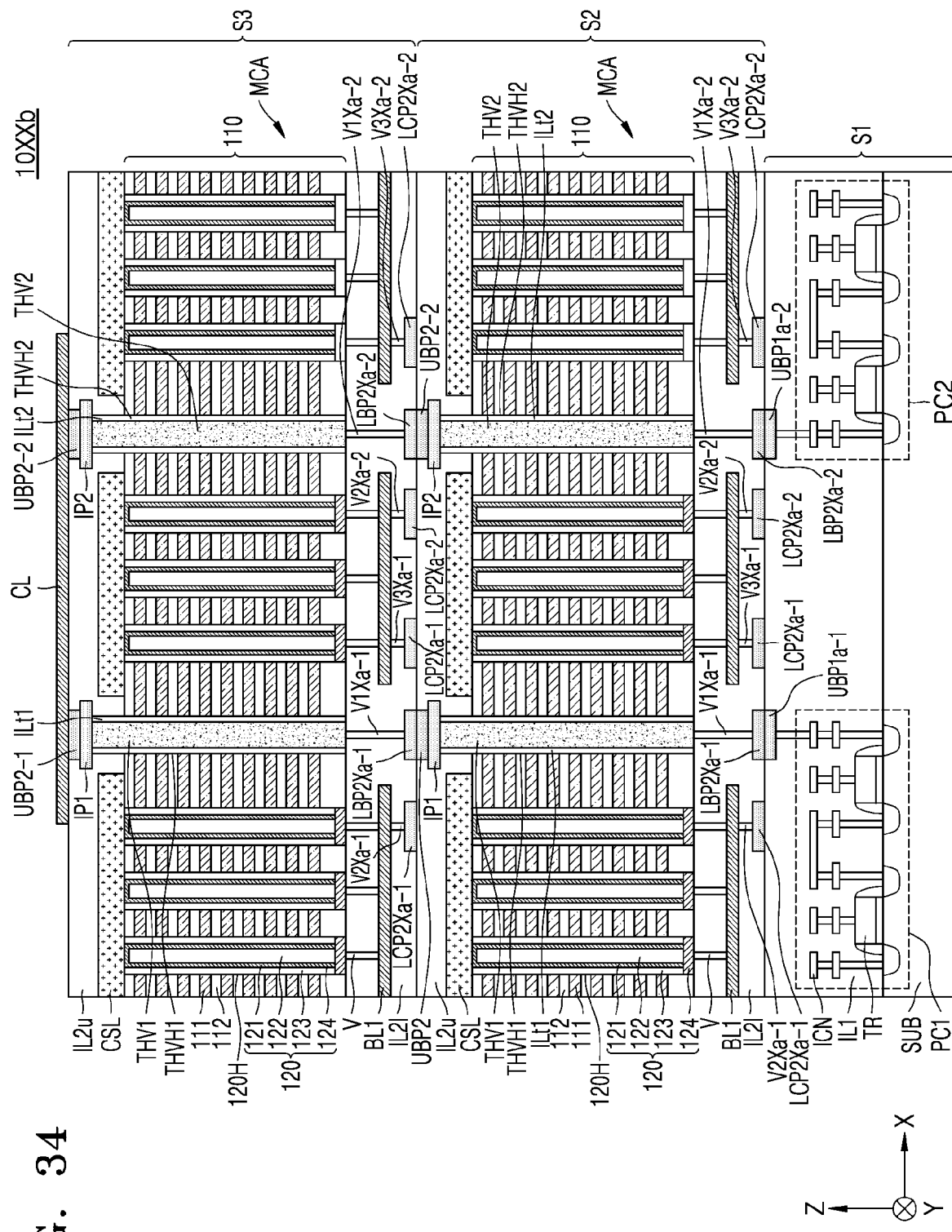
FIG. 34 illustrates a cross-sectional view of a memory device according to embodiments of the inventive concepts.

FIG. 34 illustrates a cross-sectional view of a memory device 10XXb according to embodiments of the inventive concepts.

Referring to FIG. 34, compared with the memory device 10XXa described above with reference to FIG. 33, the second through via THV2 of the second structure S2 may pass through the memory cell array MCA of the second structure S2 similarly to the first through via THV1 of the second structure S2. Also, the second through via THV2 of the third structure S3 may pass through the memory cell array MCA of the third structure S3.

FIGS. 35A to 35D illustrate cross-sectional views of a method of manufacturing a memory device, according to embodiments of the inventive concepts.

Figure 35A:
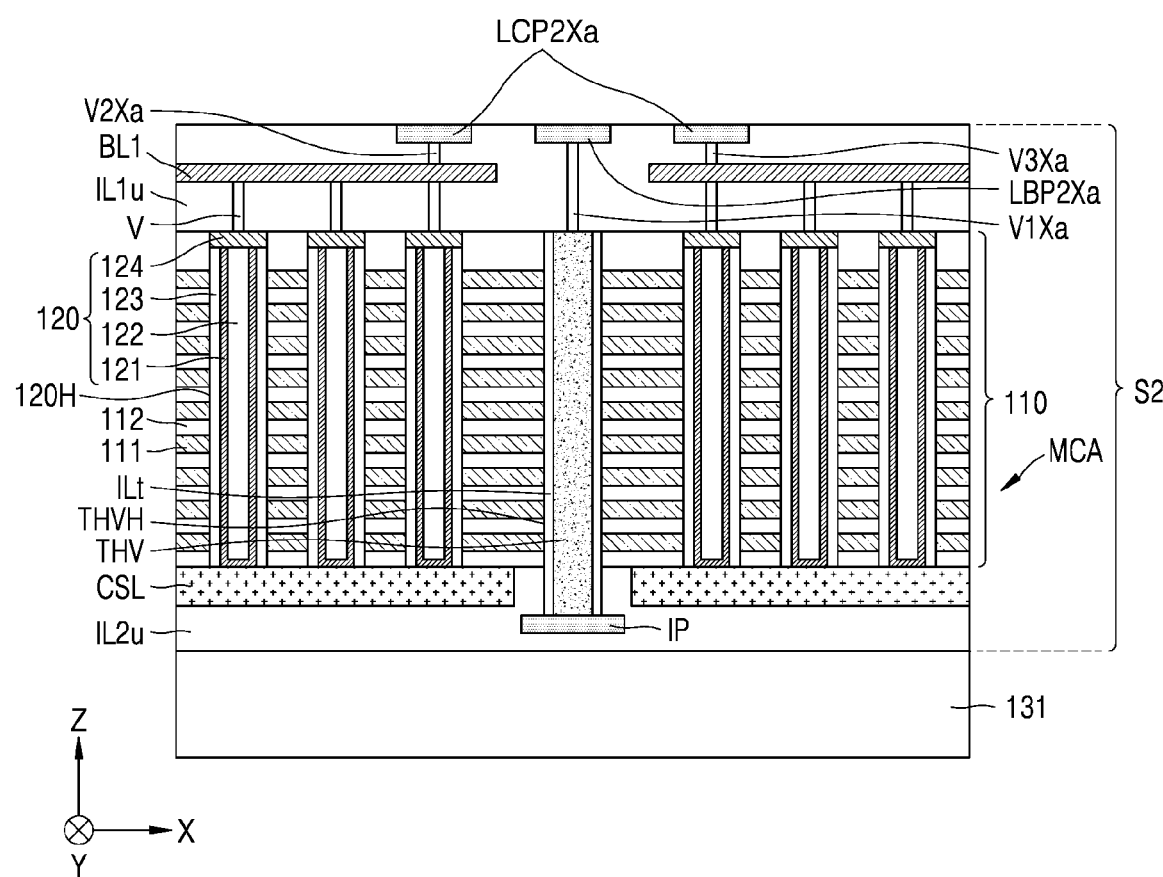
FIGS. 35A, 35B, 35C and 35D illustrate cross-sectional views descriptive of a method of manufacturing a memory device, according to embodiments of the inventive concepts.

Referring to FIG. 35A, a second structure S2 may be formed on a first substrate 131. However, an upper bonding pad (for example, UBP2) (see FIG. 35C) of the second structure S2 may not yet be formed. The second structure S2 may include the upper structure S2Xa illustrated in FIGS. 5A and 5B, the upper structure S2Ya illustrated in FIGS. 6A and 6B, the upper structure S2Xb illustrated in FIGS. 7A and 7B, the upper structure S2Yb illustrated in FIGS. 8A and 8B, the upper structure S2XYa illustrated in FIGS. 13A and 13B, the upper structure S2XYb illustrated in FIGS. 14A and 14B, the upper structure S2XYc illustrated in FIGS. 15A and 15B, the upper structure S2XYd illustrated in FIGS. 16A and 16B, the upper structure S2XYe illustrated in FIGS. 17A and 17B, the upper structure S2XYf illustrated in FIGS. 18A and 18B, the upper structure S2XYg illustrated in FIGS. 19A and 19B, the upper structure S2XYh illustrated in FIGS. 20A and 20B, the upper structure S2XYi illustrated in FIGS. 21A and 21B, the upper structure S2XYj illustrated in FIGS. 22A and 22B, the upper structure S2XYk illustrated in FIG. 23, the upper structure S2XYl illustrated in FIG. 24, the upper structure S2XYm illustrated in FIG. 25, the upper structure S2XYn illustrated in FIG. 26, the upper structure S2XXa illustrated in FIG. 27, the upper structure S2XXb illustrated in FIG. 28, or a combination thereof.

Figure 35B:
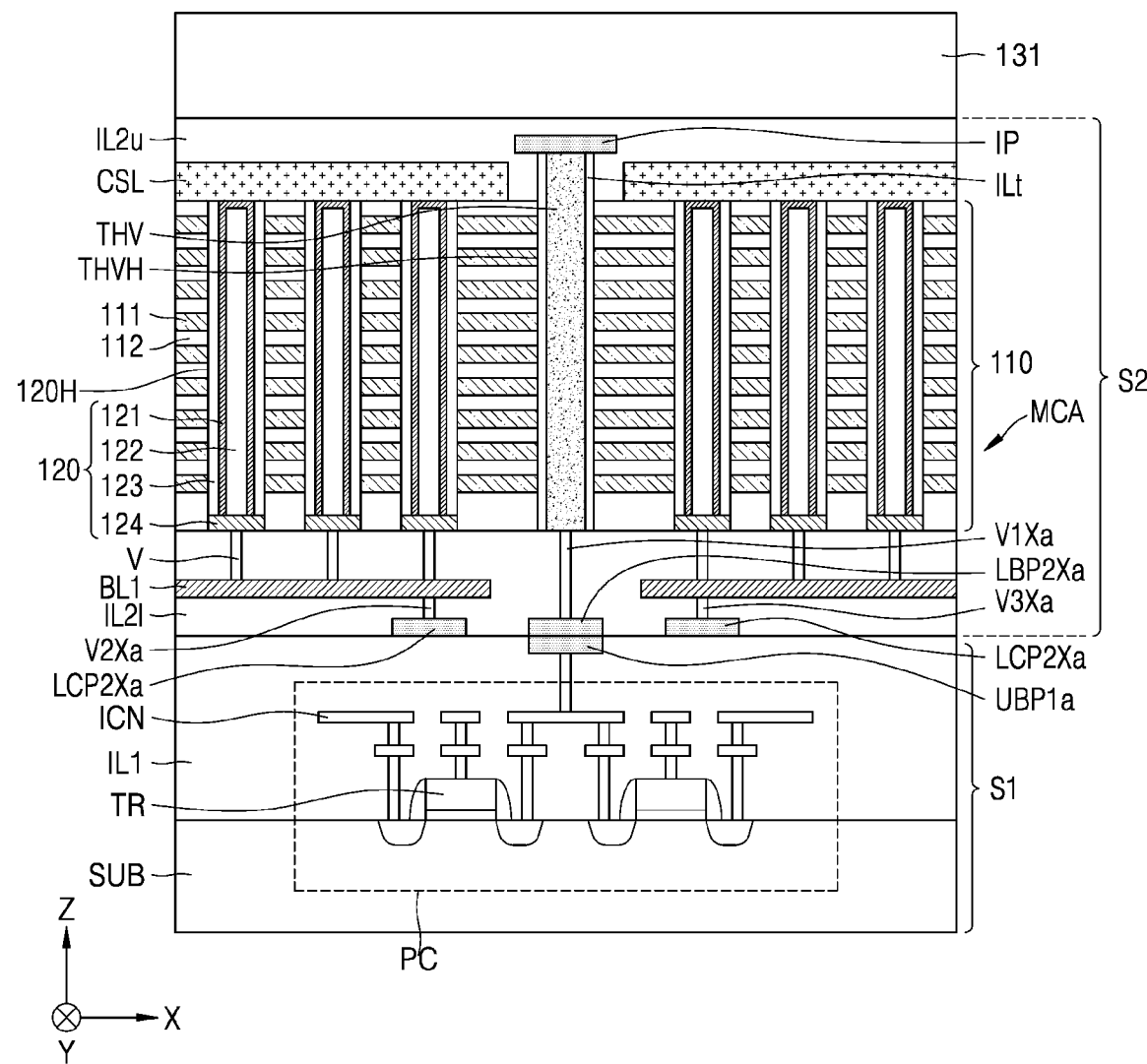

Referring to FIG. 35B, a first structure S1 may be formed. The first structure S1 may include the lower structure S1a illustrated in FIG. 4, the lower structure S1Xb illustrated in FIGS. 9A and 9B, the lower structure S1Yb illustrated in FIGS. 10A and 10B, the lower structure S1Xc illustrated in FIGS. 11A and 11B, the lower structure S1Yc illustrated in FIGS. 12A and 12B, or a combination thereof.

Subsequently, the second structure S2 may be aligned on the first structure S1 so that a lower bonding pad LBP2Xa of the second structure S2 contacts an upper bonding pad UBP1a of the first structure S1, and the first structure S1 may be bonded to the second structure S2. In some embodiments, when heat and/or pressure are/is applied to the first structure S1 and the second structure S2, the upper bonding pad UBP1a of the first structure S1 and the lower bonding pad LBP2Xa of the second structure S2 may reflow, and thus, the upper bonding pad UBP1a of the first structure S1 and the lower bonding pad LBP2Xa of the second structure S2 may be bonded to each other as one body.

Figure 35C:
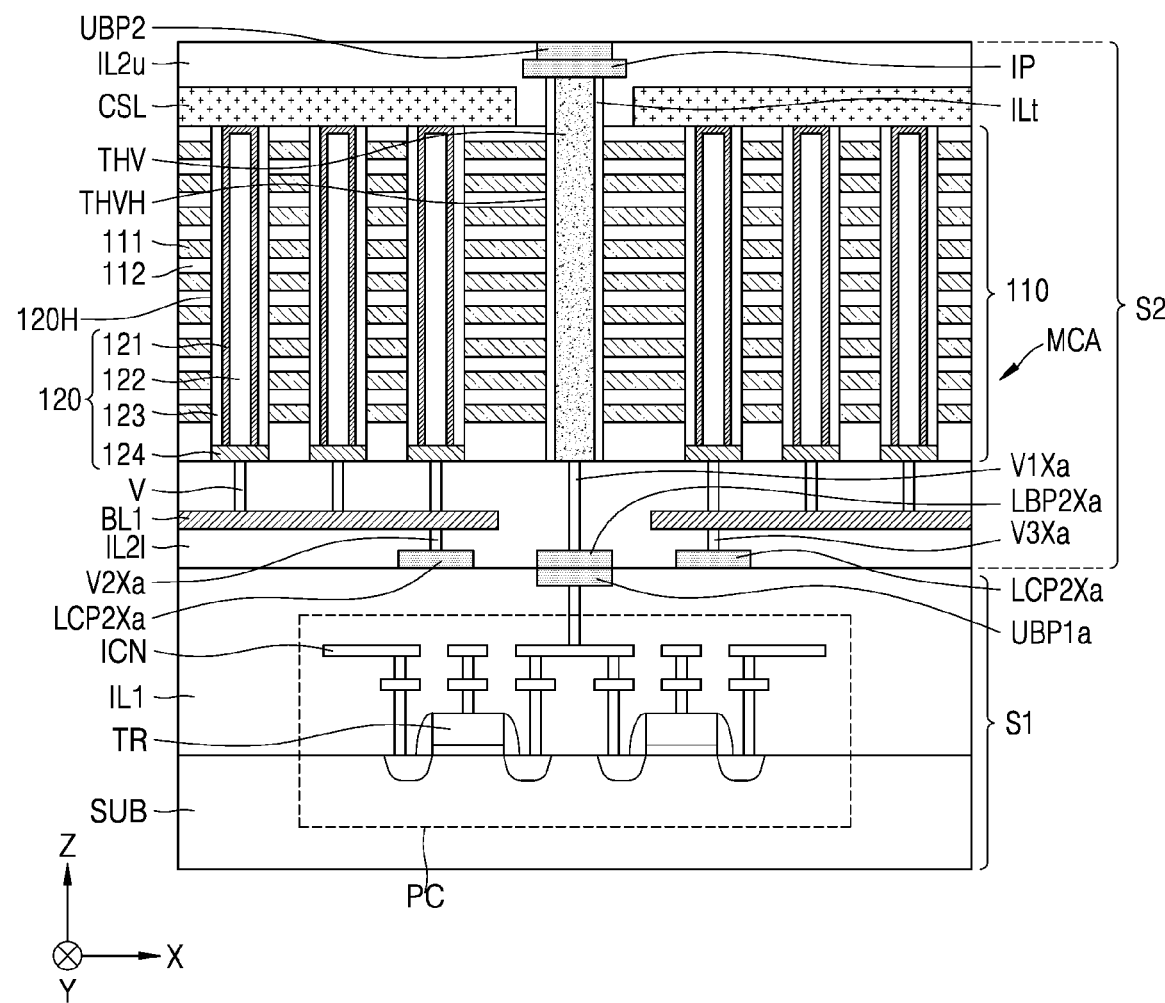

Referring to FIGS. 35B and 35C, the first substrate 131 may be removed from the second structure S2. Subsequently, an upper bonding pad UBP2 may be formed on an internal pad IP of the second structure S2.

Figure 35D:
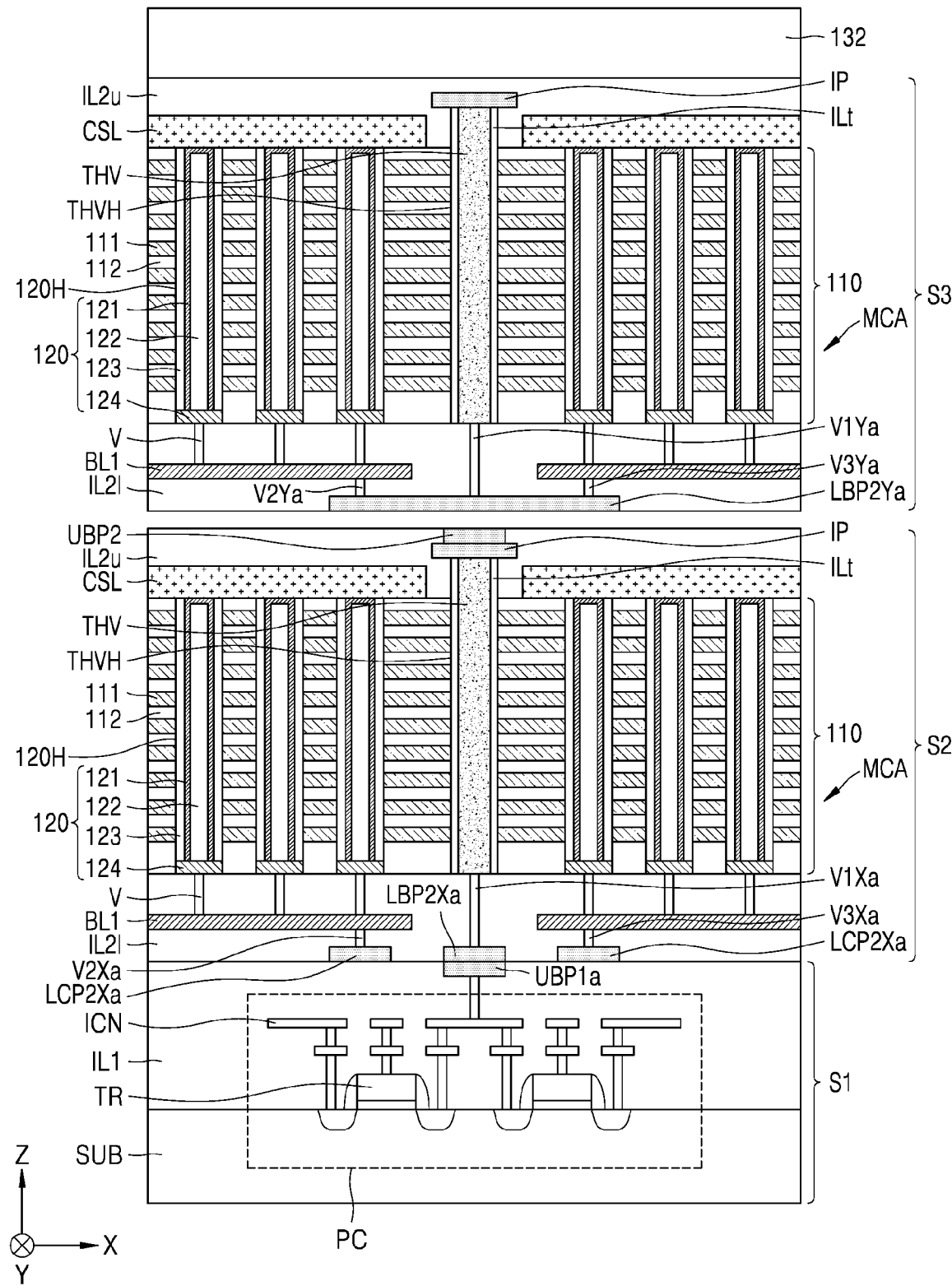

Referring to FIG. 35D, similarly to description given above with reference to FIG. 35A, a third structure S3 may be formed on a second substrate 132. However, an upper bonding pad of the third structure S3 may not be formed. Subsequently, the third structure S3 may be aligned on the second structure S2 so that a lower bonding pad LBP2Ya of the third structure S3 contacts an upper bonding pad UBP2 of the second structure S2, and the second structure S2 may be bonded to the third structure S3. In some embodiments, when heat and/or pressure are/is applied to the second structure S2 and the third structure S3, the upper bonding pad UBP2 of the second structure S2 and the lower bonding pad LBP2Ya of the third structure S3 may reflow, and thus, the upper bonding pad UBP2 of the second structure S2 and the lower bonding pad LBP2Ya of the third structure S3 may be bonded to each other as one body. By using a method similar to description given above with reference to FIGS. 35B to 35D, other structures may be further stacked on the third structure S3.

Therefore, a memory device according to an embodiment may be manufactured. According to the method of manufacturing the memory device, the first structure S1 including a peripheral circuit PC and the second and third structures S2 and S3 each including the memory cell array MCA may be separately manufactured and may be bonded to one another, thereby preventing a previously manufactured peripheral circuit PC from being damaged by heat and stress occurring in the middle of manufacturing the memory cell array MCA. Also, a memory device having an enhanced degree of integration may be manufactured by stacking the first to third structures S1 to S3.

Figure 36A:
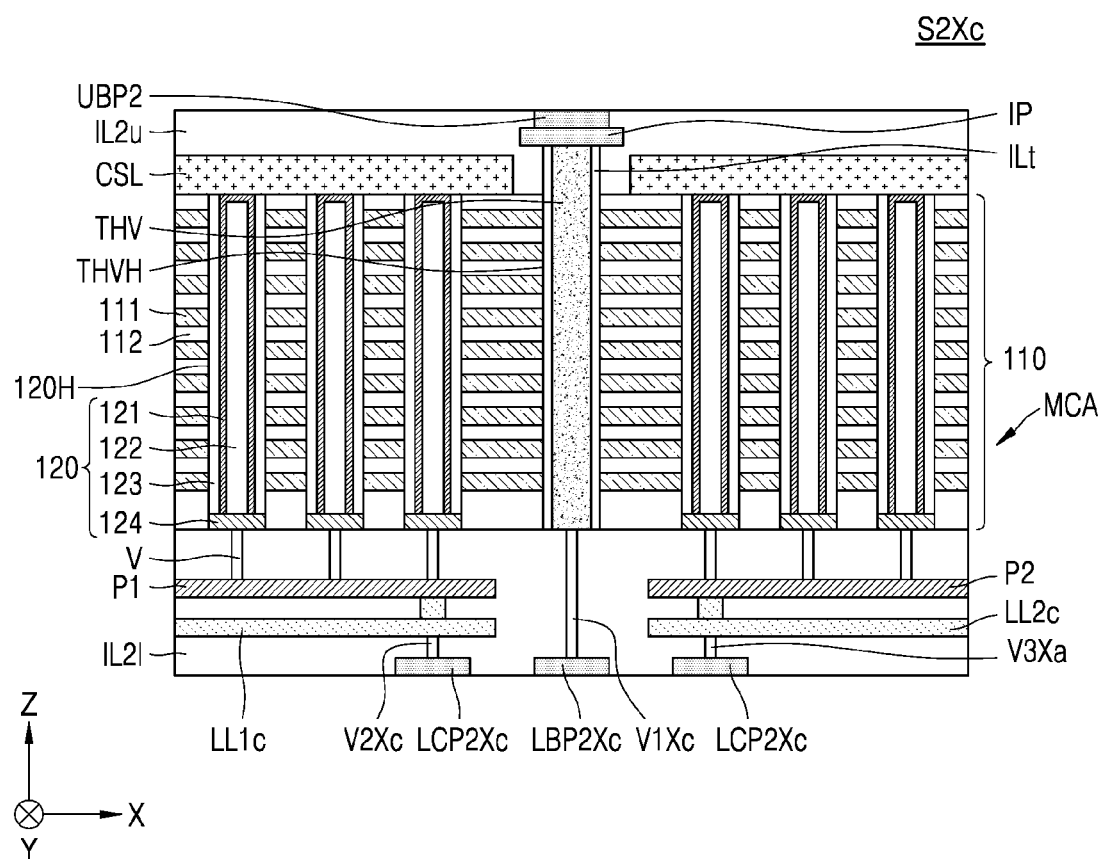
FIGS. 36A and 36B illustrate a cross-sectional view and a plan view of an upper structure included in a memory device according to embodiments of the inventive concepts.
Figure 36B:
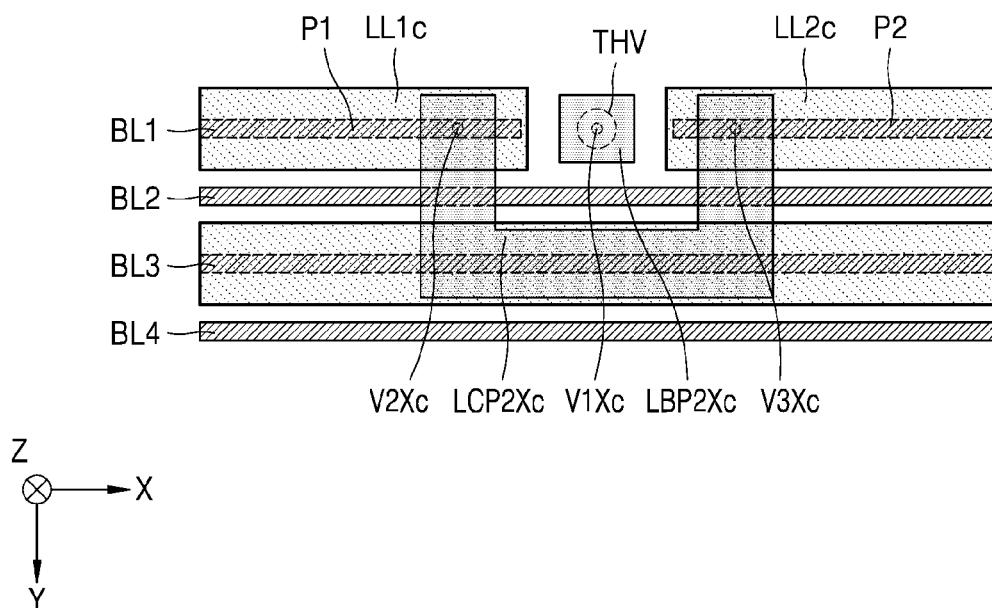

FIGS. 36A and 36B illustrate a cross-sectional view and a bottom view of an upper structure S2Xc included in a memory device according to embodiments of the inventive concepts.

Referring to FIGS. 36A and 36B, compared with the upper structure S2Xa illustrated in FIGS. 5A and 5B, the upper structure S2Xc may further include a first lower line LL1c, connected between a second via V2Xc and a first portion P1 of a first bit line BL1, and a second lower line LL2c connected between a third via V3Xc and a second portion P2 of the first bit line BL1. In some embodiments, a width and a pitch of the first lower line LL1c and the second lower line LL2c may be greater than a width and a pitch of first to fourth bit lines BL1 to BL4, and thus, the second via V2Xc and the third via V3Xc may be easily and respectively aligned in the first lower line LL1c and the second lower line LL2c.

Figure 37A:
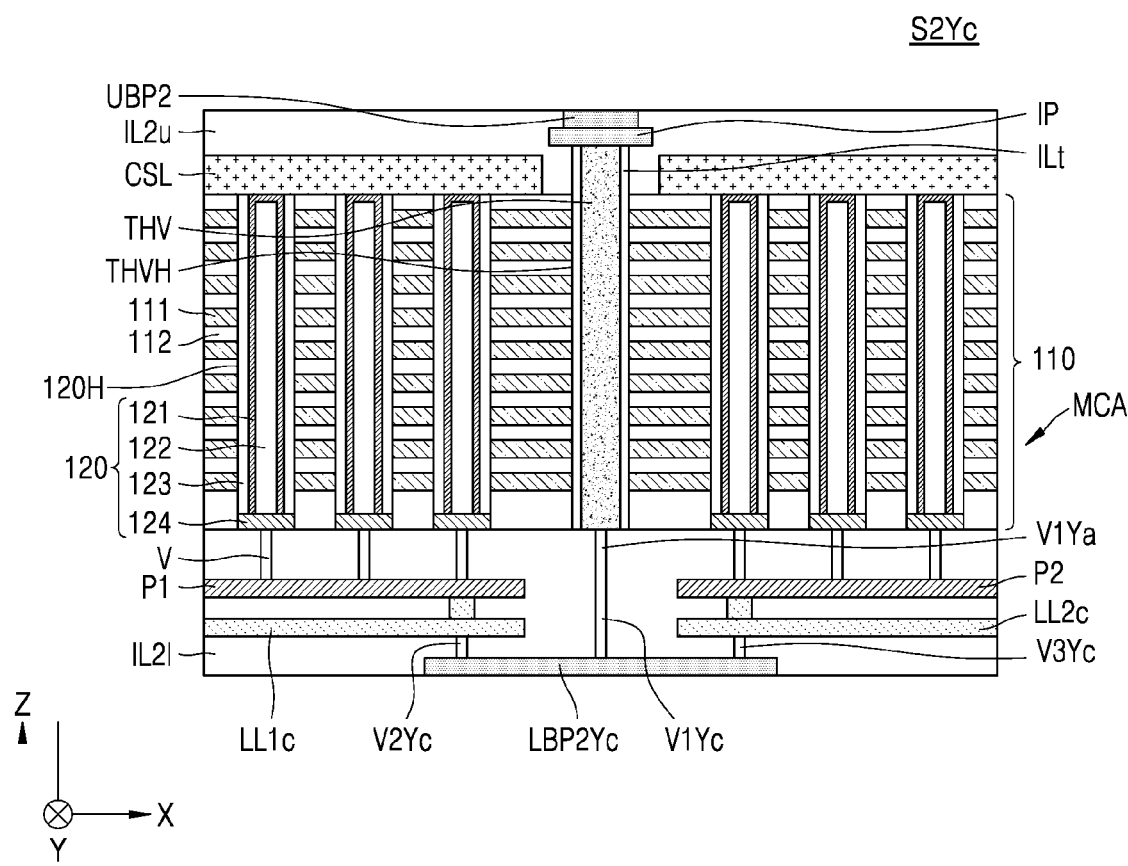
FIGS. 37A and 37B illustrate a cross-sectional view and a plan view of an upper structure included in a memory device according to embodiments of the inventive concepts.
Figure 37B:
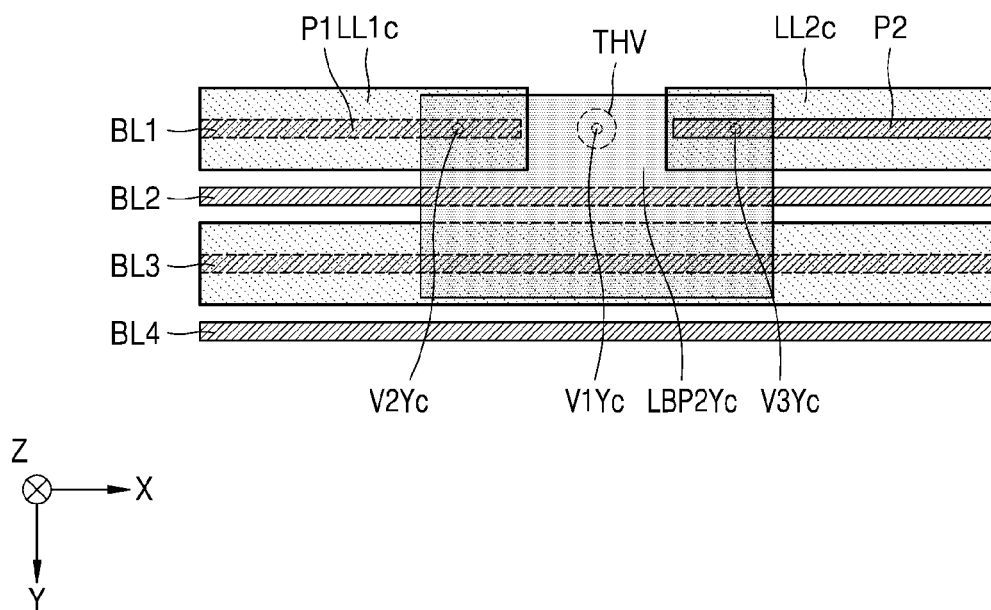

FIGS. 37A and 37B illustrate a cross-sectional view and a bottom view of an upper structure S2Yc included in a memory device according to embodiments of the inventive concepts.

Referring to FIGS. 37A and 37B, compared with the upper structure S2Ya illustrated in FIGS. 6A and 6B, the upper structure S2Yc may further include a first lower line LL1c, connected between a second via V2Yc and a first portion P1 of a first bit line BL1, and a second lower line LL2c connected between a third via V3Yc and a second portion P2 of the first bit line BL1. In some embodiments, a width and a pitch of the first lower line LL1c and the second lower line LL2c may be greater than a width and a pitch of first to fourth bit lines BL1 to BL4, and thus, the second via V2Yc and the third via V3Yc may be easily and respectively aligned in the first lower line LL1c and the second lower line LL2c.

Figure 38:
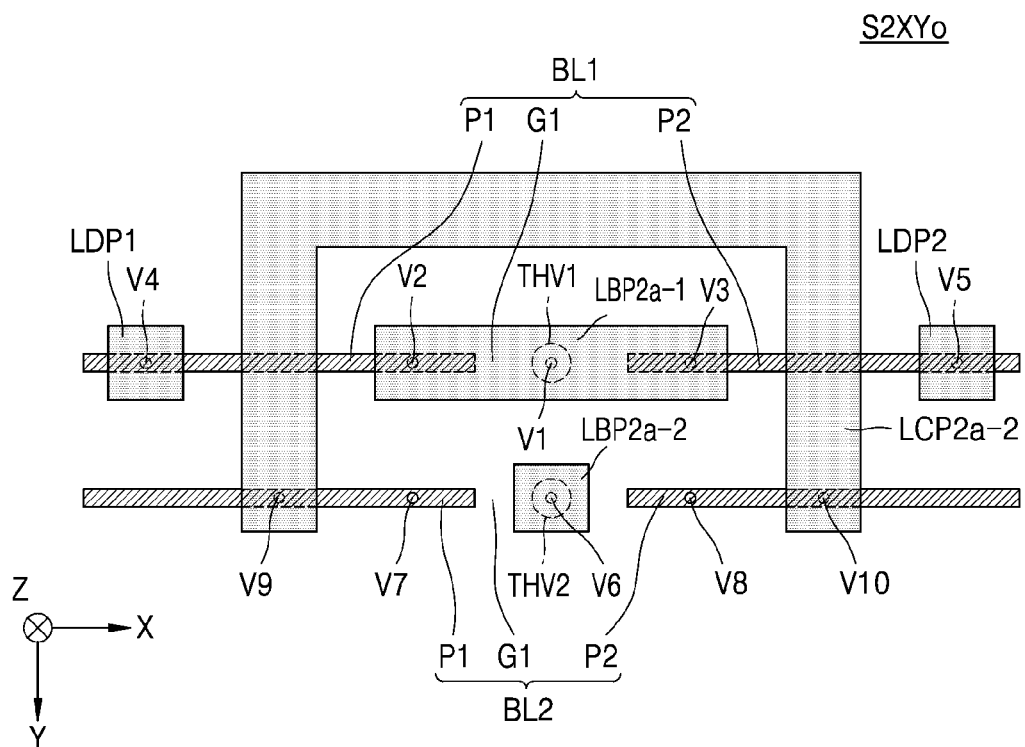
FIG. 38 illustrates a plan view of an upper structure included in a memory device according to embodiments of the inventive concepts.
Figure 39:
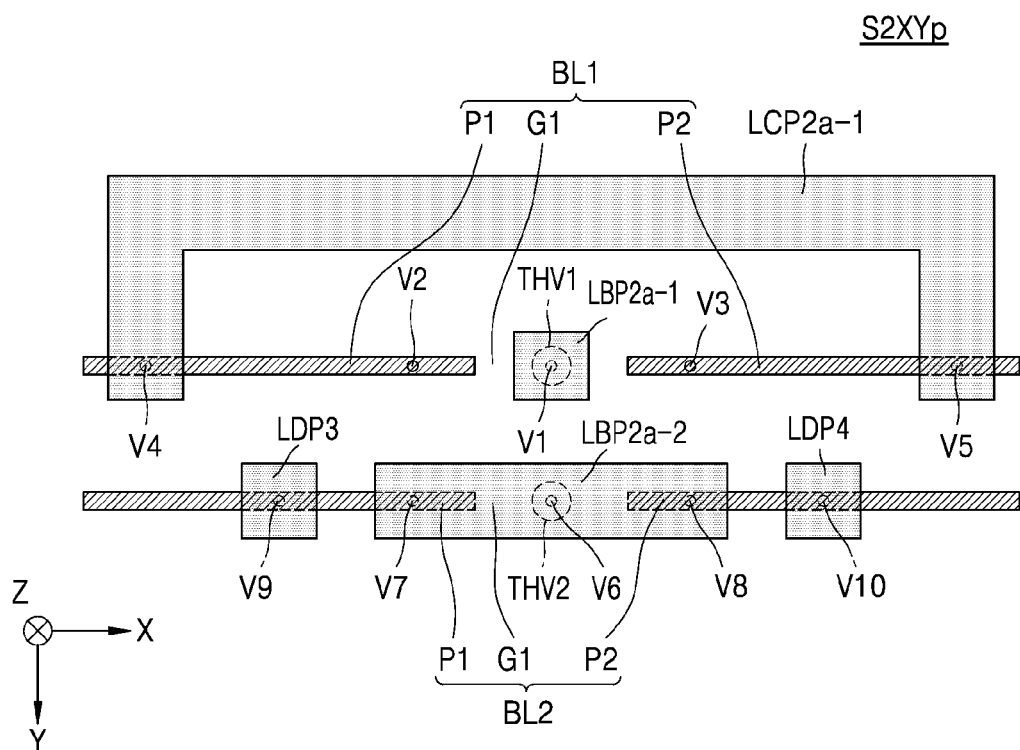
FIG. 39 illustrates a plan view of an upper structure included in a memory device according to embodiments of the inventive concepts.

FIG. 38 illustrates a bottom view of an upper structure S2XYo included in a memory device according to embodiments of the inventive concepts. FIG. 39 illustrates a bottom view of an upper structure S2XYp included in a memory device according to embodiments of the inventive concepts.

Referring to FIGS. 38 and 39, each of a first bit line BL1 and a second bit line BL2 may include a first portion P1, a second portion P2, and a gap G1 between the first portion P1 and the second portion P2. A first via V1 may be disposed on a first through via THV1. A second via V2 and a fourth via V4 may be disposed on the first portion P1 of the first bit line BL1. A third via V3 and a fifth via V5 may be disposed on the second portion P2 of the first bit line BL1. A sixth via V6 may be disposed on a second through via THV2. A seventh via V7 and an ninth via V9 may be disposed on the first portion P1 of the second bit line BL2. An eighth via V8 and a tenth via V10 may be disposed on the second portion P2 of the second bit line BL2.

In the upper structure S2XYo illustrated in FIG. 38, a first lower bonding pad LBP2a-1 may be connected to the first through via THV1 through the first via V1, connected to the first portion P1 of the first bit line BL1 through the second via V2, and connected to the second portion P2 of the first bit line BL1 through the third via V3. A second lower bonding pad LBP2a-2 may be connected to the second through via THV2 through the sixth via V6. A lower connection pad LCP2a-2 may be connected to the first portion P1 of the second bit line BL2 through the ninth via V9 and may be connected to the second portion P2 of the second bit line BL2 through the tenth via V10. The fourth via V4 and the fifth via V5 may be disposed on the first bit line BL1, but as shown are not used for connection. The seventh via V7 and the eighth via V8 may be disposed on the second bit line BL2, but also are not used for connection. Each of the fourth via V4, the fifth via V5, the seventh via V7, and the eighth via V8, which are not connected to the first and second lower bonding pads LBP2a-1 and LBP2a-2 and the lower connection pad LCP2a-2, may be referred to as a surplus via.

In some embodiments, the upper structure S2XYo may further include at least one dummy pad which is each disposed on at least one surplus via and is not used for a connection. For example, the upper structure S2XYo may further include a first dummy pad LDP1 on a fourth surplus via V4 and a second dummy pad LDP2 on a fifth surplus via V5. In some embodiments, a dummy pad may not be provided on a seventh surplus via V7 and an eighth surplus via V8. In other embodiments, unlike the illustration of FIG. 38, a plurality of dummy pads may be respectively disposed on the seventh surplus via V7 and the eighth surplus via V8. In some embodiments, the first dummy pad LDP1 and the second dummy pad LDP2 may not contact any conductive element other than the fourth surplus via V4 and the fifth surplus via V5. Therefore, the first dummy pad LDP1 and the second dummy pad LDP2 may electrically isolate the fourth surplus via V4 and the fifth surplus via V5, respectively.

In the upper structure S2XYp illustrated in FIG. 39, a first lower bonding pad LBP2a-1 may be connected to a first through via THV1 through a first via V1. A lower connection pad LCP2a-1 may be connected to the first portion P1 of the first bit line BL1 through the fourth via V4 and may be connected to the second portion P2 of the first bit line BL1 through the fifth via V5. A second lower bonding pad LBP2a-2 may be connected to the second through via THV2 through the sixth via V6, connected to the first portion P1 of the second bit line BL2 through the seventh via V7, and connected to the second portion P2 of the second bit line BL2 through the eighth via V8. The second via V2 and the third via V3 may be disposed on the first bit line BL1, but are not be used for connection. The ninth via V9 and the tenth via V10 may be disposed on the second bit line BL2, but are not be used for connection. Each of the second via V2, the third via V3, the ninth via V9, and the tenth via V10, which are not connected to the first and second lower bonding pads LBP2a-1 and LBP2a-2 and the lower connection pad LCP2a-1, may be referred to as a surplus via.

In some embodiments, the upper structure S2XYp may further include at least one dummy pad which is each disposed on at least one surplus via and is not used for a connection. For example, the upper structure S2XYp may further include a third dummy pad LDP3 on a ninth surplus via V9 and a fourth dummy pad LDP4 on a tenth surplus via V10. In some embodiments, a dummy pad may not be provided on a second surplus via V2 and a third surplus via V3. In other embodiments, unlike the illustration of FIG. 39, a plurality of dummy pads may be respectively disposed on the second surplus via V2 and the third surplus via V3. In some embodiments, the third dummy pad LDP3 and the fourth dummy pad LDP4 may not contact any conductive element other than the ninth surplus via V9 and the tenth surplus via V10. Therefore, the third dummy pad LDP3 and the fourth dummy pad LDP4 may electrically isolate the ninth surplus via V9 and the tenth surplus via V10, respectively.

As described above, the first to tenth vias V1 to V10 may be previously and appropriately formed regardless of a connection relationship between the first and second lower bonding pads LBP2a-1 and LBP2a-2, the first and second lower connection pads LCP2a-1 and LCP2a-2, and the first to fourth bit lines BL1 to BL4, and then, only some of the first to tenth vias V1 to V10 may be used based on the connection relationship between the first and second lower bonding pads LBP2a-1 and LBP2a-2, the first and second lower connection pads LCP2a-1 and LCP2a-2. For example, in a state where the first to tenth vias V1 to V10 are formed, as illustrated in FIG. 38, the first bit line BL1 may be connected to the first lower bonding pad LBP2a-1 and the second bit line BL2 is not connected to the second lower bonding pad LBP2a-2 and may be connected to the second lower connection pad LCP2a-2, or as illustrated in FIG. 39, the first bit line BL1 is not connected to the first lower bonding pad LBP2a-1 and may be connected to the first lower connection pad LCP2a-1 and the second bit line BL2 may be connected to the second lower bonding pad LBP2a-2. Whether a finished upper structure is the upper structure S2XYo illustrated in FIG. 38 or the upper structure S2XYp illustrated in FIG. 39 may be determined in a final process of forming the first and second lower bonding pads LBP2a-1 and LBP2a-2 and the first or second lower connection pad LCP2a-1 or LCP2a-2, and thus, the manufacturing cost may be reduced.

Figure 40:
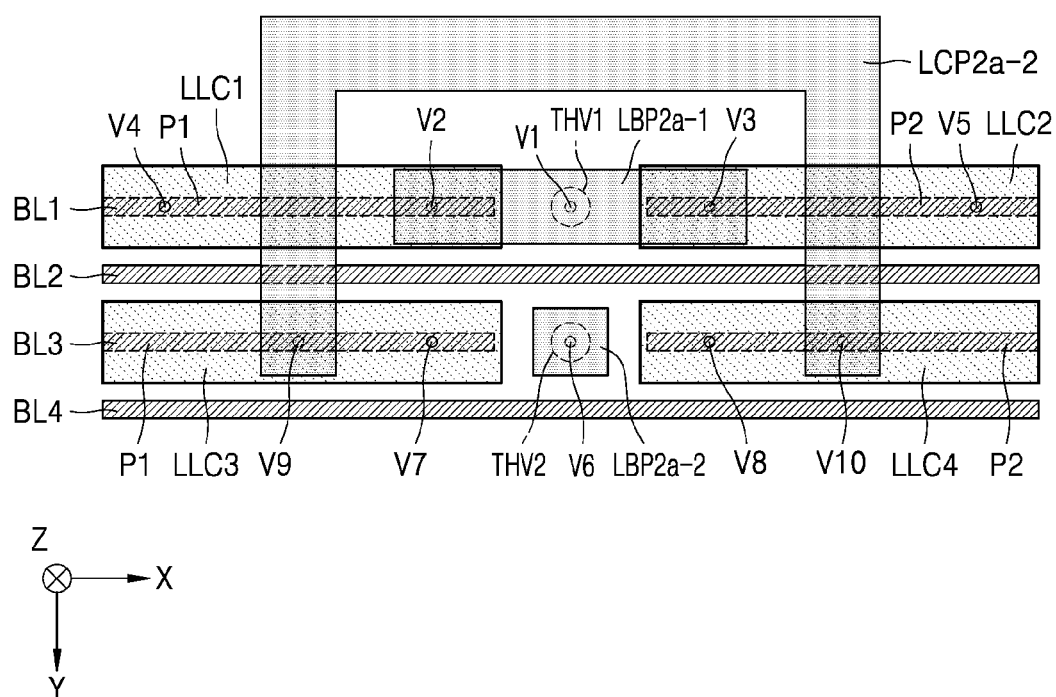
FIG. 40 illustrates a plan view of an upper structure included in a memory device according to embodiments of the inventive concepts.

FIG. 40 illustrates a bottom view of an upper structure S2XYq included in a memory device according to embodiments of the inventive concepts.

Referring to FIG. 40, compared with the upper structure S2XYo illustrated in FIG. 38, the upper structure S2XYq may further include a first lower line LLC1 connected between a second via V2 and a first portion P1 of a first bit line BL1, a second lower line LLC2 connected between a third via V3 and a second portion P2 of the first bit line BL1, a third lower line LLC3 connected between a ninth via V9 and a first portion P1 of a third bit line BL3, and a fourth lower line LLC4 connected between a tenth via V10 and a second portion P2 of the third bit line BL3. A fourth surplus via V4 may be disposed on the first lower line LLC1, and a fifth surplus via V5 may be disposed on the second lower line LLC2. A seventh surplus via V7 may be disposed on the third lower line LLC3, and an eighth surplus via V8 may be disposed on the fourth lower line LLC4.

Figure 41:
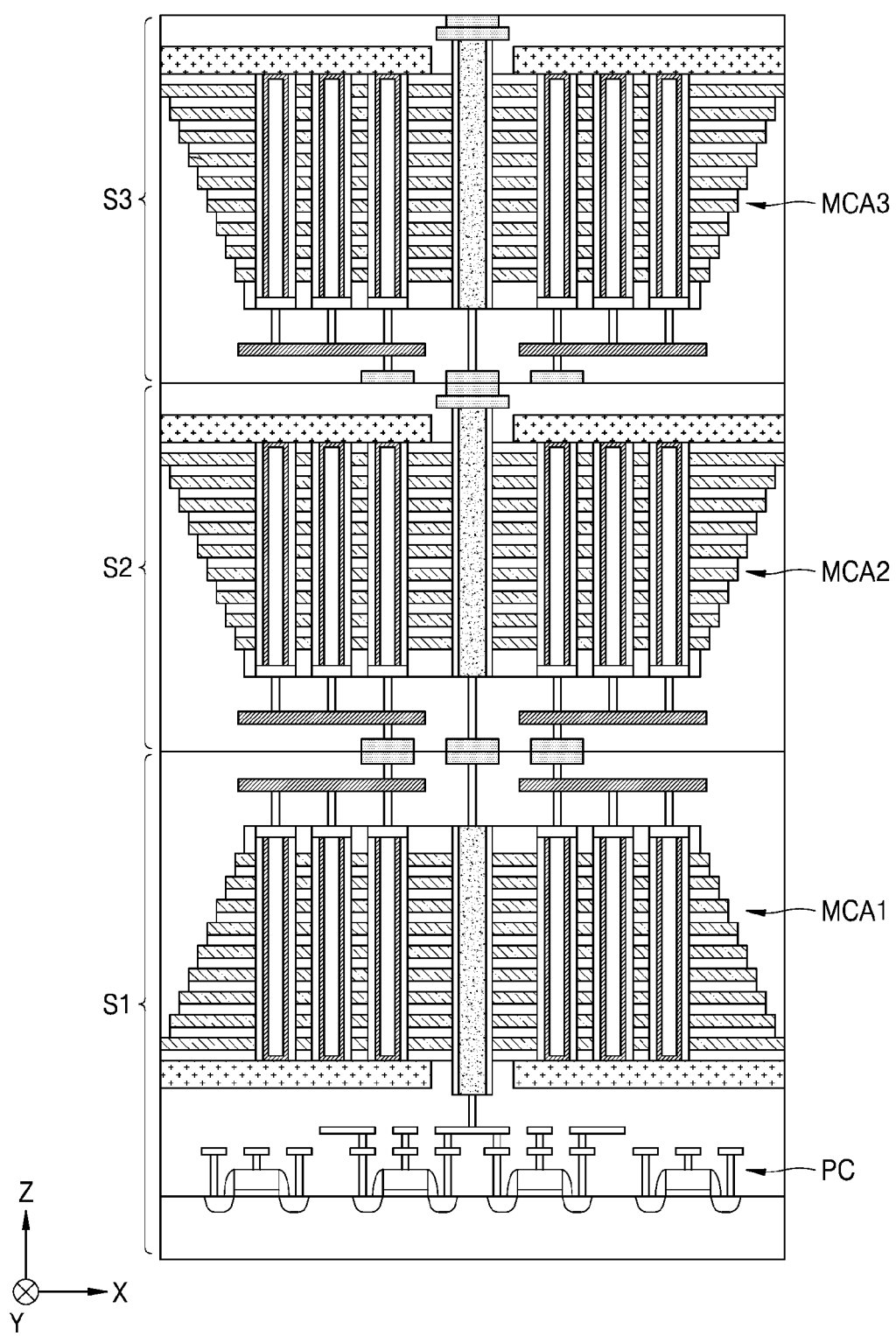
FIG. 41 illustrates a cross-sectional view of a memory device according to embodiments of the inventive concepts.

FIG. 41 illustrates a cross-sectional view of a memory device 10a according to embodiments of the inventive concepts.

Referring to FIG. 41, the memory device 10a may include first to third structures S1 to S3 which are stacked in a Z direction. The first structure S1 may be a cell-on-peri (COP) structure. That is, the first structure S1 may include a peripheral circuit PC and a first memory cell array MCA1 on the peripheral circuit PC, and the first memory cell array MCA1 may include a stacked structure having a staircase shape, which climbs in the Z direction. For example, the first structure S1 may include the lower structure S1Xb illustrated in FIGS. 9A and 9B, the lower structure S1Yb illustrated in FIGS. 10A and 10B, the lower structure S1Xc illustrated in FIGS. 11A and 11B, the lower structure S1Yc illustrated in FIGS. 12A and 12B, or a combination thereof. The second structure S2 and the third structure S3 may respectively include a second memory cell array MCA2 and a third memory cell array MCA3. Each of the second memory cell array MCA2 and the third memory cell array MCA3 may include a stacked structure having a staircase shape, which falls in the Z direction. For example, each of the second structure S2 and the third structure S3 may include the upper structure S2Xa illustrated in FIGS. 5A and 5B, the upper structure S2Ya illustrated in FIGS. 6A and 6B, the upper structure S2Xb illustrated in FIGS. 7A and 7B, the upper structure S2Yb illustrated in FIGS. 8A and 8B, or a combination thereof.

Figure 42:
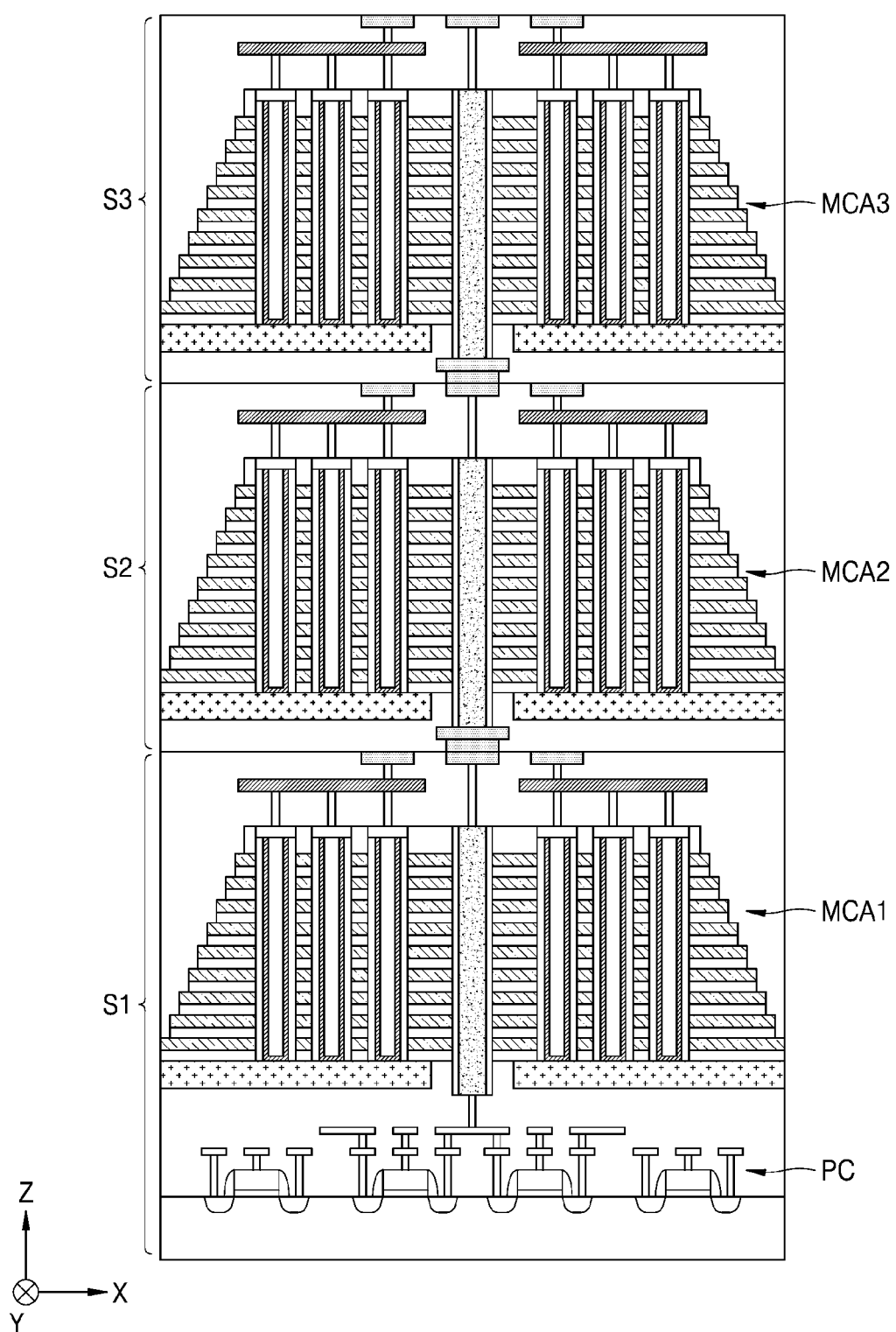
FIG. 42 illustrates a cross-sectional view of a memory device according to embodiments of the inventive concepts.

FIG. 42 illustrates a cross-sectional view of a memory device 10b according to embodiments of the inventive concepts.

Referring to FIG. 42, compared with FIG. 41, a second structure S2 and a third structure S3 of the memory device 10b may be reversed. That is, a second memory cell array MCA2 in the second structure S2 and a third memory cell array MCA3 in the third structure S3 may each include a stacked structure having a staircase shape, which climbs in a Z direction.

Figure 43:
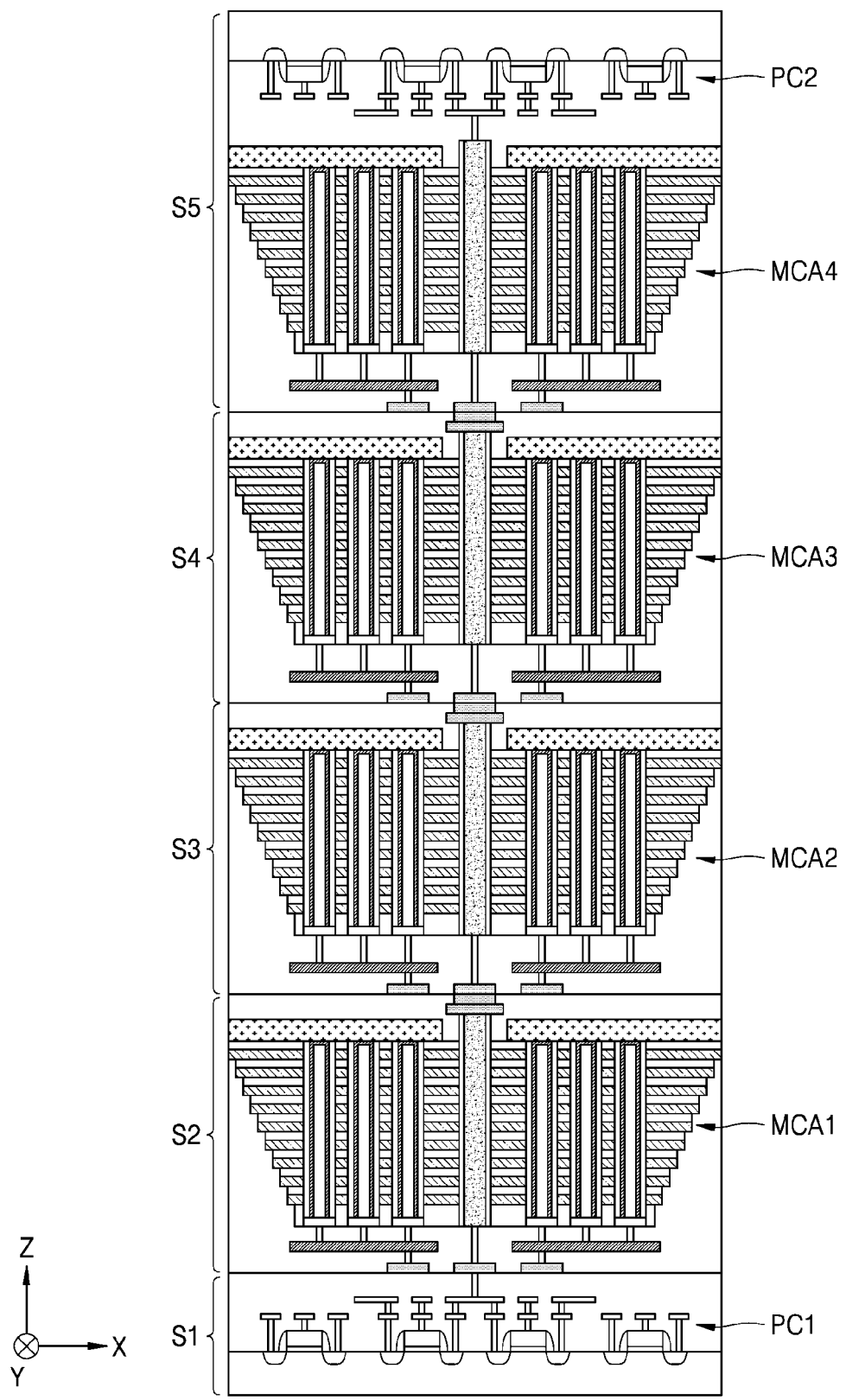
FIG. 43 illustrates a cross-sectional view of a memory device according to embodiments of the inventive concepts.

FIG. 43 illustrates a cross-sectional view of a memory device 10c according to embodiments of the inventive concepts.

Referring to FIG. 43, the memory device 10c may include a first peripheral circuit PC1 disposed at a lower end of the memory device 10c, a second peripheral circuit PC2 disposed at an upper end of the memory device 10c, and a plurality of memory cell arrays (for example, first to fourth memory cell arrays) MCA1 to MCA4 which are stacked between the first peripheral circuit PC1 and the second peripheral circuit PC2 in a Z direction. For example, the memory device 10c may include first to fifth structures S1 to S5 which are stacked in the Z direction, the second to fourth structures S2 to S4 may include the first to third memory cell arrays MCA1 to MCA3, and the fifth structure S5 may include the fourth memory cell array MCA4 and the second peripheral circuit PC2. For example, the first structure S1 may include the lower structure S1a illustrated in FIG. 4, and the second to fourth structures S2 to S4 may include the upper structure S2Xa illustrated in FIGS. 5A and 5B, the upper structure S2Ya illustrated in FIGS. 6A and 6B, the upper structure S2Xb illustrated in FIGS. 7A and 7B, the upper structure S2Yb illustrated in FIGS. 8A and 8B, or a combination thereof. The fifth structure S5 may include, for example, the lower structure S1Xb illustrated in FIGS. 9A and 9B, the lower structure S1Yb illustrated in FIGS. 10A and 10B, the lower structure S1Xc illustrated in FIGS. 11A and 11B, the lower structure S1Yc illustrated in FIGS. 12A and 12B, or a combination thereof.

Figure 44:
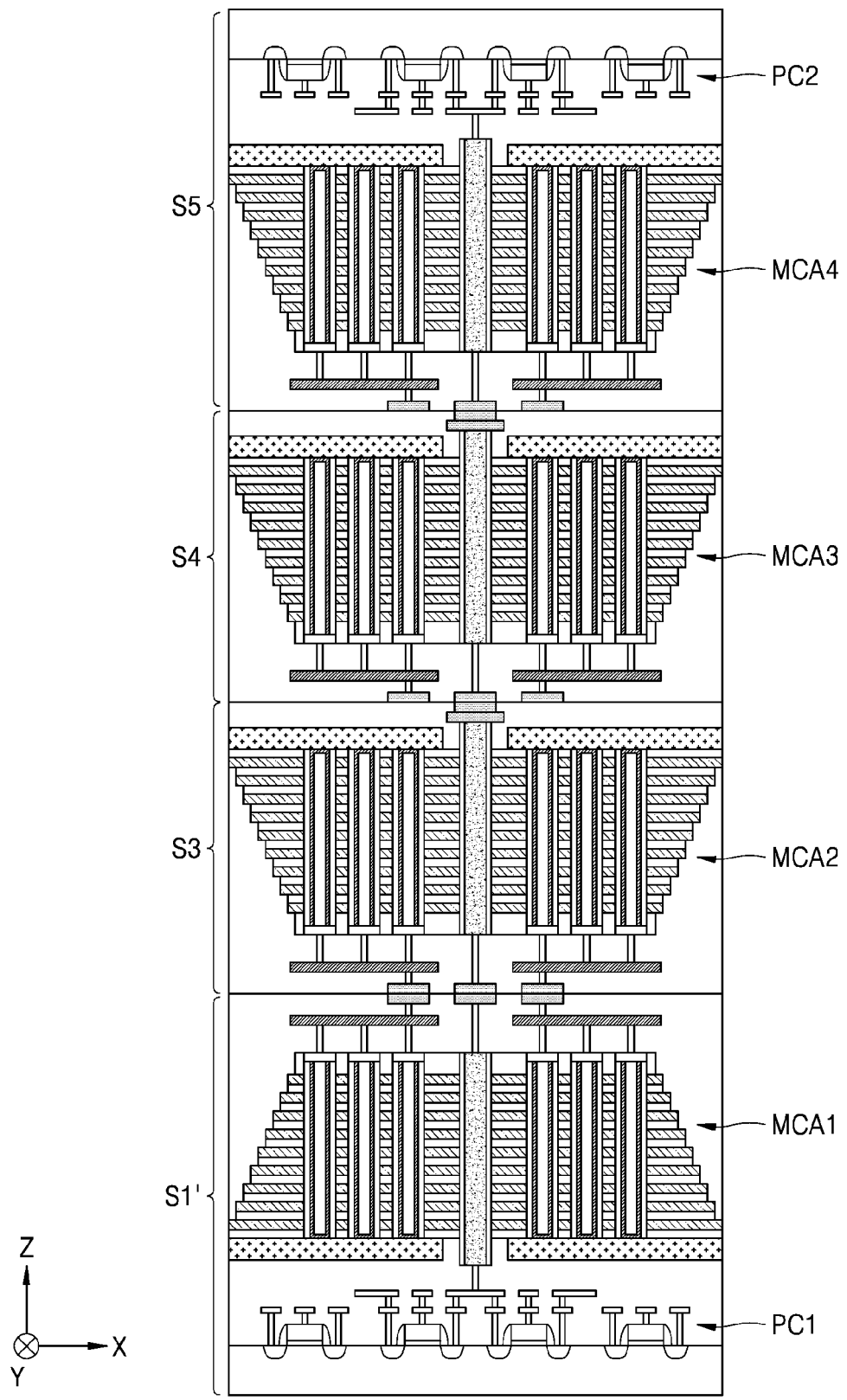
FIG. 44 illustrates a cross-sectional view of a memory device according to embodiments of the inventive concepts.

FIG. 44 illustrates a cross-sectional view of a memory device 10d according to embodiments of the inventive concepts.

Referring to FIG. 44, compared with FIG. 43, the memory device 10d may include a first structure S1' and third to fifth structures S3 to S5, which are stacked in a Z direction. The first structure S1' may include a COP structure. That is, the first structure S1' may include a first peripheral circuit PC1 and a first memory cell array MCA1 on the first peripheral circuit PC1. For example, the first structure S1' may include the lower structure S1Xb illustrated in FIGS. 9A and 9B, the lower structure S1Yb illustrated in FIGS. 10A and 10B, the lower structure S1Xc illustrated in FIGS. 11A and 11B, the lower structure S1Yc illustrated in FIGS. 12A and 12B, or a combination thereof.

It should be understood that the above described embodiments are to be considered as illustrative and not limitative. The scope of the present disclosure should be construed based on the claims, and should be construed without departing from the spirit and scope of the inventive concepts.

What is claimed is:

1. A memory device comprising:
   a lower structure; and
   a plurality of upper structures stacked on the lower structure,
   wherein the lower structure comprises a peripheral circuit and an upper bonding pad connected to the peripheral circuit and disposed on a top surface of the lower structure,
   each of the plurality of upper structures has a bottom surface, and each of the plurality of upper structures comprises a stacked structure including a plurality of gate layers stacked in a vertical direction, a plurality of channel structures each passing through the stacked structure in the vertical direction, a bit line disposed under the stacked structure and connected to the plurality of channel structures, a through via passing through the stacked structure in the vertical direction, and a lower bonding pad disposed on the bottom surface and connected to the through via,
   each of upper structures, other than an uppermost upper structure, of the plurality of upper structures further comprises a top surface and an upper bonding pad disposed on the top surface and connected to the through via,
   the bit line of each of the plurality of upper structures comprises a first portion extending in a horizontal direction orthogonal to the vertical direction, a second portion extending in the horizontal direction, and a gap separating the first portion of the bit line from the second portion in the horizontal direction,
   in a plan view, the through via of each of the plurality of upper structures overlaps the gap of the bit line,
   a lowermost upper structure of the plurality of upper structures is stacked on the lower structure in the vertical direction so that the lower bonding pad of the lowermost upper structure contacts the upper bonding pad of the lower structure,
   the plurality of upper structures comprise a first upper structure and a second upper structure stacked in the vertical direction, and
   the lower bonding pad of the second upper structure contacts the upper bonding pad of the first upper structure,
   wherein the first portion and the second portion of the bit line of at least one upper structure of the plurality of upper structures are not connected to the lower bonding pad of the at least one upper structure,
   wherein the at least one upper structure comprises a first lower line connecting the lower bonding pad of the at least one upper structure to the through via of the at least one upper structure, and a second lower line connecting the first portion of the bit line of the at least one upper structure to the second portion of the bit line of the at least one upper structure and being disconnected from the lower bonding pad of the at least one upper structure, and
   wherein a bottom surface of the first lower line of the at least one upper structure is disposed on a same plane as a bottom surface of the second lower line of the at least one upper structure.

2. The memory device of claim 1, wherein the lower structure comprises a second stacked structure including a plurality of second gate layers stacked on the peripheral circuit in the vertical direction, a plurality of second channel structures each passing through the second stacked structure in the vertical direction, a second bit line disposed on the second stacked structure and connected to the plurality of second channel structures, and a second through via passing through the second stacked structure and connecting the upper bonding pad of the lower structure to the peripheral circuit,
   the second bit line of the lower structure comprises a first portion extending in the horizontal direction, a second portion extending in the horizontal direction, and a gap separating the first portion of the second bit line of the lower structure from the second portion of the second bit line in the horizontal direction, and
   in a plan view, the second through via of the lower structure overlaps the gap of the second bit line of the lower structure.

3. The memory device of claim 2, wherein the first portion and the second portion of the second bit line of the lower structure are not connected to the upper bonding pad of the lower structure.

4. The memory device of claim 3, wherein the lower structure further comprises an upper connection pad connecting the first portion of the second bit line of the lower structure to the second portion of the second bit line.

5. The memory device of claim 4, wherein a top surface of the upper connection pad of the lower structure is disposed on a same plane as a top surface of the upper bonding pad of the lower structure.

6. The memory device of claim 4, wherein the lower structure further comprises a first via connecting the upper bonding pad of the lower structure to the second through via, a second via connecting the upper connection pad of the lower structure to the first portion of the second bit line, and a third via connecting the upper connection pad of the lower structure to the second portion of the second bit line.

7. The memory device of claim 3, wherein the lower structure further comprises a first upper line connecting the upper bonding pad of the lower structure to the second through via, and a second upper line connecting the first portion of the second bit line of the lower structure to the second portion of the second bit line and being disconnected from the upper bonding pad of the lower structure.

8. The memory device of claim 7, wherein a top surface of the first upper line of the lower structure is disposed on a same plane as a top surface of the second upper line of the lower structure.

9. The memory device of claim 2, wherein the first portion and the second portion of the second bit line of the lower structure are connected to the upper bonding pad of the lower structure.

10. The memory device of claim 9, wherein the lower structure further comprises a first via connecting the upper bonding pad of the lower structure to the second through via, a second via connecting the upper bonding pad of the lower structure to the first portion of the second bit line, and a third via connecting the upper bonding pad of the lower structure to the second portion of the second bit line.

11. The memory device of claim 9, wherein the lower upper structure further comprises a first upper line connecting the upper bonding pad of the lower structure to the second through via of the lower structure and the first portion and the second portion of the second bit line.

12. A memory device comprising:
a first structure; and
a second structure stacked on the first structure,
wherein the first structure comprises a peripheral circuit, a first upper bonding pad connected to the peripheral circuit, and a second upper bonding pad connected to the peripheral circuit,
the second structure comprises a first lower bonding pad connected to the first upper bonding pad of the first structure, a first through via connected to the first lower bonding pad of the second structure, a third upper bonding pad connected to the first through via of the second structure, a second lower bonding pad connected to the second upper bonding pad of the first structure, a first bit line connected to the second lower bonding pad of the second structure, and a memory cell array connected to the first bit line of the second structure,
the first bit line of the second structure comprises a first portion, a second portion, and a first gap between the first portion of the first bit line of the second structure and the second portion of the first bit line of the second structure, and
the first lower bonding pad of the second structure is not connected to the first portion and the second portion of the first bit line of the second structure,
wherein the first through via of the second structure passes through the memory cell array of the second structure.

13. The memory device of claim 12, wherein the second structure further comprises a first lower connection pad connecting the first portion of the first bit line of the second structure to the second portion of the first bit line, and the first lower connection pad of the second structure is not connected to the first lower bonding pad of the second structure, and
wherein a bottom surface of the first lower bonding pad of the second structure is disposed on a same plane as a bottom surface of the first lower connection pad of the second structure.

14. The memory device of claim 12, wherein the second structure further comprises a first lower connection pad connecting the first portion of the first bit line of the second structure to the second portion of the first bit line, and the first lower connection pad of the second structure is not connected to the first lower bonding pad of the second structure, and
wherein the second structure further comprises a first via connecting the first lower bonding pad of the second structure to the first through via, a second via connecting the first lower connection pad of the second structure to the first portion of the first bit line, and a third via connecting the first lower connection pad of the second structure to the second portion of the first bit line.

15. The memory device of claim 14, wherein the second structure further comprises a first surplus via which is connected to the first portion of the first bit line and that is not directly connected to the first lower connection pad, the first lower bonding pad, and the second lower bonding pad of the second structure and a second surplus via which is connected to the second portion of the first bit line and that is not directly connected to the first lower connection pad, the first lower bonding pad, and the second lower bonding pad of the second structure.

16. The memory device of claim 14, wherein the second structure further comprises a first lower line connected between the first portion of the first bit line and the second via, and a second lower line connected between the third via and the second portion of the first bit line.

17. The memory device of claim 16, wherein the second structure further comprises a first surplus via which is connected to the first lower line and that is not directly connected to the first lower connection pad, the first lower bonding pad, and the second lower bonding pad of the second structure, and a second surplus via which is connected to the second lower line and that is not directly connected to the first lower connection pad, the first lower bonding pad, and the second lower bonding pad of the second structure.

18. A memory device comprising:
a first structure; and
a second structure on the first structure,
wherein the first structure comprises a peripheral circuit, a first upper bonding pad connected to the peripheral circuit, and a second upper bonding pad connected to the peripheral circuit,
the second structure comprises a first lower bonding pad connected to the first upper bonding pad of the first structure, a first through via connected to the first lower bonding pad of the second structure, a first lower line connecting the first lower bonding pad of the second structure to the first through via of the second structure, a third upper bonding pad connected to the first through via of the second structure, a second lower bonding pad connected to the second upper bonding pad of the first structure, a first bit line connected to the second lower bonding pad of the second structure, and a memory cell array connected to the first bit line of the second structure,
the first bit line of the second structure comprises a first portion, a second portion, and a first gap between the first portion of the first bit line of the second structure and the second portion thereof, and
the first lower line of the second structure is not connected to the first portion and the second portion of the first bit line of the second structure,
wherein the second structure further comprises a second through via connected to the second lower bonding pad of the second structure, and a fourth upper bonding pad connected to the second through via,
the first bit line of the second structure further comprises a third portion and a second gap between the second portion of the first bit line of the second structure and the third portion of the first bit line, and
the second lower bonding pad of the second structure is connected to the second through via of the second structure and the second portion and the third portion of the first bit line of the second structure.

19. The memory device of claim 18, wherein the second lower bonding pad of the second structure is connected to the first portion of the first bit line of the second structure.

20. The memory device of claim 19, wherein the second structure further comprises a second lower line connecting the second lower bonding pad of the second structure to the second through via of the second structure and the second portion and the third portion of the first bit line.

* * * * *